United States Patent
Tatsumi et al.

[11] Patent Number: 6,118,699
[45] Date of Patent: Sep. 12, 2000

[54] SEMICONDUCTOR MEMORY DEVICE USING MONOS TYPE NONVOLATILE MEMORY CELL

[75] Inventors: Yuuichi Tatsumi, Tokyo; Noriaki Suzuki, Yokohama; Hidenobu Minagawa, Kawasaki; Kazuhiko Satou; Hitoshi Ohta, both of Yokohama, all of Japan

[73] Assignee: Kabushiki Kaisha Toshiba, Kawasaki, Japan

[21] Appl. No.: 09/352,838

[22] Filed: Jul. 13, 1999

[30] Foreign Application Priority Data

| Jul. 14, 1998 | [JP] | Japan | ................................. | 10-199162 |
| Jul. 14, 1998 | [JP] | Japan | ................................. | 10-199163 |
| Jul. 15, 1998 | [JP] | Japan | ................................. | 10-200823 |

[51] Int. Cl.$^7$ .................................................. G11C 16/04
[52] U.S. Cl. .............................. 365/185.18; 365/185.05; 365/185.26; 257/315
[58] Field of Search ..................... 365/185.18, 185.05, 365/185.26; 257/314, 315

[56] References Cited

U.S. PATENT DOCUMENTS

| 5,570,315 | 10/1996 | Tanaka et al. |
| 5,946,240 | 8/1999 | Hisamune ............................. 257/316 X |
| 5,978,271 | 11/1999 | Sato et al. ........................ 365/185.18 X |

*Primary Examiner*—Huan Hoang
*Attorney, Agent, or Firm*—Finnegan, Henderson, Farabow, Garrett & Dunner, L.L.P.

[57] ABSTRACT

That surface portion of a semiconductor substrate which is adjacent to a buried source region formed in the substrate is covered with an offset side wall to suppress expansion of a channel beneath the offset side wall. In addition, buried source regions in the form of offset side walls are formed on the two sides of a drain region having one non-offset side wall to prevent a write or read error in unselected memory cell transistors on both sides of a selected memory transistor either in a data write or in a data read.

15 Claims, 36 Drawing Sheets

| A0PAD | L | H | L | H |
|---|---|---|---|---|
| A1PAD | L | L | H | H |
| SGD1S | H | L | L | H |
| SGD2S | L | H | H | L |

OUTPUT FROM DATA WRITE CIRCUIT

| | READ | "1" WRITE | "0" WRITE | WRITE RESET | COLLECTIVE Vth MEASUREMENT | ERASE |
|---|---|---|---|---|---|---|
| CL | Vss | Vss | HV (WRITE VOLTAGE) | Vss | Vss | Vss |
| W/E (EXTERNAL PAD) | L | H | H | L | L | L |
| I/O (EXTERNAL PAD) | READ POTENTIAL | H | L | UNKNOWN | UNKNOWN | UNKNOWN |
| R/W (EXTERNAL PAD) | L | H | H | H | L | H |

| AOPAD | L | H | L | H |
| --- | --- | --- | --- | --- |
| A1PAD | L | L | H | H |
| SG1S | H | L | L | H |
| SG0S | L | H | H | L |

VOLTAGES ON EPROM CELL ARRAY OF EMBODIMENT IN WRITE

| CELL | SG0 | SG1 | SG2 | SG3 | SG4 | SG5 | Gn | G1~Gn~1 | Gn+1~Gm | Bit1 | Bit2 | Bit3 | CoL1 | CoL2 | CoL3 |
|------|-----|-----|-----|-----|-----|-----|-----|---------|---------|------|------|------|------|------|------|
| 1a | GND | Vdd | Vdd | Vdd | Vdd | GND | Vpg | GND | GND | GND | Vpd | Vpd | GND | Vpd | Vpd |
| 1b | Vdd | GND | Vdd | Vdd | Vdd | GND | Vpg | GND | GND | Vpd | GND | GND | Vpd | Vpd | GND |
| 1c | Vdd | GND | Vdd | Vdd | Gnd | Vdd | Vpg | GND | GND | GND | GND | Vpd | GND | GND | Vpd |
| 1d | Gnd | Vdd | Vdd | Vdd | GND | Vdd | Vpg | GND | GND | Vpd | Vpd | GND | Vpd | GND | GND |

FIG.37

VOLTAGES ON EPROM CELL ARRAY OF EMBODIMENT IN READ

| CELL | SG0 | SG1 | SG2 | SG3 | SG4 | SG5 | Gn | G1~Gn~1 | Gn+1~Gm | Bit1 | Bit2 | Bit3 | CoL1 | CoL2 | CoL3 |
|------|-----|-----|-----|-----|-----|-----|-----|---------|---------|------|------|------|------|------|------|
| 1a | GND | Vdd | Vdd | Vdd | Vdd | GND | Vpg | GND | GND | VR | GND | GND | VR | GND | GND |
| 1b | Vdd | GND | Vdd | Vdd | Vdd | GND | Vpg | GND | GND | GND | VR | VR | GND | GND | VR |
| 1c | Vdd | GND | Vdd | Vdd | Gnd | Vdd | Vpg | GND | GND | VR | VR | VR | VR | VR | GND |
| 1d | Gnd | Vdd | Vdd | Vdd | GND | Vdd | Vpg | GND | GND | GND | GND | GND | GND | GND | VR |

READ VOLTAGE=VR

FIG.38

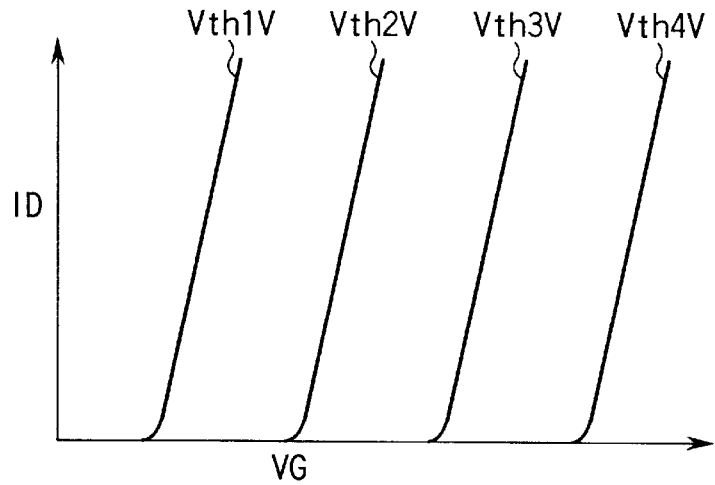
FIG. 46
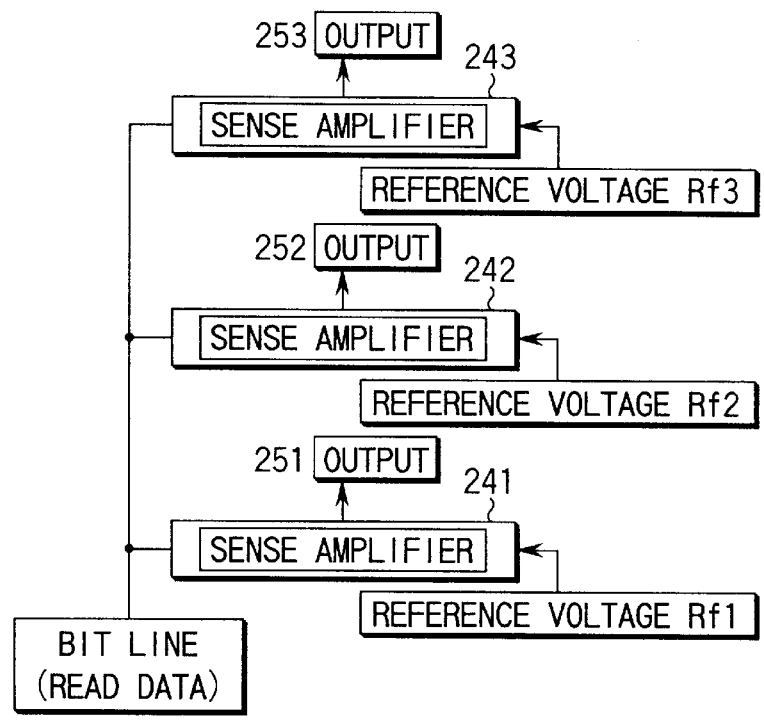
FIG. 47
FIG. 48
| MEMORY CELL Vth | OUTPUT 51 | OUTPUT 52 | OUTPUT 53 | DATA | |
|---|---|---|---|---|---|
| | | | | D1 | D2 |
| Vth1 | 0 | 0 | 0 | 0 | 0 |
| Vth2 | 1 | 0 | 0 | 0 | 1 |
| Vth3 | 1 | 1 | 0 | 1 | 0 |
| Vth4 | 1 | 1 | 1 | 1 | 1 |
Vth1<Vth2<Vth3<Vth4

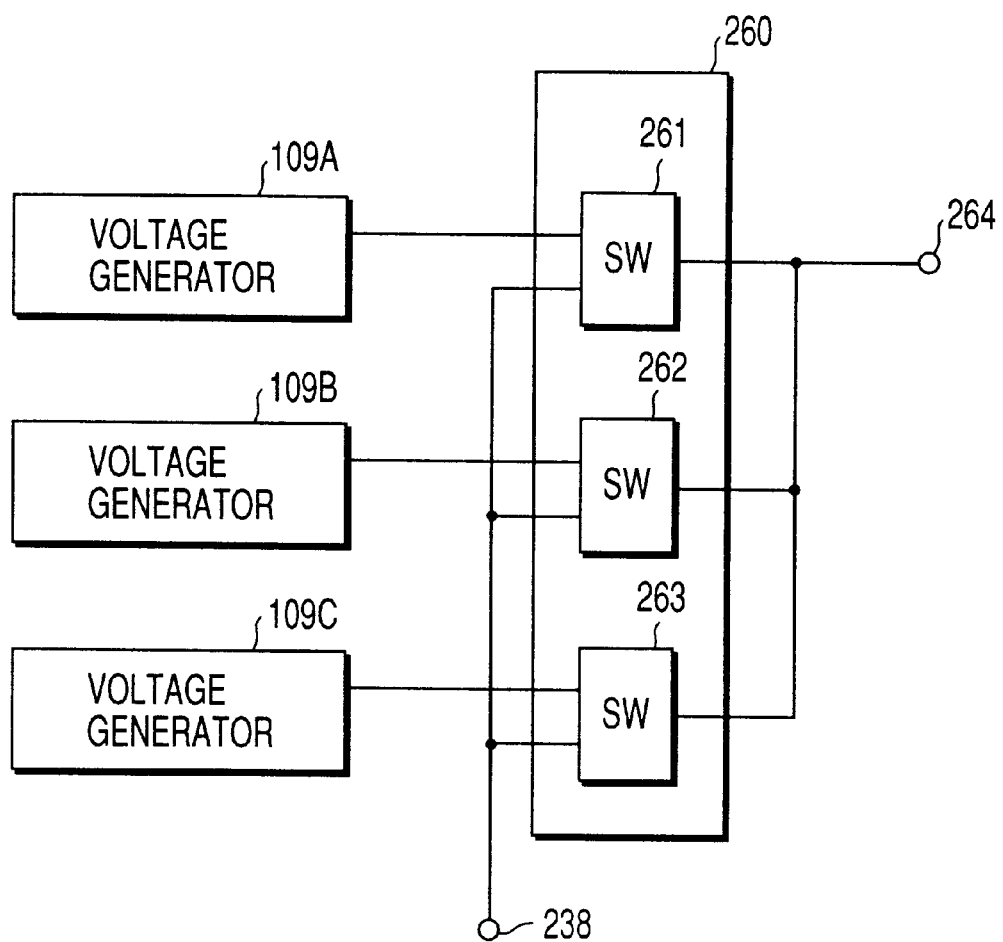
F I G. 49

SEMICONDUCTOR MEMORY DEVICE USING MONOS TYPE NONVOLATILE MEMORY CELL

BACKGROUND OF THE INVENTION

The present invention relates to a semiconductor memory device using nonvolatile memory cells known as MONOS cells designed to store electric charges in nitride films.

A MONOS type nonvolatile memory cell has a cell transistor structure in which a nitride film sandwiched between a pair of insulating films, e.g., oxide films, is formed between the channel portion and gate electrode of the cell transistor, and electrons as electric charges can be stored in the nitride film.

When electrons are stored or trapped in this nitride film, the electric field applied from the gate electrode upon application of a voltage thereto is canceled out in accordance with the amount of electrons stored in the nitride film. This allows the threshold voltage of the cell transistor in which electrons are stored to differ from that of a cell transistor in which no electrons are stored. Data is recorded and read by using this transistor's property of being able to make threshold voltages differ from each other.

In a general semiconductor memory device using MONOS type memory cell transistors, for example, in a data write operation, the drain and source of a selected memory cell transistor are respectively biased to the write potential and the Vss potential. In this case, the sources and drains of all memory cell transistors other than the selected memory cell transistor are set at the floating potential. For this reason, the source potential of an unselected memory cell transistor adjacent to the drain side of the selected memory cell transistor is lower than the drain voltage of the selected memory cell transistor, a current flows from the drain to the source of the adjacent unselected memory cell transistor. As a result, the nitride film of the unselected memory cell transistor is charged, and hence a write error occurs. In general, when data is to be written, the drain potential of the selected cell transistor is set to be higher than the source potential of each adjacent unselected cell transistor. For this reason, a current may flow from this selected cell transistor to two or three adjacent unselected cell transistors in addition to the selected cell transistor.

Obviously, such a phenomenon also occurs in a data read operation.

It is, therefore, an object of the present invention to provide a MONOS nonvolatile semiconductor memory device which can prevent write and read errors in unselected memory cell transistors adjacent to a selected memory cell transistor in data write and read operations.

BRIEF SUMMARY OF THE INVENTION

A semiconductor memory device of the present invention comprises a memory cell array having a plurality of memory cell transistors made up of a semiconductor substrate of a first conductivity type, a plurality of source regions of a second conductivity type which are formed in the semiconductor substrate at predetermined intervals, a plurality of drain regions of the second conductivity type each formed between two adjacent source regions, a first side wall formed in an offset pattern outside an edge of each of the source regions which faces the adjacent drain region such that a bottom surface of the first side wall covers a corresponding surface of the semiconductor substrate, a second side wall formed to have a front edge flush with an edge of the drain region which faces the adjacent source region, with a bottom surface of the second side wall covering a corresponding surface of the source region, channel regions formed between the source regions and the drain regions, a first insulating film formed on a surface of each of the channel regions, a nitride film formed on the first insulating film, a second insulating film formed on the nitride film, and a gate electrode used as a word line which is commonly formed on the source region, drain region, and second insulating film, and means for applying predetermined potentials to only a source, drain, and gate constituting one memory cell transistor addressed in at least data write/read operations, and holding all unselected memory cell transistors in a floating state.

According to the above arrangement, since source regions having offset side walls and drain regions having non-offset side walls are alternately arranged, even if a current flows in the adjacent source region of an unselected memory cell transistor directly adjacent to the high-potential drain region of a selected memory cell transistor to charge the stray capacitance of the adjacent source region of the unselected memory cell transistor in write/read operations, the drain region adjacent to the charged source region is not charged to a potential higher than that of the adjacent source region. In addition, since the offset side wall is formed in the source region, expansion of a depletion layer beneath the side wall is limited, and almost no inversion layer is formed in the channel region of the unselected memory cell transistor. This limits a leakage current flowing from the selected memory cell transistor toward the adjacent unselected memory cell transistor on the high-potential drain region side, in particular. Even if a predetermined potential is applied to only a memory cell transistor selected in a data write/read operation, and unselected memory cell transistors are set in the floating state without applying no potential thereto, write and read errors can be prevented. This can simplify write and read circuits.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 23 is a view showing operation conditions in a data write circuit in the system in FIG. 3;

FIG. 30 is a view showing a logic value table to explain the operation of the circuit in FIG. 29;

FIG. 37 is a view showing the relationship in voltage between various control signals in write operation in the cell array;

FIG. 38 is a view showing the relationship in voltage between various control signals in read operation in the cell array;

FIG. 46 is a graph showing the relationship between the contents of multi-value data to be stored and the gate voltages;

FIG. 47 is a block diagram showing the main part of a multi-value data detection circuit;

FIG. 48 is a table chart showing the relationship between the outputs from the circuit in FIG. 47 and the multi-value data; and FIG. 49 is a circuit diagram showing a different voltage outputting circuit.

DETAILED DESCRIPTION OF THE INVENTION

The first embodiment of the present invention will be described below with reference to the views of the accompanying drawing.

Figure 1:
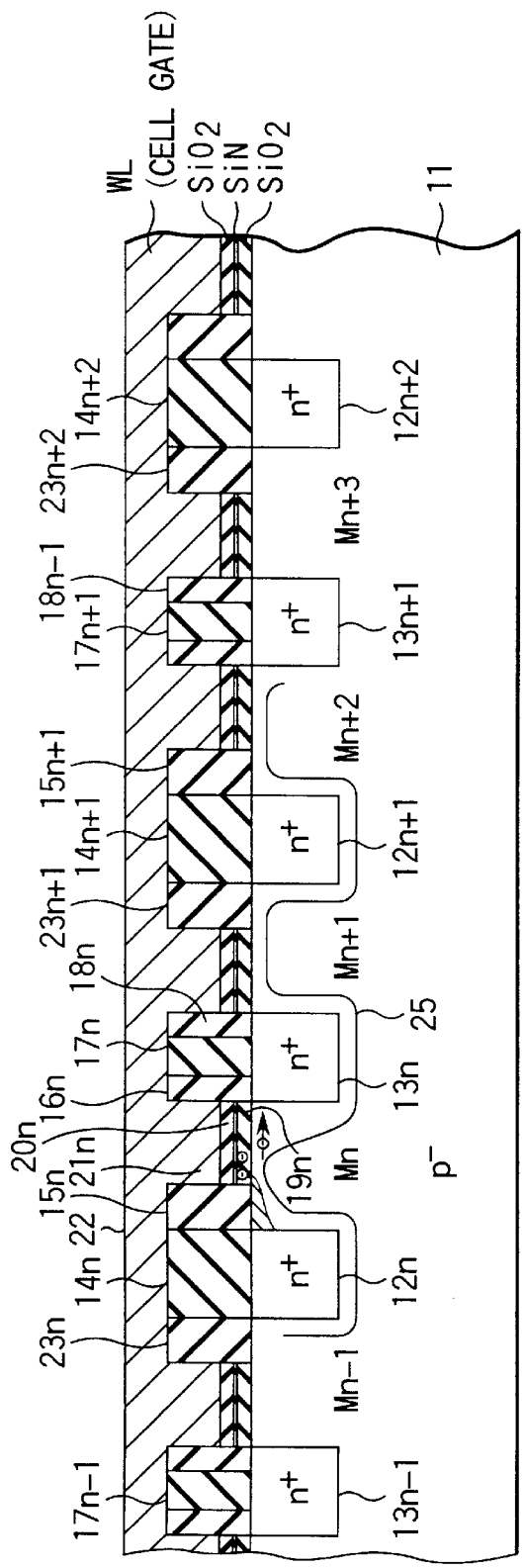
FIG. 1 is a sectional view showing the internal structure of a memory cell array in the row direction according to an embodiment of the present invention.

FIG. 1 is a sectional view showing the structure of an array of a plurality of memory cell transistors in the row direction which are connected to one word line WL crossing a plurality of bit lines in a memory cell array to be described later.

Referring to FIG. 1, a plurality of $n^+$-type first buried regions $12n$, $12n+1$, $12n+2$, ... and a plurality of $n^+$-type second buried regions $13n-1$, $13n$, $13n+1$, ... are alternately formed in the cell formation region of a p-type semiconductor substrate 11. The first buried regions $12n$, ... are used as source regions in memory cell transistors Mn-1, Mn, Mn+1, ..., respectively. For example, the second buried region $13n$ formed at a predetermined distance from the first buried region $12n$ is used as the drain region of the memory cell transistor Mn. The buried region $12n+1$ is used as the source region of the memory cell transistor Mn+1, and the buried region $13n$ is commonly used as the drain regions of the memory cell transistors Mn and Mn+1. That is, one buried region $13n$ is used as the common drain region of the two adjacent memory cell transistors Mn and Mn+1.

In the memory cell transistor Mn, for example, a source electrode (not shown) is connected to the source region $12n$, and a drain electrode is connected to the drain region $13n$. Likewise, the remaining source and drain regions are connected to the corresponding electrodes.

A first side wall $15n$ made of an insulator, e.g., an HDP film, is formed on that side surface of the source region $12n$ which faces the drain region $13n$ such that the bottom surface of the side wall 15 covers the upper surface of a channel region formed on the semiconductor substrate 11.

A second side wall $16n$ is formed on the drain region $13n$ such that the edge of the wall $16n$ is flush with that edge portion of the drain region $13n$ which faces the source region 12$n$ and the bottom surface of the wall 16$n$ covers the corresponding upper surface of the drain region 13$n$. This second side wall 16$n$ is also made of an insulator such as an HDP film. In this embodiment, a side wall 18$n$ is formed on the opposite side surface of the drain region 13$n$ to the second side wall 16$n$ to face the source region 12$n$+1 and have an edge flush with the edge of the drain region 13$n$.

In addition, in the memory cell transistor Mn, a first silicon oxide film 19$n$ as an insulating film is formed on the channel region formed in the surface portion of the semiconductor substrate 11 which is located between the source region 12$n$ and drain region 13$n$. A nitride film 20$n$ is formed on the first silicon oxide film 19$n$. A second silicon oxide film 21$n$ is formed on the nitride film 20$n$. Finally, a gate electrode 22 made of polysilicon is commonly formed on the side walls 15$n$ and 16$n$, insulating films 14$n$ and 17$n$, and second oxide film 21$n$. The memory cell Mn having a MONOS structure is formed in this manner.

The gate electrode 22 is used as the word line WL and used as the common gate electrode of all the remaining memory cell transistors Mn+1, . . . to be connected to the word line WL.

Like, for example, the memory cell transistor Mn formed between the source region 12$n$ and drain region 13$n$, the memory cell transistors Mn−1 and Mn+1 are formed between the source region 12$n$ and drain region 13$n$−1 and between the source region 12$n$+1 and drain region 13$n$ which are respectively formed before and after the source region 12$n$ and drain region 13$n$.

The memory cell transistors Mn+2, Mn+3, . . . are sequentially formed in the same manner, and all the transistors are connected to the word line WL.

Data write operation in the memory cell transistor Mn in FIG. 1 will be described below with reference to FIG. 2.

An operation state including the state of a depletion layer 25 in the semiconductor substrate 11 at, for example, the memory cell transistor Mn selected in a write and the unselected adjacent memory cell transistor Mn+1 will be further described below with reference to FIGS. 1 and 2.

The operation state in which, for example, the memory cell transistor Mn in FIG. 1 is selected will be described with reference to FIG. 2. In the cell Mn having the MONOS structure, a state in which electrons (hot electrons) are injected into the nitride film 20$n$ is defined as a write state. In the following description, a state in which electrons are stored in the nitride film 20$n$ is defined as a "0" write, and a state in which no electrons are injected is defined as a "1" write.

In a write, the potentials of the substrate 11 and source region 12$n$ are fixed to "0" V, and a "0" write voltage, e.g., 5 V, is applied to the drain region 13$n$. In this state, a predetermined high write voltage, e.g., 7 V, is applied to the gate electrode (word line WL) 22.

Figure 2:
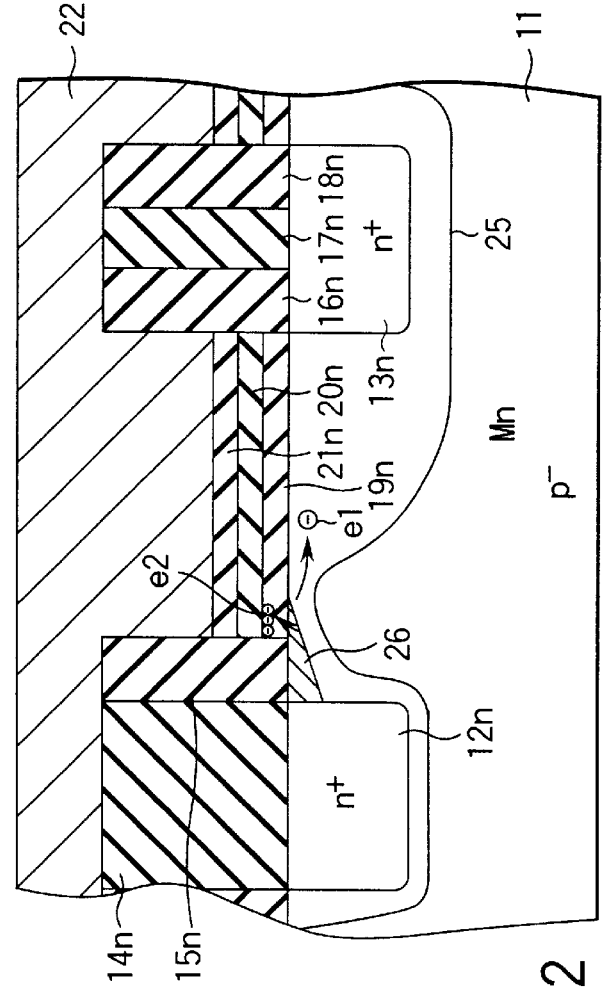
FIG. 2 is an enlarged view of one memory cell in FIG. 1.

Since the positive voltage of the drain region 13$n$ is higher than that of the source region 12$n$, the depletion layer 25 under the drain region 13$n$ extends deeper in the substrate 11, as shown in FIG. 2. Since the electric field beneath the side wall 15$n$ is weak, the depletion layer extends shallowly.

If a high voltage is applied to the gate electrode 22 in this state, a channel 26 made of an inversion layer is formed in that surface region of the p-type substrate 11 which is located beneath the side wall 15$n$ in the form of a wedge. A distal end of the channel 26 extends downward from the side wall 15$n$ to reach a position below the side wall 15$n$.

In this state, a current flows from the drain region 13$n$ toward the source region 12$n$ through the channel region, and hot electrons are generated from the distal end portion of the channel 26. Most electrons (represented by e1) of the generated hot electrons move toward the drain region 13$n$ along the surface channel region of the substrate 11, but some electrons e2 pass through the insulating film 19$n$ and are trapped in the nitride film 20$n$ to be stored therein by the field effect of the gate electrode 22.

In this case, in the unselected memory cell transistor Mn+1 in FIG. 1, which is adjacent to the drain region 13$n$ of the selected memory cell transistor Mn to which the high voltage is applied, the source region 12$n$+1 is set in a floating state. Since the potential of the source region 12$n$+1 is normally lower than that of the drain region 13$n$, a current flows from the drain region 13$n$ into the source region 12$n$+1 to charge the stray capacitance of the source region 12$n$+1.

However, the depletion layer 25 formed beneath the side wall 15$n$+1 on the adjacent memory cell Mn+2 side extends slightly along the region 12$n$+1, as shown in FIG. 1. In addition, since the drain region 13$n$+1 of the adjacent memory cell Mn+2 is hardly set at a high potential in a floating state, the depletion layer hardly extends beneath the drain region 13$n$+1.

Even if, therefore, a voltage required for a write or read is applied to only the selected memory cell transistor Mn while all the unselected memory cell transistors are set in the floating state, since only a small current flows directly from the selected memory cell transistor to the adjacent unselected memory cell transistor Mn+1, and most of the current is cut off in the adjacent memory cell transistor Mn+2, a write or read error can be effectively prevented.

Figure 3:
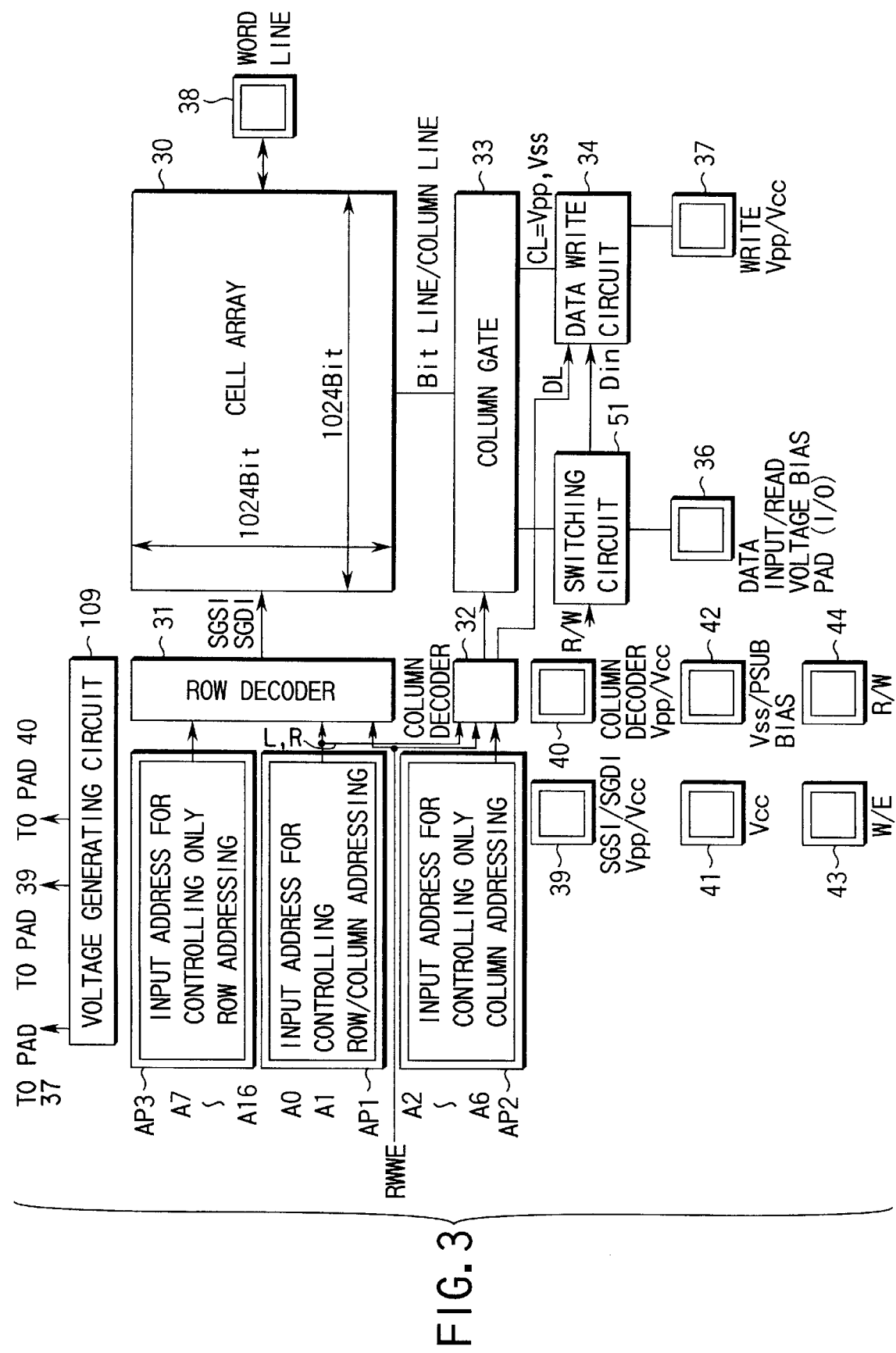
FIG. 3 is a block diagram showing an overall system according to this embodiment.

FIG. 3 is a block diagram showing a data write circuit for a cell array 30 made up of 1,024 (bits)×1,024 (bits) MONOS memory cells, each having such an arrangement and configuration, arranged in the row and column directions.

Referring to FIG. 3, each memory cell in the cell array 30 is addressed by 17 address signal bits A0 to A16. Of these address bits, 10 address signal bits A7 to A16 are input address bits for controlling only row addressing (row direction) and supplied to a row decoder 31, together with the input address signal bits A0 and A1 for controlling row/column addressing. The row decoder 31 outputs signals SGSi and SGDi for selecting one of the two drain regions formed before and after a given source region in the cell array 30. For example, in the cell array arrangement shown in FIG. 1, if the drain region 13$n$ is selected with respect to the common source region 12$n$+1, the memory cell transistor Mn+1 is selected, and it the drain region 13$n$+1 is selected with respect to the common source region 12$n$+1, the memory cell transistor Mn+2 is selected.

The detailed arrangement and operation of the row decoder 31 will be described later.

The input address signal bits A0 and A1 for controlling row/column addressing and the input address signal bits A2 to A6 for controlling only column addressing are supplied to a column decoder 32. A column decoded signal Hi (H0 to H31) output from the column decoder 32 is supplied to a column selection gate circuit 33. The arrangement and operation of the column decoder 32 will also be described later.

A data clock signal DL is further output from the column decoder 32 and supplied to a data write circuit 34. A write voltage Vpp/Vcc is generated by a voltage generating circuit 109 and applied from a pad 37. This voltage generating circuit 109 will also be described later.

The data input supplied to the data write circuit 34 is supplied from a pad 36 through a switching circuit 51. The data input and read voltage bias (I/O) signal are supplied to the pad 36 and the data read from the cell array 30 is outputted via a bit line. Note that pads 38 connected to a plurality of word lines are connected to the cell array 30. The pads 38 are formed by the same number as that of word lines. In this embodiment, 32 pads are formed.

The remaining pads include a voltage Vpp/Vcc application pad 39 for the signals SGSi/SGDi, a voltage Vpp/Vcc application pad 40 for the column decoder 32, Vcc pad 41, bias pad 42 for the Vss/P-type substrate 11, W/E pad 43, and R/W pad 44. Note that address pads AP1 to which the address signal bits A0 and A1 are supplied, address pads AP2 to which the address signal bits A2 to A6 are supplied, and address pads AP3 to which the address signal bits A7 to A16 are supplied are connected to address buffers to be described later.

Figure 4:
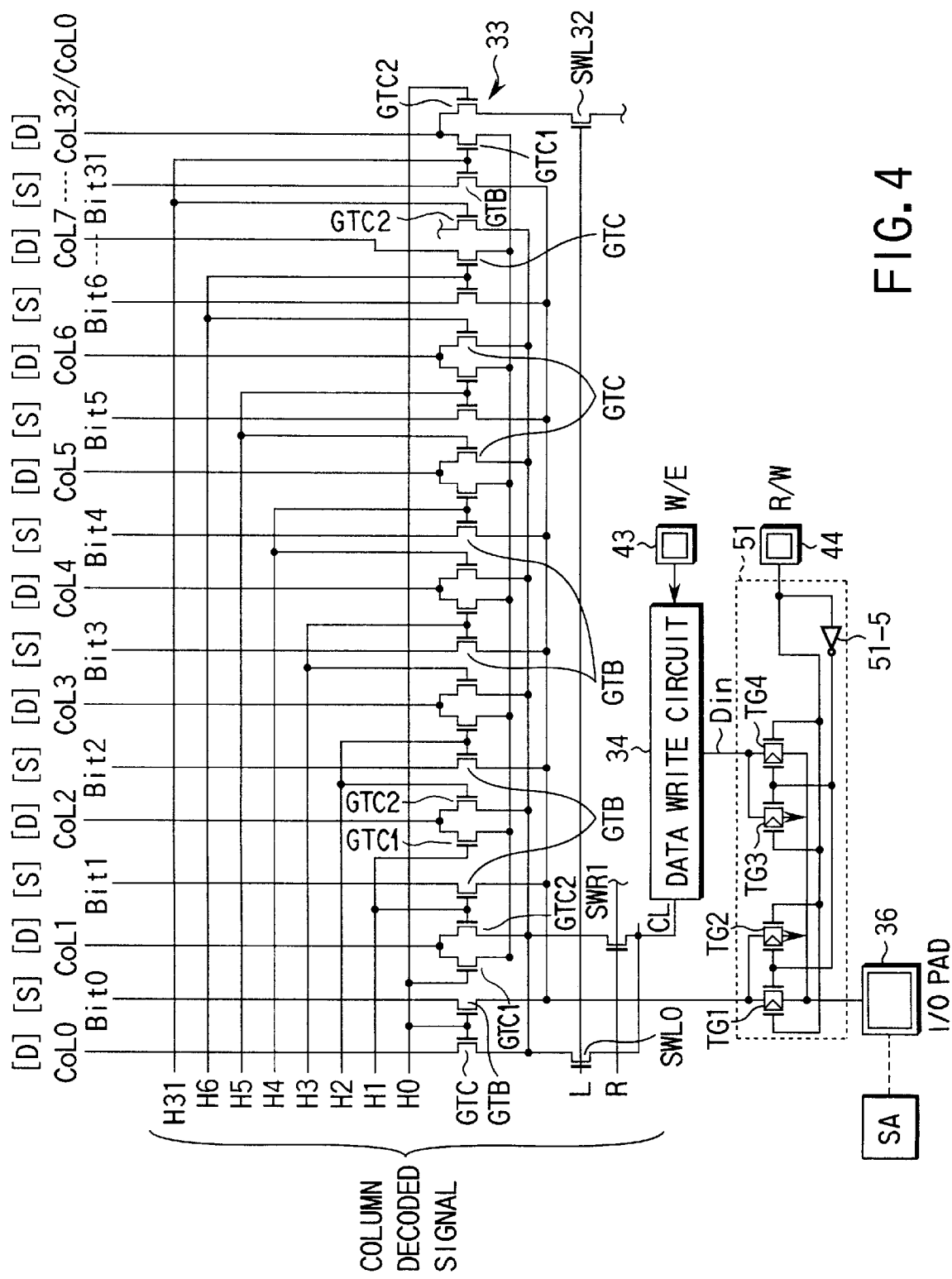
FIG. 4 is a block diagram showing the circuit arrangement of the main part in FIG. 3.

A signal CL from the data write circuit 34 is supplied to the column selection gate circuit 33, and the column selection gate circuit 33 is connected to the cell array 30 through bit lines and column lines, as shown in FIG. 4.

In FIG. 4, the bit lines Bit0–Bit31 are connected to the gate transistors GTB for bit lines provided in the column selection gate 33 at one ends thereof. The column lines CoL0–CoL32/CoL at one end thereof are connected to common connection nodes of a pair of gate transistors GTC1 and GTC2, respectively. Each of the other ends of these bit lines Bit0–Bit31 and column lines CoL0–CoL32/CoL0 is connected to the source regions and drain regions of the memory cell transistors Mn ... shown in FIG. 1.

As shown in FIG. 3, the column decoded signal H0 is supplied to a gate connection node of the transistor pair GTC and GTB respectively connected to the left end column line CoL0 and bit line Bit0 and supplied to a gate of one transistor GTC1 of the paired transistors GTC1 and GTC2 connected to the column line Co1L1. The signal H0 is further supplied to the gate of one transistor GTC2 of the paired transistors GTC1 and GTC2 connected to the column line CoL32/CoL0.

The column decoded signal H1 is supplied to the gate connection node of the transistors GTC1 and GTC2 respectively connected to the column line CoL1 and bit line Bit1, and is further supplied to a gate of the transistor GTC1 of the paired transistors GTC1 and GTC2 connected to the column line CoL2. In the similar manner, the column decoded signal H31 is supplied to the gate connection node of the transistors GTC1 and GTC2 respectively connected to the right end column line CoL32/CoL0 and bit line Bit31, and is further supplied to a gate of the transistor GTC2 of the paired transistors GTC1 and GTC2 connected to the second column line (not shown) from the right side.

The column lines CoL0–CoL32/CoL0 are connected to the transistors SWL0–SWL32, SWR1, ... controlled by the left/right switching signals L, R via the transistors GTC or GTC1, and further connected commonly to the output terminal outputting the data writing signal CL of the data write circuit 34.

On the other hand, the bit lines Bit0–Bit31 are commonly connected to the transfer gates TG1, and TG2 of the switching circuit 51, is selectively connected to the input/output pad 36 by the read control signal R supplied to the R/W pad 44, and is further connected to the sense amplifier SA via the pad 36.

The R/W pad 44 is connected to the data write circuit 34 via the transfer gates TG3 and TG4 in the data write mode, and the output signals from the bit lines Bit0–Bit31 are supplied to the sense amplifier SA.

The operation of the data write circuit 34 is controlled by the switching circuit 51. This operation will be described in detail with reference to FIG. 4. The high voltage write control signal CL output from the data write circuit 34 in the data write mode is supplied from the voltage generator circuit 109 as an output voltage Vpp. When the voltage Vpp is used as the write signal CL, a particular circuit for generating the signal CL is not necessary and the output Vpp from the voltage generator 109 may be used as the signal Vpp.

Referring to FIG. 4, 32 bit lines Bit0 to Bit31 respectively connected to source regions S of the plurality of memory cell transistors constituting the cell array 30 in FIG. 3 are commonly connected to switching gates TG1 and TG2 of the switching circuit 51 through gate transistors GTB formed in the column gate circuit 33. This switching circuit 51 has other switching gates TG3 and TG4, which will be described in detail later with reference to FIG. 6.

In addition, as has been explained earlier, 33 column lines CoL0 to CoL32 respectively connected to drain regions D of the plurality of memory cell transistors constituting the cell array 30 are commonly connected to L/R switching gates SWL and SWR through gate transistors GTC formed in the column selection gate circuit 33.

For example, when one of column lines CoL0 and CoL1 arranged at left and right side of the bit line Bit0 is selected, the memory cell transistor formed between the selected column line and the bit line Bit0 is selected to perform the data writing operation or the data reading operation. In this manner, according to the present embodiment, only one memory cell transistor in the memory cell array is selected in the data write/read mode, and the remaining unselected memory cell transistors are maintained in the floating state, thereby enabling the structure of the data write/read circuit be very simple.

This L/R switching by the switching signals L and R is equivalent to selecting one of adjacent cells by selecting one of the column lines connected to the drain regions on the left and right sides of one bit line, i.e., one source region. For example, the switching gates SWL and SWR are switching gates for selecting one of the drain regions 13n and 13n–1 of the memory cell transistors Mn and Mn–1 before and after the source region 12n in FIG. 1. More specifically, the switching gates SWL and SWR are switching circuits for determining to use, for example, either the memory cell transistor Mn having the source region 12n and drain region 13n respectively formed on the left and right sides or the memory cell transistor Mn–1 having the drain region 13-1 and source region 12n respectively formed on the left and right sides.

One of the switching gates SWL and SWR is commonly connected to the data write circuit 34 to receive the output signal CL which has a high voltage Vpp or a low voltage Vss. When the data "0" is being written in a selected memory cell, the high voltage Vpp is used, while the data "1" is being written, the low voltage Vss is used as the output signal CL, respectively. This switching operation is performed by supplying switching signals to the gates of the transistors constituting the switching gates SWL and SWR and turning them on. This operation will be described in detail later with reference to FIGS. 7 and 8.

Figure 5:
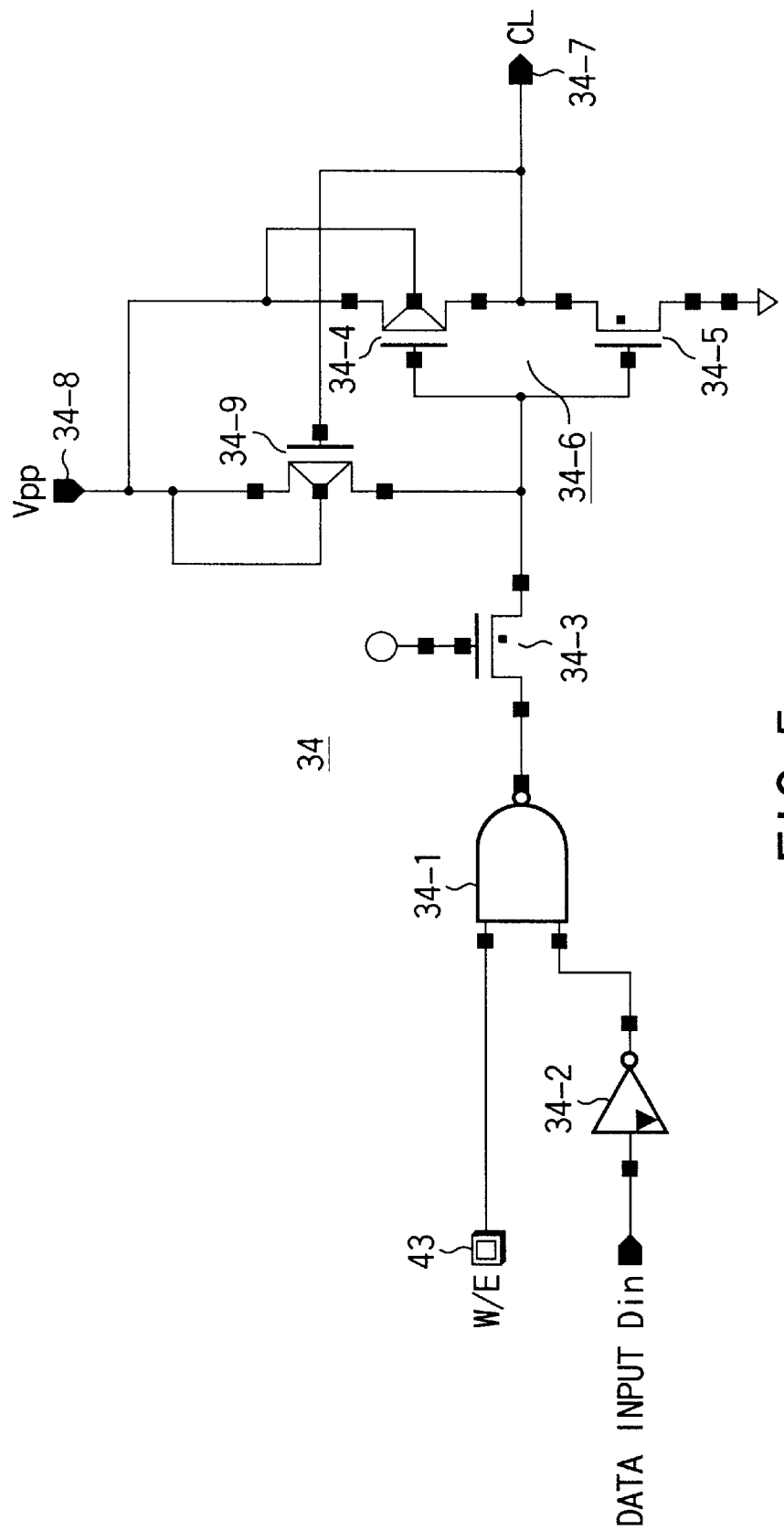
FIG. 5 is a circuit diagram showing a data write circuit in FIG. 4 in detail.

FIG. 5 is a circuit diagram showing an example of the internal arrangement of the data write circuit 34 in detail. In this circuit, the write enable (W/E) terminal 43 in FIG. 4 is connected to one of the input terminals of a NAND circuit 34-1, the NAND output based on the data input supplied from a data input terminal Din connected to the I/O pad 36 to the other input terminal of the NAND circuit 34-1 through a inverter 34-2 is obtained from the NAND circuit 34-1, and the NAND output from the NAND circuit 34-1 is output as a write signal to a CL output terminal 34-7 through a transfer gate 34-3 and inverter circuit 34-6 made up of a p-channel transistor 34-4 and n-channel transistor 34-5.

This write signal is one of the high voltage signal Vpp for "0" writing or the low voltage signal Vss for "1" writing and is held by a holding circuit formed from a p-channel transistor 34-9 connected to a Vpp terminal 34-8.

When, therefore, a write enable signal is input to the terminal 43 and the data input Din of "0" or "1" is present, the data Din is output as the write signal CL to the output terminal 34-7. This write signal CL is supplied to, for example, the column line CoL1 in the drain region on the right side of the bit line Bit0 connected to the source region S or the column line CoL0 in the drain region on the left side in accordance with the L/R switching signal.

Figure 6:
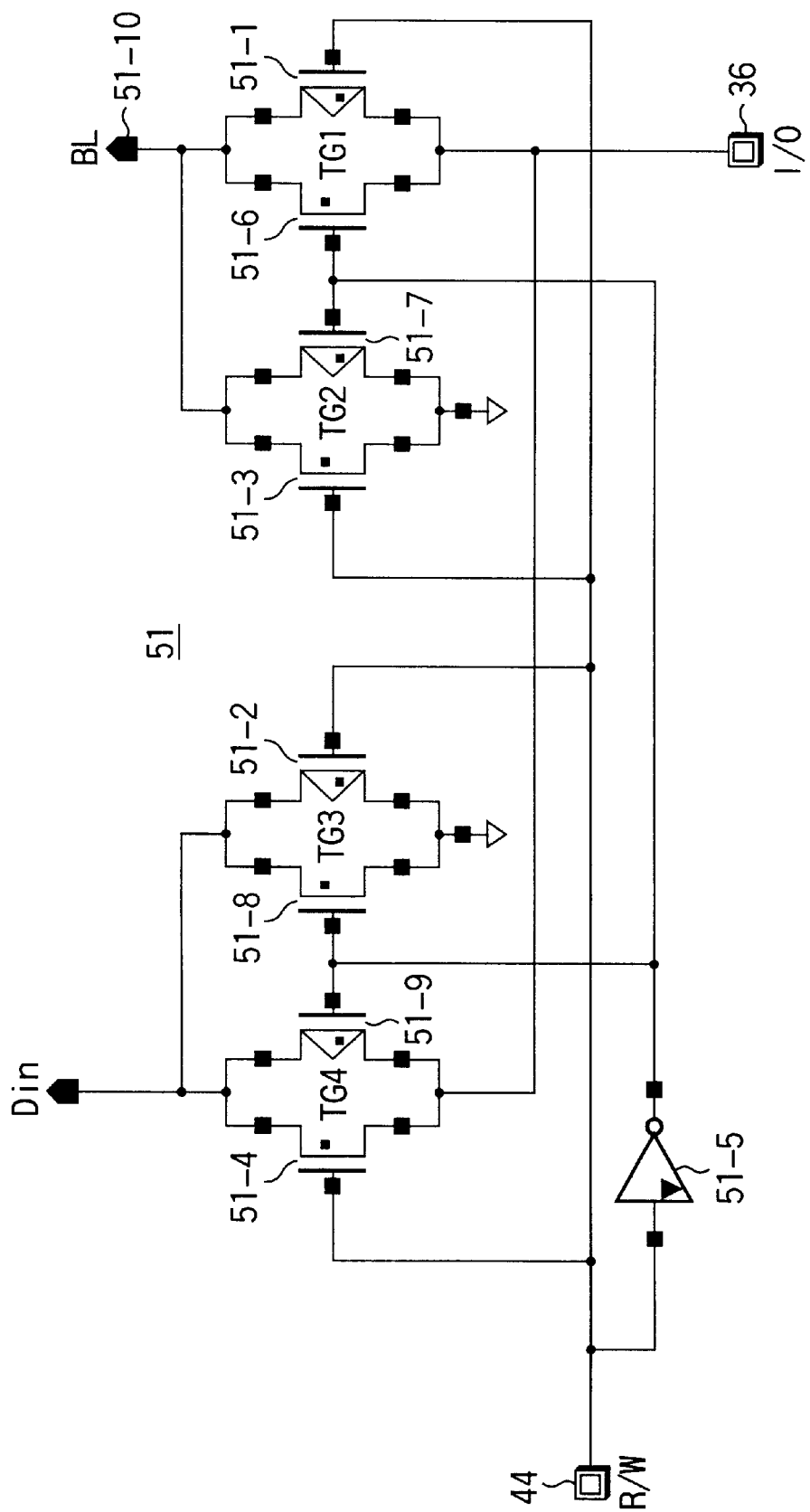
FIG. 6 is a circuit diagram showing a switching circuit in FIG. 4 in detail.

An example of the internal arrangement of the switching circuit 51 in FIG. 4 will be described in detail below with reference to FIG. 6. Referring to FIG. 6, the R/W signal input to the read/write (R/W) terminal 44 in FIG. 4 is supplied to the gates of p-channel transistors 51-1 and 51-2 and n-channel transistors 51-3 and 51-4 respectively forming the switching gates TG1 to TG4.

This R/W signal is inverted by an inverter 51-5 and commonly connected to the gates of n-channel transistor 51-6 of the switching gate TG1 and p-channel transistor 51-7 of the switching gate TG2. In addition, the R/W signal is commonly connected to the gates of an n-channel transistor 51-8 of the switching gate TG3 and p-channel transistor 51-9 of the switching gate TG4.

One terminal of each of the transistors 51-1, 51-6, 51-4, and 51-9 is commonly connected to the data input/output terminal (I/O) 36. One terminal of each of the transistors 51-3, 51-7, 51-2, and 51-8 is commonly grounded. The other terminal of each of the transistors 51-1, 51-6, 51-3, and 51-7 is commonly connected to a bit line (BL) connection terminal 51-10 connected to the bit lines Bit0–Bit31, via the column selection gate 33. The other terminal of each of the transistors 51-2, 51-8, 51-4, and 51-9 is commonly connected to the data input terminal Din of the data write circuit 34.

When, therefore, when the write "W" signal of "HIGH" level indicating a write is input to the R/W terminal 44, the transistors 51-4 and 51-9 of the switching gate TG4 are turned on. At this time, if data is input to the I/O terminal 36, the data is supplied from the terminal Din to the data write circuit 34. At this time, the transistors 51-2 and 51-8 are turned off.

At the same time, since the transistors 51-3 and 51-7 are turned on and transistors 51-1 and 51-6 are turned off, the voltage Vss is applied to the bit line via the terminal 51-10. As a result, data write operation is performed in the selected memory cell transistor.

A circuit arrangement of supplying switching signals L and R to the gates of the transistors building the switching gates SWL and SWR in FIG. 4 will be described in detail below with reference to FIGS. 7 and 8. These circuits are those for generating the signals L and R based on the input address signals A0 and A1 and are provided in the column decoder 32 shown in FIG. 3.

Figure 7:
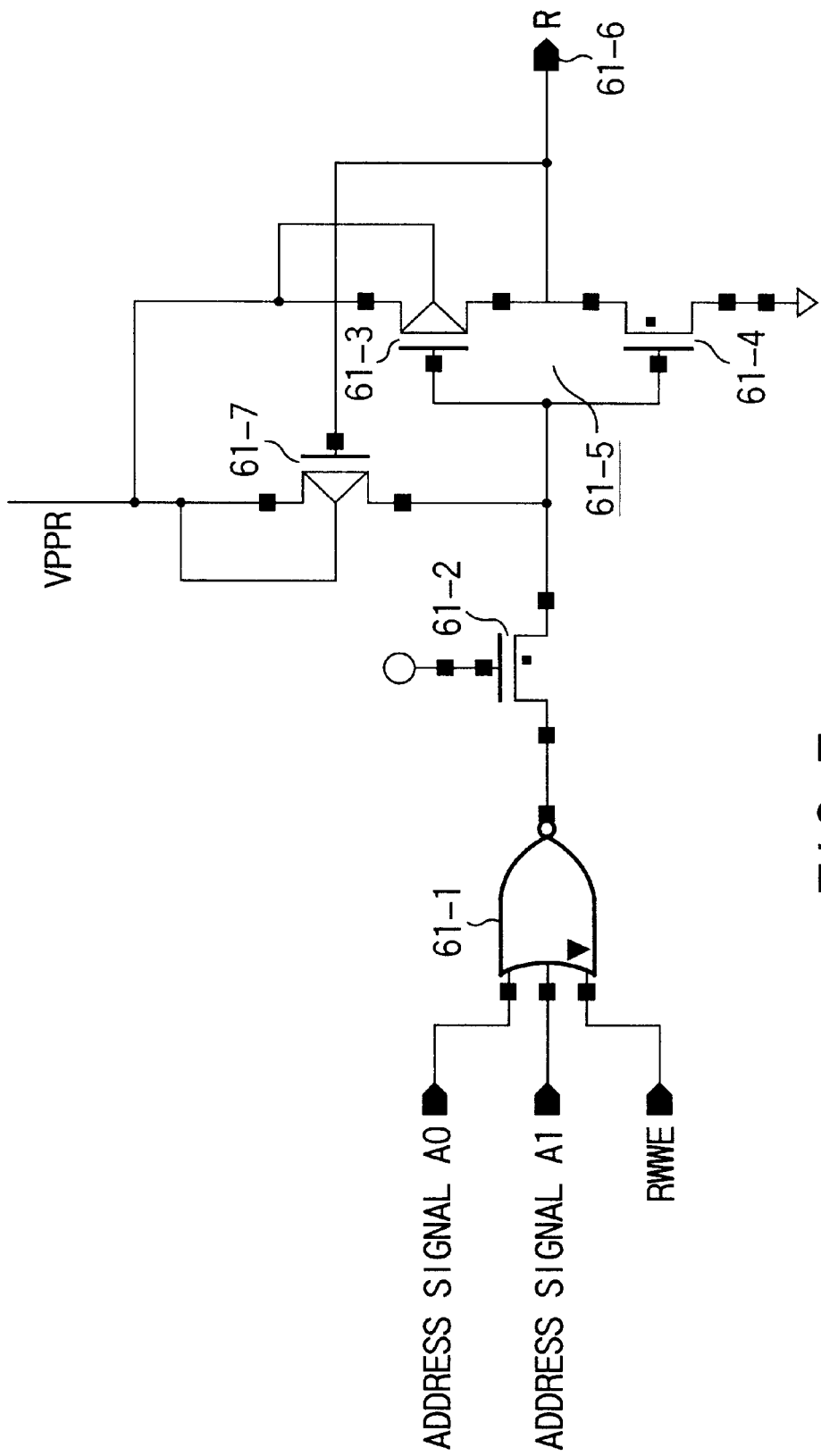
FIG. 7 is a circuit diagram showing the detailed arrangement of a circuit for generating a switching signal R in FIG. 3.

FIG. 7 shows a circuit for forming the right side switching signal R. The input address signals A0 and A1 and signal RWWE are supplied to a NOR circuit 61-1, and the NOR output as an "R" signal to an output terminal 61-6 through a p-channel transistor 61-3 and n-channel transistor 61-4 building an inverter circuit 61-5. The binary states "HIGH" and "LOW" of this signal "R" are held by a holding circuit formed with a p-channel transistor 61-7.

The signal RWWE is set at "LOW" in a write operation, and at "HIGH" in a reset operation. This reset operation will be described later with reference to FIGS. 24 and 25.

Figure 8:
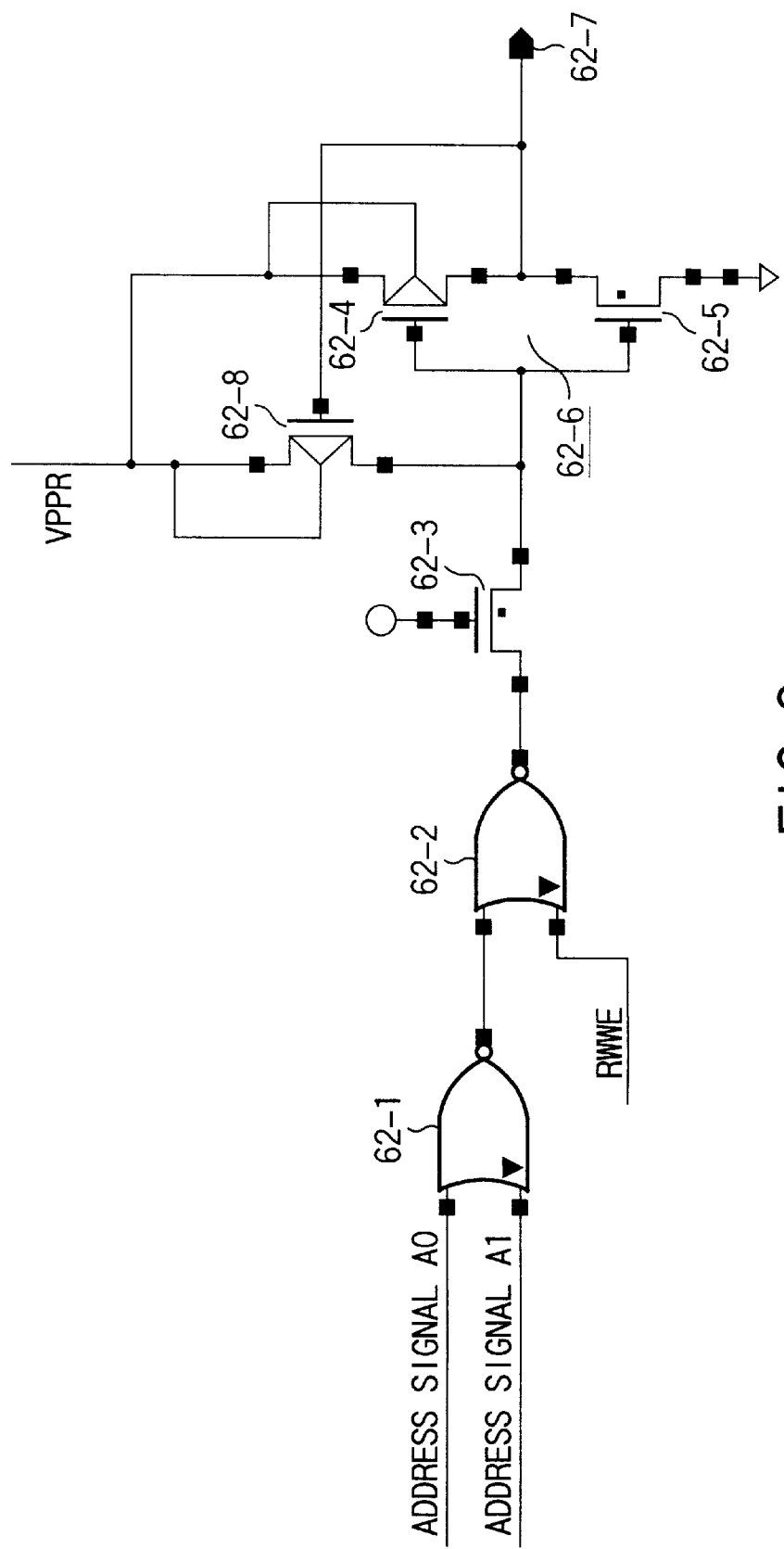
FIG. 8 is a circuit diagram showing the detailed arrangement of a circuit for generating a switching signal L in FIG. 3.

FIG. 8 shows a circuit for forming the left side switching signal L. The input address signals A0 and A1 are supplied to a NOR circuit 62-1, and the output and signal RWWE are supplied to a NOR circuit 62-2. The NOR output as an "L" signal to an output terminal 62-7 through a transfer gate 62-3 and inverter circuit 62-6 made up of a p-channel transistor 62-4 and n-channel transistor 62-5. This "L" signal in "HIGH" or "LOW" state is held by a holding circuit formed with a p-channel transistor 62-8.

When the column line CoL1 in FIG. 4 is selected in data write operation, for example, the transistor GTC1 in the column selection gate 33 is turned on by the column decoded signal H0 to generate the "R" signal in "HIGH" state, thereby turning on the switching transistor GTC1 so as to supply the write voltage CL to the column line CoL1. If the signal "L" is "HIGH", the switching transistor SWL0 is turned on and the write voltage CL is applied to the column line CoL0.

In this case, the address signals A0 and A1 used for switching the signals L and R are input address signal bits for controlling row/column addressing, as described with reference to FIG. 3. An operation sequence for writing data in cells [A] and [B] in the cell array will be described with reference to FIG. 9.

The cell [A] is connected to a bit line Y of a buried layer on the offset source S2 side (which corresponds to the source region 12*n* in FIG. 1, for example), and a buried layer X on the drain D1 side (which corresponds to the non-offset drain region 13*n*–1 in FIG. 1, for example), and is also connected to a bit line S2 and column line D1 through select gates SGS1 and SGD1.

The cell [B] is connected to a bit line W of a buried layer on the offset source S3 side and a buried layer Z on the drain D3 side, and is also connected to a bit line S3 and column line D3 through select gates SGS2 and SGD2.

Figure 9:
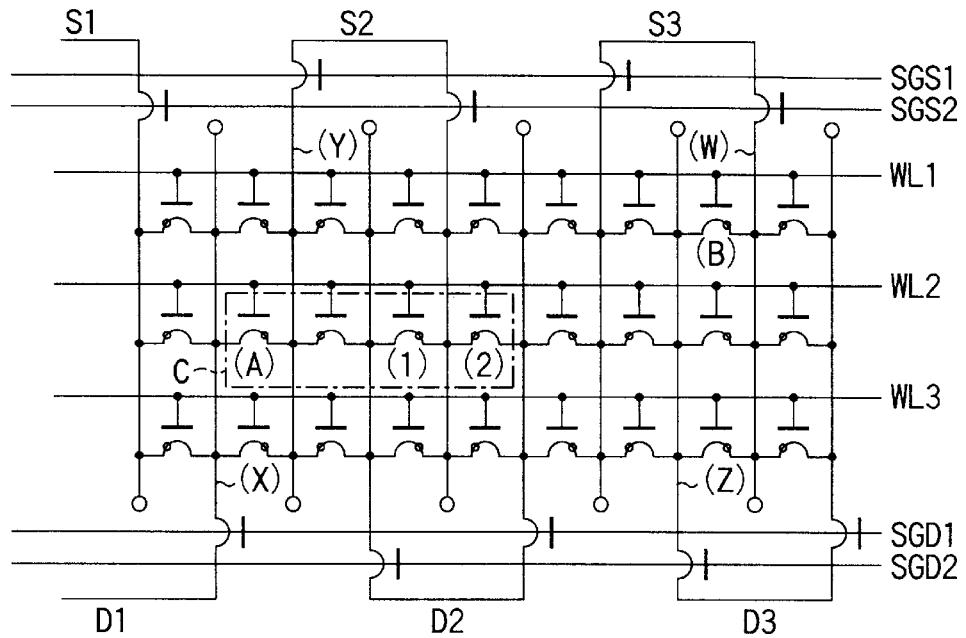
FIG. 9 is a circuit diagram showing part of the memory cell array in FIG. 3.

These select gates are selected by column gate and column decoded signals. Which cell is selected in the portion indicated by a circle C in FIG. 9 is determined depending on which bit line Bit and column line CoL are selected by the four-stage signals SGS1, SGS2, SGD1, and SGD2. It can therefore be determined easily whether the memory cell formed between that source buried region of the buried regions in FIG. 1 which has an offset side wall and the non-offset drain buried region on the left side or the memory cell formed between the above source buried region and the non-offset drain buried region on the right side is selected.

The arrangement and operation of the voltage generating circuit 109 for generating a voltage Vpp as the "0" write signal used for a data write in FIG. 1 will be described in detail with reference to FIGS. 10 to 14. The voltage generating circuit 109 generates various voltages on the basis of power supply voltage Vcc. A case wherein the voltage generating circuit 109 generates a high voltage Vpp to be applied to word lines through the pads 37, 39 and 40 in FIG. 3 will be described below.

Figure 10:
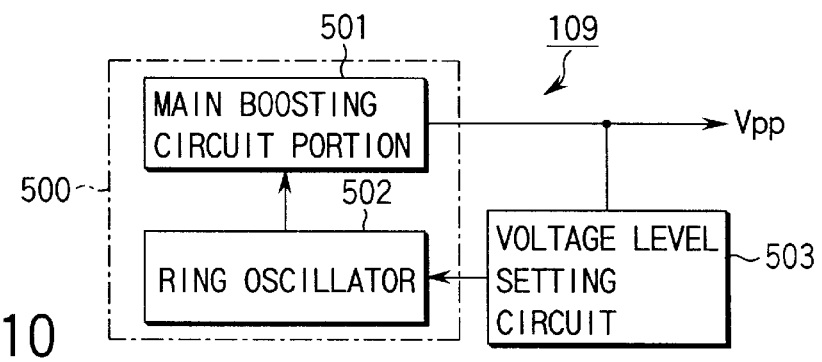
FIG. 10 is a block diagram showing the basic arrangement of a voltage generating circuit in FIG. 3.

FIG. 10 shows the arrangement of a high write voltage generating circuit portion of the voltage generating circuit 109. The high write voltage generating circuit 109 is comprised of a boosting circuit 500 for generating a boosted voltage and a voltage level setting circuit (limiting circuit) 503 for stopping the operation of the boosting circuit 500 upon detecting that the output voltage from the boosting circuit 500 has reached a predetermined value. In this embodiment, the voltage level setting circuit 503 adjusts the output voltage value from the boosting circuit 500 as well as performing control to stop the operation of the boosting circuit 500.

The boosting circuit 500 is comprised of a main boosting circuit portion 501 controlled by clocks and a ring oscillator 502 for supplying clocks to the main boosting circuit portion 501.

Figure 13:
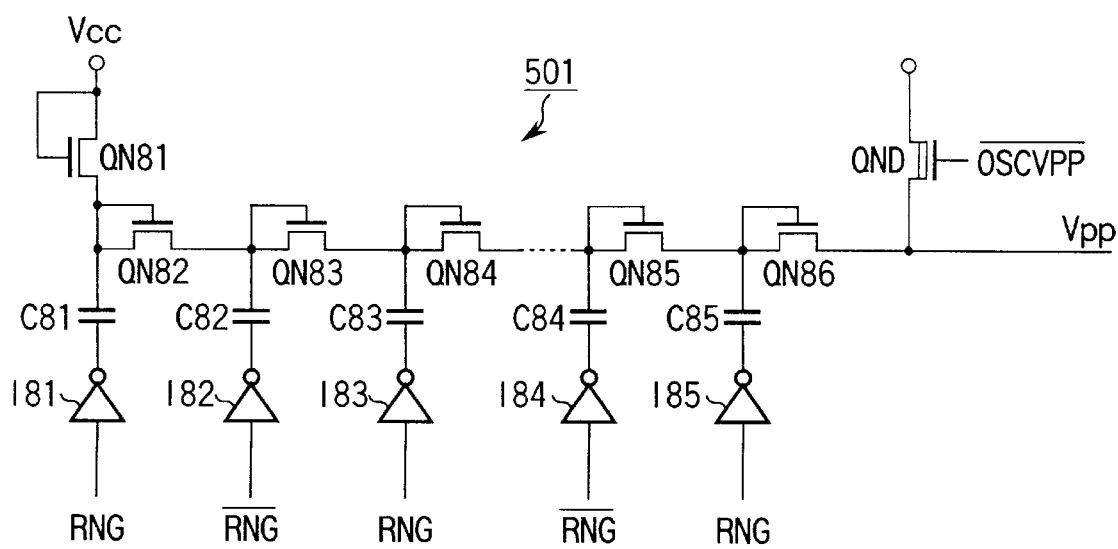
FIG. 13 is a circuit diagram showing a main boosting circuit portion in FIG. 10.

As shown in FIG. 13, the main boosting circuit portion 501 is made up of diode-connected charge transfer NMOS transistors QN81 to QN86 connected in series between the power supply Vcc terminal and the boosted output terminal Vpp and charge pumping capacitors C81 to C86 connected to the connection nodes of these transistors. Complementary clocks RNG and /RNG are alternately supplied to one terminal of each of the capacitors C81 to C85 through a corresponding one of inverters I81 to I85. With this operation, charge storage in each capacitor and charge transfer by the diode-connected NMOS transistors QN81 to QN86 in one direction are repeated to boost the power supply voltage Vcc into the voltage Vpp.

A D-type NMOS transistor QND to which an activation signal /OSCVPP is input is inserted between a boosted output terminal VPP and power supply terminal VCC. While activation signal /OSCVPP="H", the transistor QND is kept on to hold the boosted output terminal VPP at the potential Vcc. When activation signal /OSCVPP="L", the transistor QND is turned off to disconnect the output terminal VPP from the power supply terminal VCC to allow boosting operation using the clocks RNG and /RNG.

Figure 11:
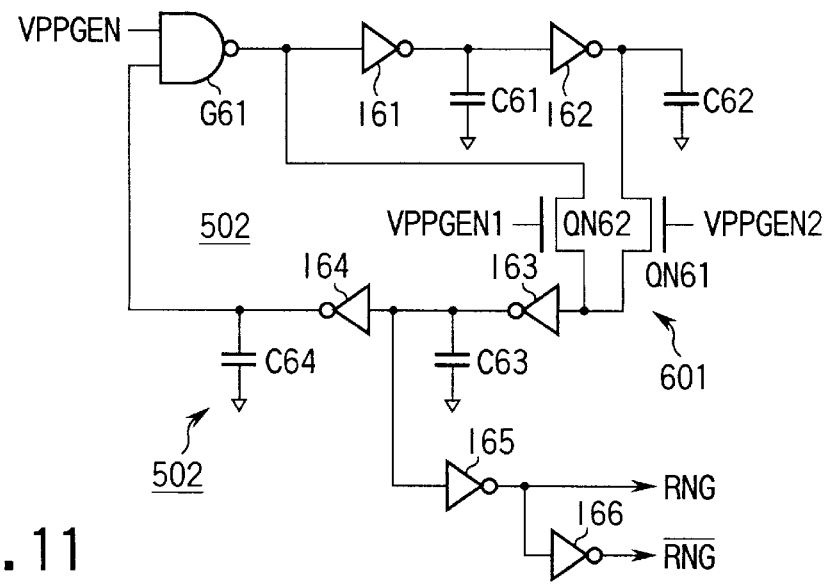
FIG. 11 is a circuit diagram showing the arrangement of a ring oscillator in FIG. 10.

As shown in FIG. 11, the ring oscillator 502 is made up of inverters I61 to I64 connected in the form of a ring including a 2-input NAND gate G61 and transistor QN61. Capacitors C61 to C64 are connected to the gate stages of the respective inverters. One input terminal of the NAND gate G61 serves as a feedback element for forming a ring, and a driving signal VPPGEN that is set at "H" when the boosting circuit is activated is input to the other input terminal of the NAND gate G61. When driving signal VPPGEN="H" is input to the other input terminal, the ring oscillator 502 starts oscillating.

The output from the ring oscillator 502 is extracted through an inverter I65 and inverter I66 for inverting the output, and is generated as the complementary clocks RNG and /RNG to be supplied to the main boosting circuit portion 501 in FIG. 13.

The ring oscillator 502 includes a switch circuit 601 that is controlled by control signals VPPGEN1 and VPPGEN2 obtained from the voltage level setting circuit 503 (to be described later) to change the number of gate stages of the ring oscillator 502 and the frequency of clocks to be generated. The switch circuit 601 is comprised of the NMOS transistor QN61 inserted between the output terminal of the inverter I62 and the input terminal of the inverter I63 and the NMOS transistor QN62 inserted between the output terminal of the NAND gate G61 and the input terminal of the inverter I63.

Figure 12A:
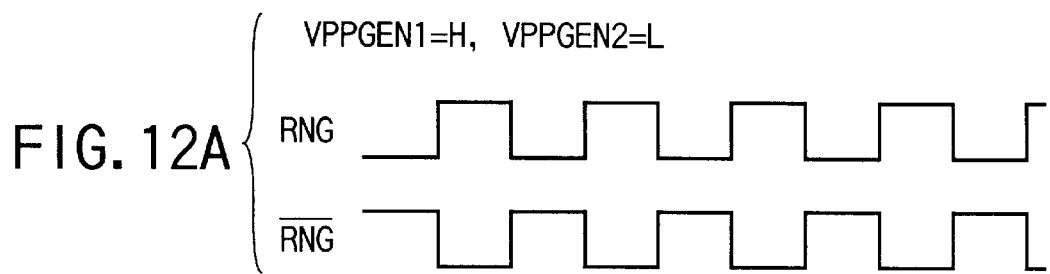
FIG. 12A is a timing chart showing the waveforms of outputs obtained when the number of gate stages in the ring oscillator in FIG. 11 decreases.
Figure 12B:
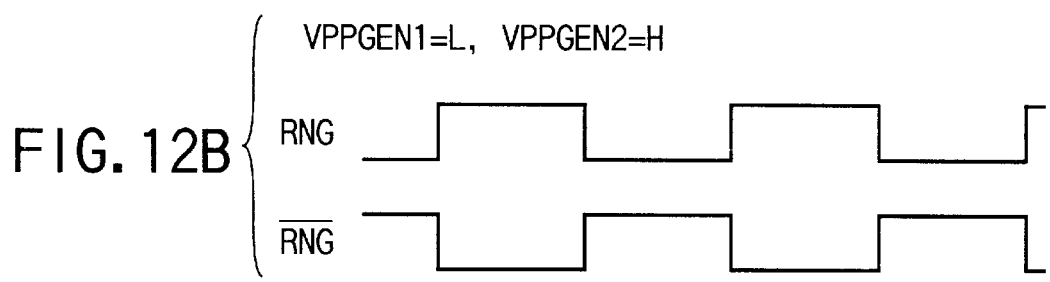
FIG. 12B is a timing chart showing the waveforms of outputs obtained when the number of gate stages in the ring oscillator in FIG. 11 increases.

When the control signals input to the switch circuit 601 are VPPGEN1="H" (=VCC) and VPPGEN2="L" (=0 V), the NMOS transistor QN62 is turned on, and the number of stages of the ring oscillator 502 decreases from 4 to 2. As a consequence, the complementary clocks RNG and /RNG in FIG. 12A are obtained. When the control signals are VPPGEN1="L" and VPPGEN2="H", the NMOS transistor QN61 is turned on, and the number of stages of the ring oscillator 502 is doubled to 4. As a consequence, as shown in FIG. 12B, the clocks RNG and /RNG each having a long period (i.e., a low frequency), which is twice that in FIG. 12A, can be obtained.

Figure 14:
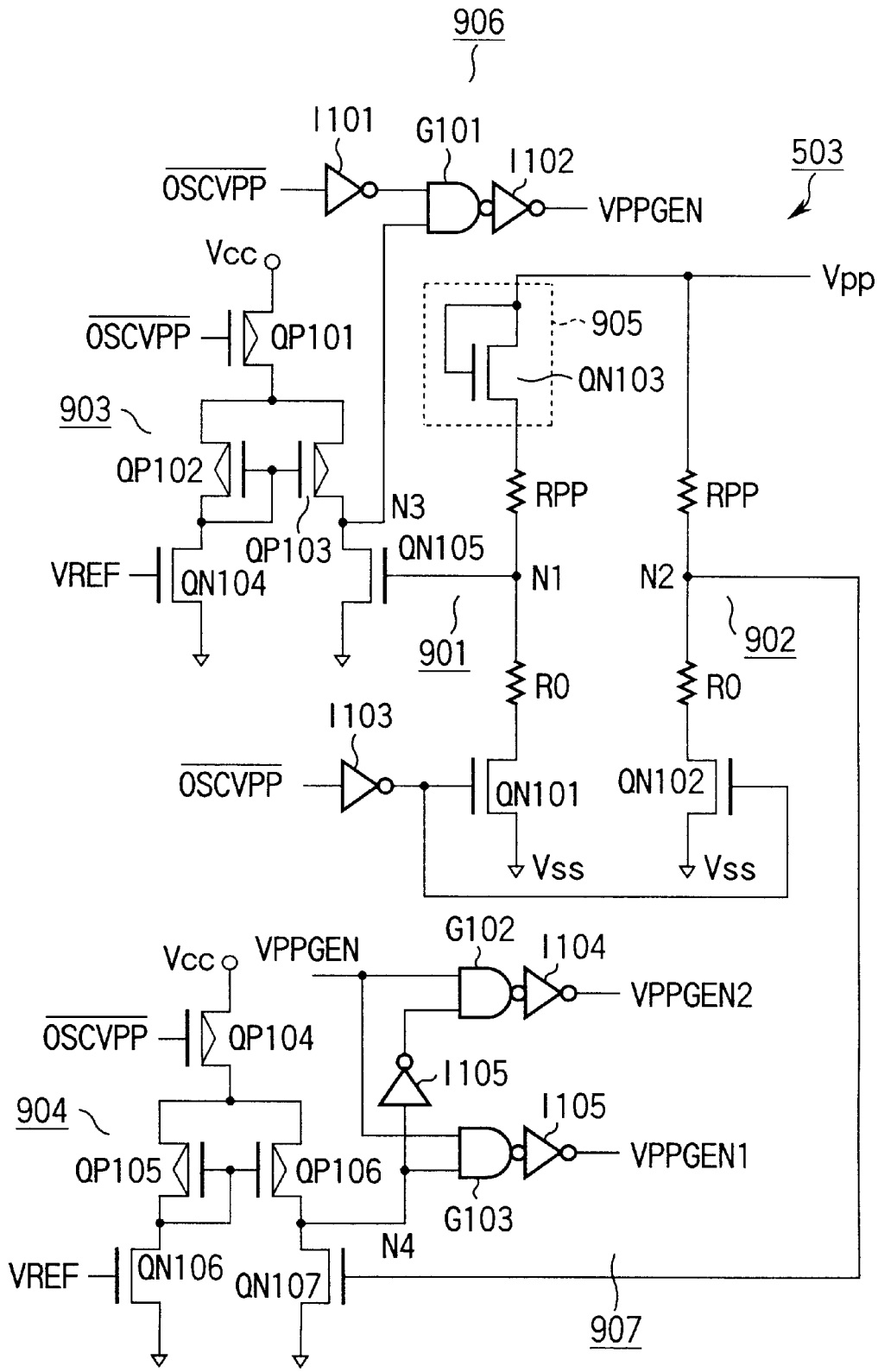
FIG. 14 is a circuit diagram showing a voltage level setting circuit in FIG. 10 in detail

FIG. 14 shows an example of the arrangement of the voltage level setting circuit, i.e., the limiting circuit 503, for generating control signals (i.e., the driving signal VPPGEN for activating the ring oscillator 502 in FIG. 11 and the control signals VPPGEN1 and VPPGEN2 for changing the output frequency of the ring oscillator 502) for the boosting circuit 500 while monitoring the output level of the boosting circuit 500. The voltage level setting circuit 503 includes a plurality of current paths, and more specifically two current paths 901 and 902 in FIG. 14, which are formed between the boosted output terminal VPP and the ground terminal VSS to detect the voltage obtained at the boosted output terminal VPP at a plurality of levels and perform switching control on the performance of the boosting circuit 500.

The first current path 901 is used to detect the set value of the final boosted voltage. In this current path, two resistors RPP and R0 constituting a resistance voltage dividing circuit, activation NMOS transistor QN101, and voltage drop element 905 are connected in series between the terminals VPP and VSS. A connection node N1 between the resistors RPP and R0 serves as a voltage detection node. The voltage drop element 905 is located closer to the terminal VPP than this voltage detection node N1. In this embodiment, the voltage drop element 905 is formed from a diode-connected NMOS transistor QN103 to cause an almost constant voltage drop regardless of a current.

The second current path 902 is used to detect a level slightly lower than that of the set value of the final boosted voltage. Similar to the first current path 901, the second current path 902 has a voltage dividing circuit using resistors RPP and R0 and an activation NMOS transistor QN102, but has no voltage drop element inserted. A connection node N2 between the resistors RPP and R0 serves as a voltage detection node. Assume that the first and second current paths 901 and 902 have the same resistance in this embodiment.

In these current paths 901 and 902, when the boosting circuit activation signal /OSCVPP is set at "L", the activation transistors QN101 and QN102 are turned on. As a consequence, currents flow in these paths. At this time, a voltage difference is generated between the voltage detection nodes N1 and N2 owing to the influence of a voltage drop at the voltage drop element 905. Comparators 903 and 904 and gate circuits 906 and 907 constitute a switching control circuit for detecting the voltages at the detection nodes N1 and N2 of the current paths 901 and 902 and generating the control signals VPPGEN1 and VPPGEN2 for changing the performance of the boosting circuit.

The comparators 903 and 904 respectively detect that the voltages at the voltage detection nodes N1 and Ns of the current paths 901 and 902 exceed a reference voltage VREF. One comparator 903 is comprised of an active load constituted by a pair of PMOS transistors QP102 and QP103 and a current mirror type differential amplifier having differential NMOS transistors QN104 and QN105. An activation PMOS transistor QP101 is formed on the power supply Vcc side. Likewise, the other comparator 904 is comprised of PMOS transistors QP105 and QP106 constituting an active load, and a current mirror type differential amplifier having differential NMOS transistors QN106 and QN107 and an activation PMOS transistor QP104 on the power supply Vcc side.

An output node N3 of the comparator 903 is connected to one input terminal of a NAND gate G101 building the gate circuit 906 for generating the driving signal VPPGEN for the ring oscillator of the boosting circuit. The signal obtained by inverting the boosting circuit activation signal /OSCVPP through the inverter I101 is input to the other input terminal of the NAND gate G101. Therefore, while the boosting circuit 500 is activated and the output node N3 of the comparator 903 is kept at "H", the signal VPPGEN for driving the ring oscillator 502 is kept at "H".

The gate circuit 907 is connected to an output node N4 of the other comparator 904. The gate circuit 907 generates the control signals VPPGEN1 and VPPGEN2 for performing switching control on the boosting speed of the boosting circuit 500 in accordance with the logic operation between the output signal from the output node N4 and the driving signal VPPGEN obtained from the NAND gate G101 on the comparator 903 side. More specifically, a NAND gate G103 for outputting the control signal VPPGEN1 upon coincidence between the output signal from the output node N4 of the comparator 904 and the driving signal VPPGEN while the output node N4 is set at "H" is connected to the output node N4, together with a NAND gate G102 for detecting that the output node N4 is set at "L", and generating the control signal VPPGEN2 upon coincidence between the output signal from the output node N4 and the driving signal VPPGEN.

The operation of the boosting circuit 500 controlled by the voltage level setting circuit 503 having the above arrangement will be described next. The boosting circuit 500 is activated by the activation signal /OSCVPP. After the boosting circuit 500 is activated, the output node N3 of the comparator 903 is at "H" while the voltages at the detection nodes N1 and N2 of the two current paths 901 and 902 do not reach the reference voltage VREF, and the driving signal VPPGEN is set at "H" upon detecting the coincidence at the NAND gate G101. Meanwhile, the output node N4 of the comparator 904 is also set at "H", and the coincidence between the driving signal VPPGEN and the signal from the output node N4 is detected by the NAND gate G103. As a consequence, the driving signal VPPGEN1 is set at "H". At this time, the control signal VPPGEN2 is at "L".

When the control signals VPPGEN1 and VPPGEN2 are respectively set at "H" and "L", the ring oscillator 502 in the FIG. 11 is set in the state wherein the number of inverter stages is small. As a result, the complementary clocks RNG and /RNG have short periods, i.e., become high-speed clocks shown in FIG. 12A. With this operation, high-speed boosting operation (charging) is performed.

When the boosted output terminal VPP rises to a given level, the node N2 of the second current path 902 of the voltage detection nodes N1 and N2 of the two current paths 901 and 902 exceeds the reference voltage VREF first. This is because the voltage drop element 905 is inserted in the first current path 901. When the output node N4 of the comparator 904 is set at "L", the output from the NAND gate G103 is set at "H", and hence the control signal VPPGEN1 is set at "L". The output from the NAND gate G102 is then set at "L", and hence the control signal VPPGEN2 is set at "H". As a consequence, the NMOS transistor QN61 and NMOS transistor QN62 of the ring oscillator 502 in FIG. 11 are respectively turned on and off. That is, the complementary clocks RNG and /RNG output from the ring oscillator 502 have long periods, i.e., become low-frequency clocks, as shown in FIG. 12B. As a result, the boosting curve is switched to a moderate curve.

When the voltage detection node N1 of the first current path 901 exceeds the reference voltage VREF afterward, the output from the comparator 903 is inverted. As a consequence, the driving signal VPPGEN is set at "L". At the same time, the output from the NAND gate G102 is set at "H". The driving signal VPPGEN2 is set at "L". This stops the boosting operation of the boosting circuit.

The arrangement of the row decoder 31 in FIG. 3 will be described next. The address signals A0, A1, and A7 to A16 are supplied from the address pads AP1 and AP3 to the row decoder 31 through the address buffers. For example, the row decoder 31 has the arrangement shown in FIGS. 15, 16A, 16B, and 17. Address signals are supplied from the address buffers having the arrangement shown in FIG. 21 to the row decoder 31.

Figure 21:
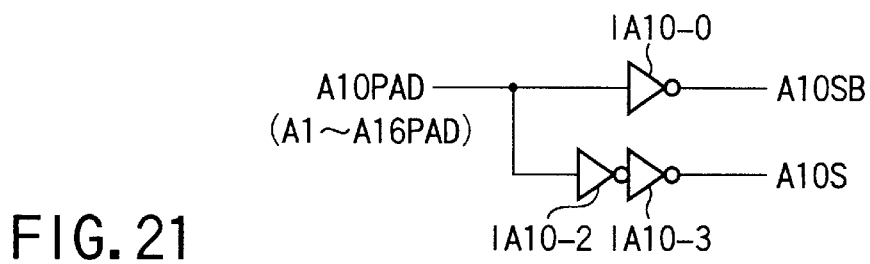
FIG. 21 is a circuit diagram showing a buffer circuit for address signals to be supplied to the decoder circuit in FIGS. 15 to 20.

Although FIG. 21 shows only the address buffer for the address signal A10, the address buffers for the remaining address signals have the same arrangement. Referring to FIG. 21, the address signal A10 is input to a pad A10PAD of the address pads AP3 and passes through one inverter IA10-1 to output an address signal A10SB, and also passes through two inverters IA10-2 and IA10-3 to output an address signal A10S. Likewise, with the remaining address signals A0 to A9 and A11 to A16, address signals A0S, A0SB, . . . , A16S, and A16SB are output from the respective address buffers.

Figure 15:
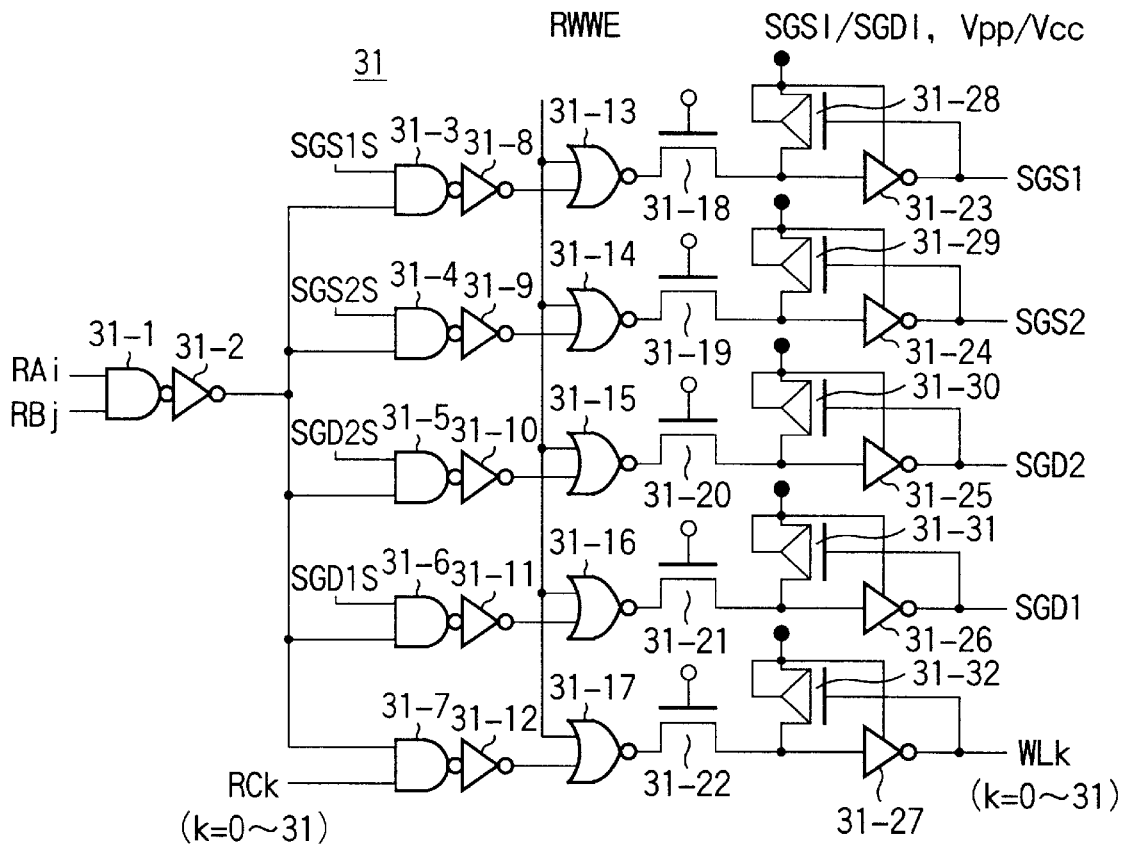
FIG. 15 is a circuit diagram showing an example of the detailed circuit arrangement of a row decoder in FIG. 3.
Figure 16A:
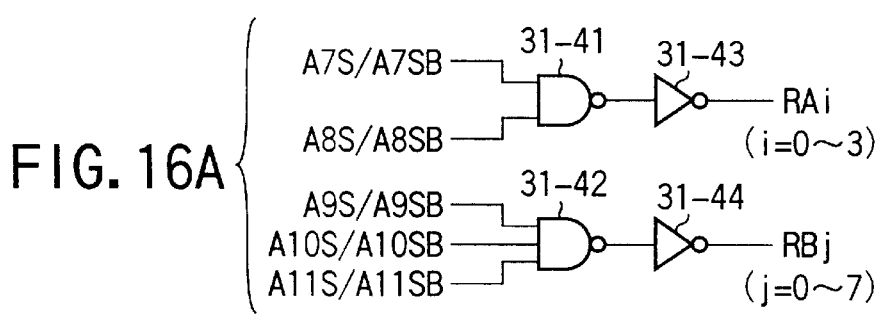
FIG. 16A is a circuit diagram showing an input generating circuit in FIG. 15.

Referring to FIG. 15, the row decoder 31 includes a NAND circuit 31-1 for receiving signals RAi (i=0 to 3) and RBj (j=0 to 7) supplied from the decoder circuit shown in FIG. 16A on the basis of the address signals A7S, A7SB, . . . , A11S, and A11SB. The output from the NAND circuit 31-1 is commonly supplied as one input to each of five NAND circuits 31-3 to 31-7 through an inverter 31-2 to obtain the NAND with each of signals SGS1S, SGS2S, SGS2S, SGD2S, SGD1S, and RCk (k=0 to 31) supplied as the other input. In this case, the signals RCk (k=0 to 31) are obtained by decoding the address signals A12S, A12SB, . . . , A16S, and A16SB using the decoder circuit in FIG. 16B.

Figure 22:
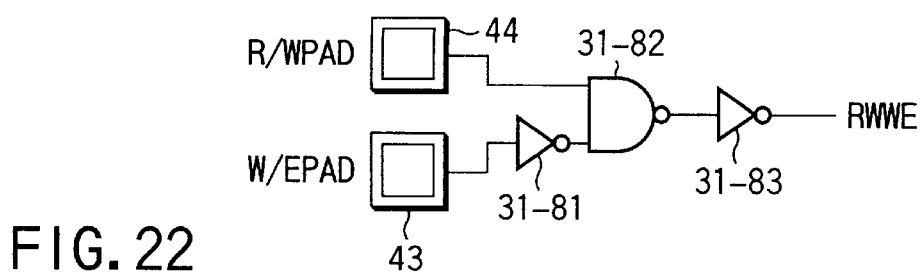
FIG. 22 is a circuit diagram showing a circuit for generating inputs in FIG. 15.

Each of the logic outputs obtained from the NAND circuits 31-3 to 31-7 is input as one input to a corresponding one of NOR circuits 31-13 to 31-17 through a corresponding one of inverters 31-8 to 31-12. A signal RWWE from the buffer circuit shown in FIG. 22 is supplied as the other input to each of the NOR circuits 31-13 to 31-17.

The outputs from the NOR circuits 31-13 to 31-17 are respectively inverted by inverters 31-23 to 31-27 through transfer gates 31-18 to 31-22 to be output as decoded outputs SGS1, SGS2, SGD2, SGD1, and WLk (k=0 to 31). Note that the signals SGSI/SGDI and VPP/VCC are supplied to the input sides of the inverters 31-23 to 31-27 through PMOS transistors 31-28 to 31-32 only when the decoded outputs SGS1, SGS2, SGD2, SGD1, and WLk (k=0 to 31) are at "L".

The decoder circuit for generating the signals RAi and RBj will be described below with reference to FIG. 16A. The address signals A7S, A7SB, A8S, and A8SB obtained from the address buffers each having the arrangement described with reference to FIG. 21 are supplied as inputs to a 2-input NAND circuit 31-41. The logic output from this circuit is then output as the signal RAi (i=0 to 3) through an inverter 31-43.

Likewise, the address signals A9S, A9SB, . . . , A11S, and A11SB are supplied to a 3-input NAND circuit 31-42 and output as the signal RBj (j=0 to 7) through an inverter 31-44.

Figure 16B:
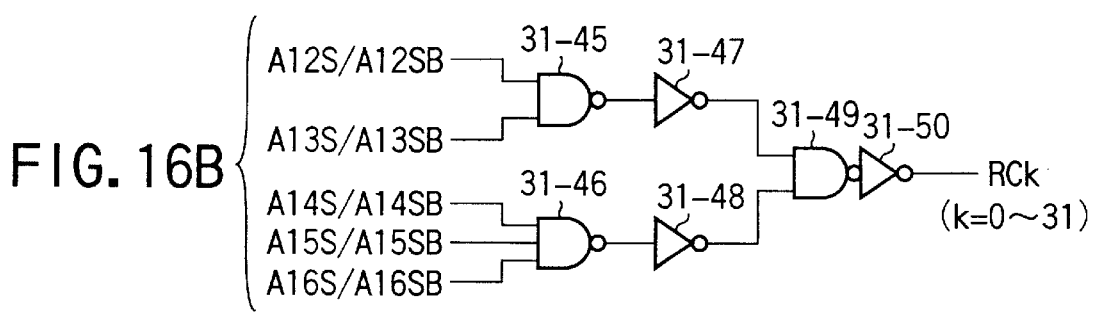
FIG. 16B is a circuit diagram showing another input generating circuit in FIG. 15.

The signal RCk (k=0 to 31) supplied to the NAND circuit 31-7 in FIG. 15 is formed by the decoder circuit in FIG. 16B. Referring to FIG. 16B, the address signals A12S, A12SB, . . . , A16S, and A16SB are supplied to two NAND circuits 31-45 and 31-46 in twos and threes, respectively. The outputs from the circuits 31-45 and 31-46 are supplied as inputs to a NAND circuit 31-49 through inverters 31-47 and 31-48. The output from the NAND circuit 31-49 is supplied as RCk (k=0 to 31) to the row decoder 31 in FIG. 15 through an inverter 31-50.

Figures 17, 18:
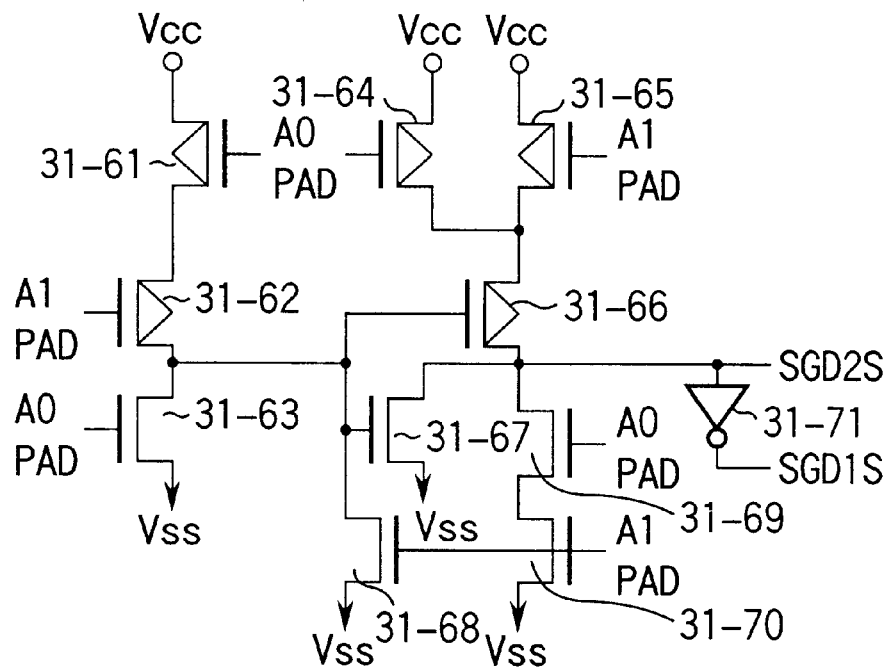
FIG. 17 is a circuit diagram showing still another input generating circuit in FIG. 15.
FIG. 18 is a view showing logic values in the circuit in FIG. 17.

The signals SGD2S and SGD1S supplied to the NAND circuits 31-5 and 31-6 in FIG. 15 are formed by the decoder circuit shown in FIG. 17. Referring to FIG. 17, these signals SGD2S and SGD1S are formed from the address signals A0 and A1, and this circuit has the logic matrix shown in FIG. 18. Note that since the signals SGS1S and SGS2S supplied to the decoder circuit shown in FIG. 15 are formed from the address signals A0 and A1 according to a logic matrix similar to the one shown in FIG. 18, a description thereof will be omitted.

Referring to FIG. 17, two PMOS transistors 31-61 and 31-62 and one NMOS transistor 31-63 are connected in series between the power supply voltage terminals VCC and VSS. The address signal A0 is supplied to the gates of the transistors 31-61 and 31-63, and the address signal A1 is supplied to the gate of the transistor 31-62.

Two PMOS transistors 31-64 and 31-65 are connected in parallel with the power supply terminal VCC. This parallel circuit is further connected to the terminal VSS through a PMOS transistor 31-66 and NMOS transistor 31-67, and is also connected to the power supply terminal VSS through the PMOS transistor 31-66 and NMOS transistors 31-69 and 31-70. The gate of the transistor 31-66 is connected to the gate of the transistor 31-67, together with the connection node between the transistors 31-62 and 31-63, and is also connected to the power supply terminal VSS through a transistor 31-68. The gates of the transistors 31-68 and 31-70 are connected to each other.

With this arrangement, the signal SGD2S is output from the connection node between the transistors 31-66, 31-67, and 31-69, and the signal SGD1S is also output from the connection node through the inverter 31-71.

A circuit for generating the signal RWWE to be supplied to the data compensation processor 31 in FIG. 15 will be described with reference to FIG. 22. The signal RWWE is generated from the two types of signals supplied to the signal input pads 43 and 44 in FIG. 3, i.e., the write/read control signal R/W and write enable signal W/E. The signal R/W supplied to the pad 44 is directly supplied as one input to a NAND circuit 31-82. The signal W/E supplied to the other pad 43 is supplied as the other input to the NAND circuit 31-82. The output from the NAND circuit 31-82 is output as the signal RWWE through an inverter 31-83.

Figure 32:
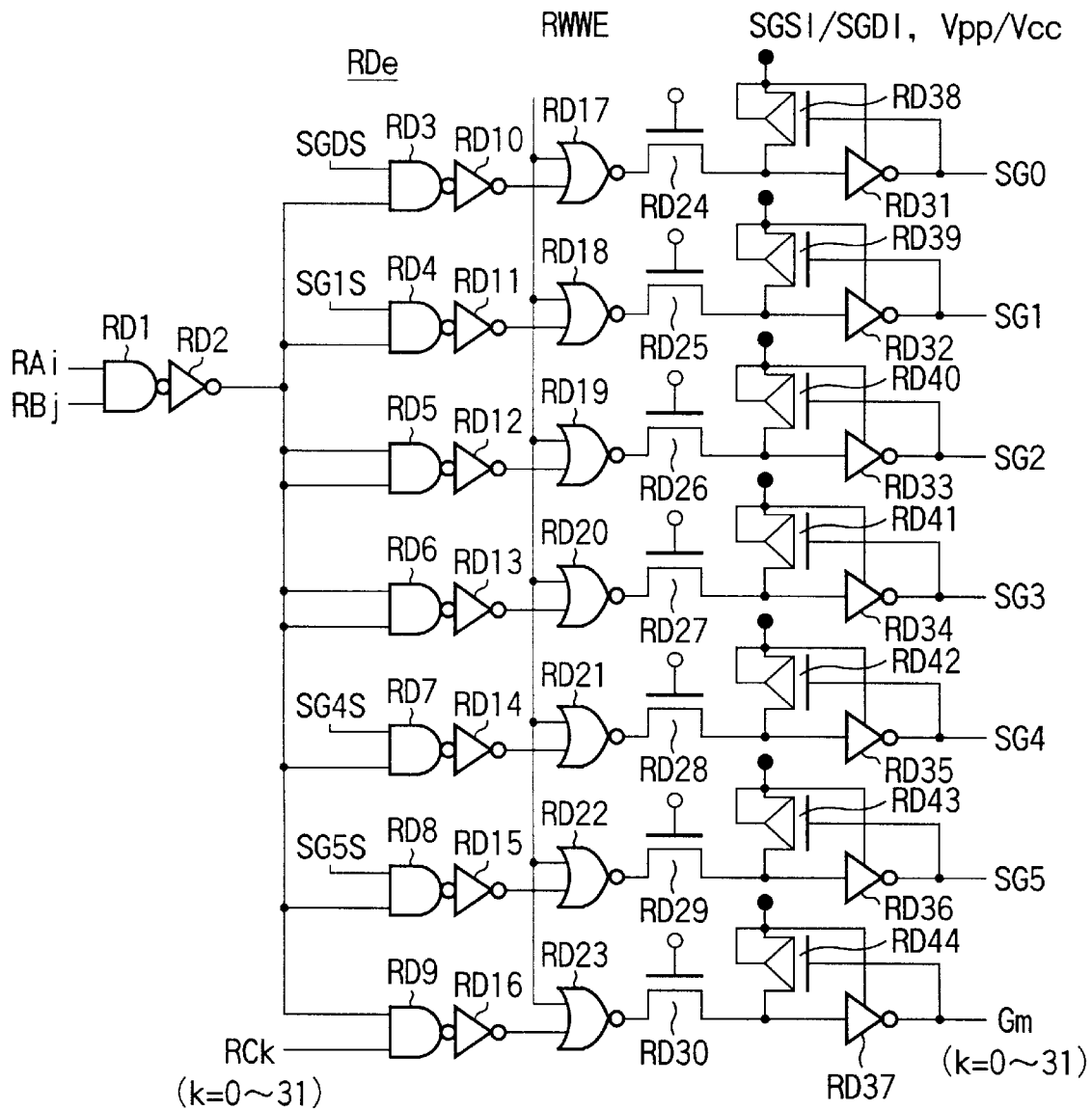
FIG. 32 is a circuit diagram showing a row decoder in detail.

Similarly, in the column decoder 32 in FIG. 32, the address signal supplied from the address pad AP2 is received through the address buffer having an arrangement similar to the one shown in FIG. 21 to generate the column decoded signal Hi (i=0 to 31) shown in FIG. 4.

Figure 19:
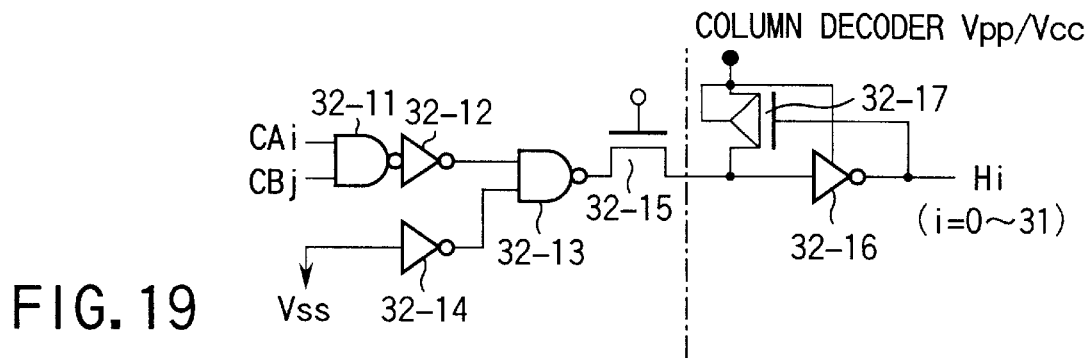
FIG. 19 is a circuit diagram showing a circuit for generating a column line control signal Hi.

The column decoded signal Hi (i=0 to 31) is generated by the decoder circuit shown in FIG. 19. Referring to FIG. 19, a NAND circuit 32-11 receives the signals CAi (i=0 to 3) and CBj (j=0 to 7) formed by the decoder circuit in FIG. 20 on the basis of the address signals A2S, A2SB, . . . , A6S, and A6SB, the signal RWWE generated by the circuit shown in FIG. 22, and the like.

The output from the NAND circuit 32-11 is inverted by an NAND circuit 32-12 and supplied as one input to a NAND circuit 32-13. The power supply voltage VSS is applied as the other input to the NAND circuit 32-13 through an NAND circuit 32-14. The output from the NAND circuit 32-13 is supplied to an NAND circuit 32-16 through a transfer gate 32-15. This output is inverted and output as the column decoded signal Hi (i=0 to 31).

The output from an inverter circuit 32-16 is fed back to the gate of a PMOS transistor 32-17 to perform ON/OFF control on a column decoder VPP/VCC signal supplied to the input side of the inverter circuit 32-16 through the PMOS transistor 32-17.

Figure 20:
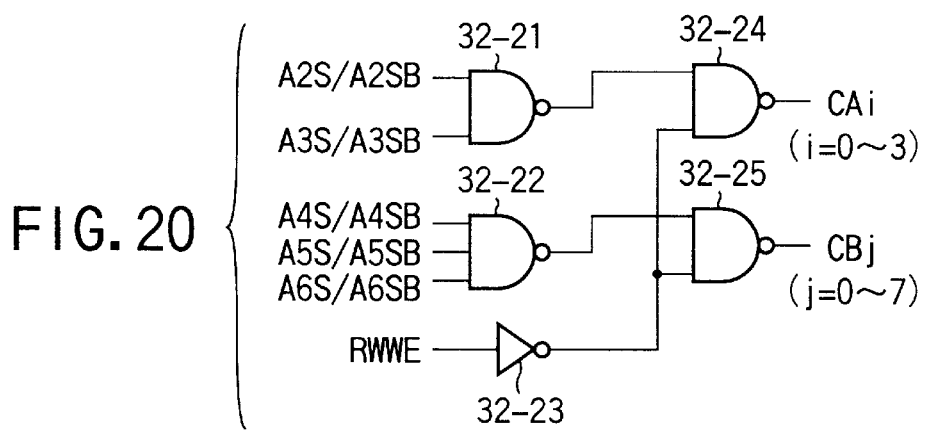
FIG. 20 is a circuit diagram showing a circuit for generating inputs in the circuit in FIG. 19.

Generation of the signals CAi and CBj will be described below with reference to FIG. 20. Address signals A2S/A2SB and A32/A3SB from the address buffers (not shown) are supplied as inputs to a 2-input NAND circuit 32-21. Likewise, address signals A4S/A4SB, A5S/A5SB, and A6S/A6SB are supplied as inputs to a 3-input NAND circuit 32-22. The signal RWWE generated by the circuit in FIG. 22 is supplied as one input to each of NAND circuits 32-24 and 32-25 through an inverter 32-23.

The output from the NAND circuit 32-21 is supplied as the other input to the NAND circuit 32-24. The output from the NAND circuit 32-22 is supplied as the other input to the NAND circuit 32-25. The outputs from these NAND circuits 32-24 and 32-25 are supplied as the signals CAi (i=0 to 3) and CBj (j=0 to 7) to the decoder circuit shown in FIG. 19.

A data write sequence and data erase sequence in the semiconductor memory device having the cell array arrangement of this embodiment will be described in detail below with reference to FIGS. 23, 24, 25, and 26.

FIG. 23 is a table showing changes in the output CL from the data write circuit 34 in various operation states and the states of input signals in the respective operation states.

Figure 24:
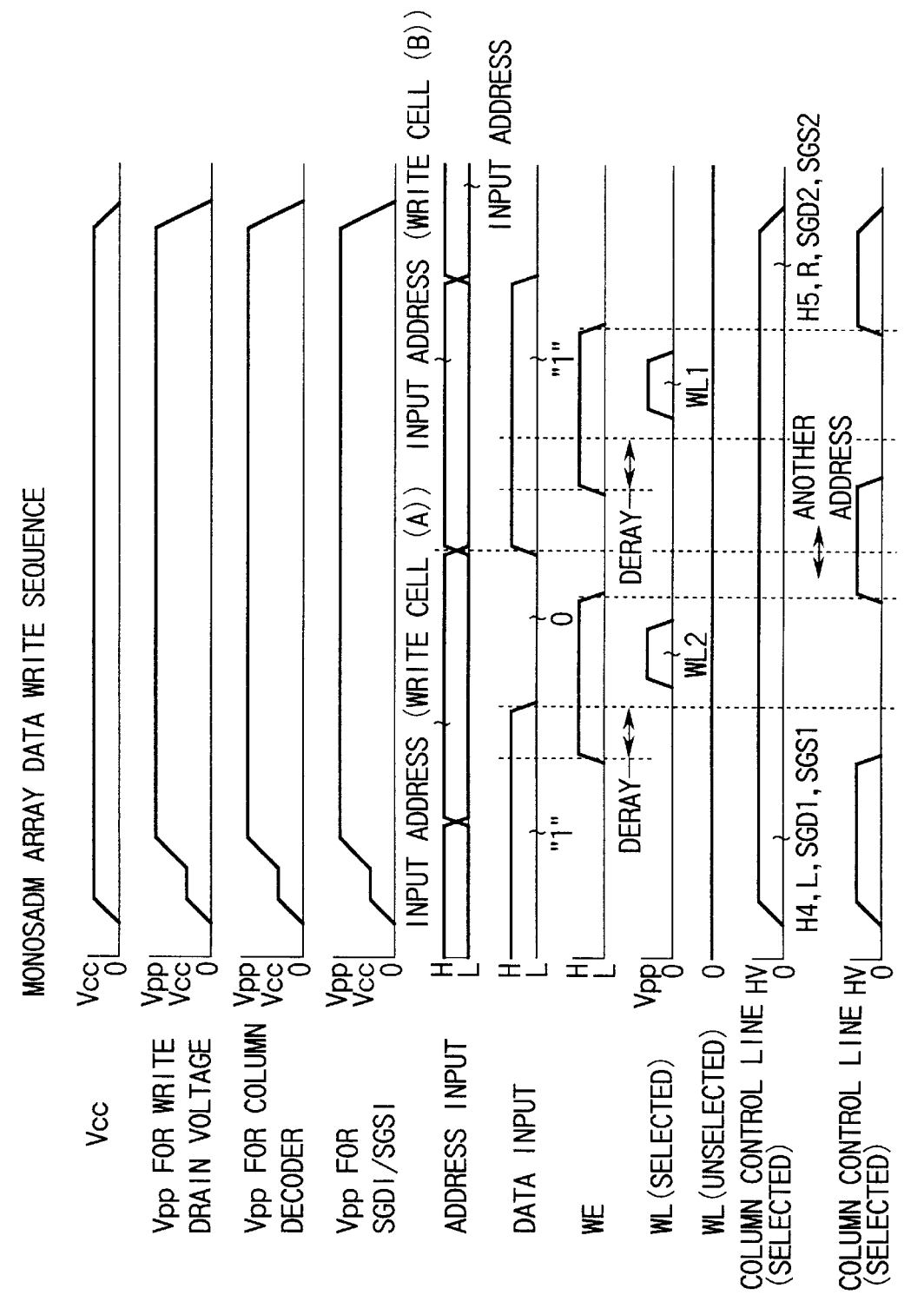
FIG. 24 is a timing chart showing a data write sequence in the system in FIG. 3.
Figure 25:
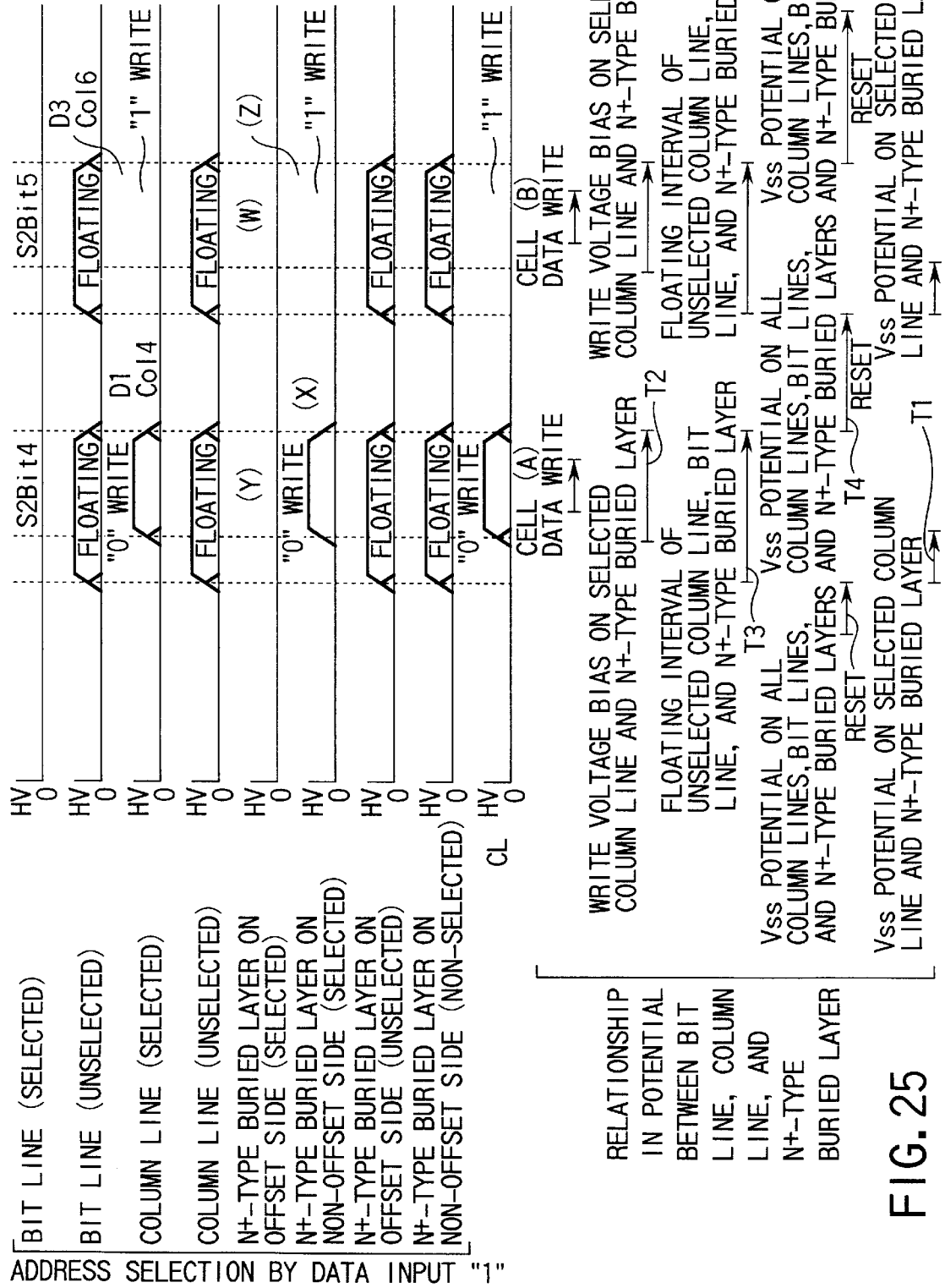
FIG. 25 is a timing chart showing a data write sequence in the system in FIG. 3.

Referring to FIGS. 24 and 25, in a data write, all of a power supply voltage Vcc, write drain voltage Vpp, voltage Vpp for the column decoder 32, and voltage Vpp for SGDi/SGSi are in the "HIGH" state.

Referring to FIGS. 24 and 25, an input address for a write in the cell [A] in FIG. 9 is supplied. For example, in a "0" write, as shown in FIG. 23, the signal CL is set at high write voltage Vpp=Hv; the signal W/E to the pad 43, at "HIGH"; the signal I/O to the pad 36, "LOW"; and the signal R/W to the pad 44, "HIGH".

In a "0" write in the cell [A], as shown in FIG. 25, the column line, bit line, and non-offset $n^+$-type buried region selected in an interval T1 are set at the potential Vss first, and then the selected offset column line, selected non-offset buried region, and word line are biased at the write potential in an interval T2.

In an interval T3 corresponding to both the intervals T1 and T2, all the remaining unselected column lines, bit lines, and $n^+$-type buried regions are set in the floating state.

Finally, in a reset interval T4, all the column lines, bit lines, and buried regions are set at the potential Vss again to reset the overall cell array. Since the signal W/E signal is always set at LOW level to reset the bit and column lines before a data write in this manner, the write conditions remain the same regardless of whether the previous written data is "1" or "0".

In a "1" write, as shown in FIG. 23, the signal CL is set at the low write voltage Vss; the signal W/E to the pad 43, at "HIGH"; the signal I/O to the pad 36, at "HIGH"; and the signal R/W to the pad 44, at "HIGH".

Referring to FIGS. 24 and 25, when the write in the cell [A] is complete, an address for a write in the next cell [B] in FIG. 9 is input after the above reset interval T4, and a "1" or "0" write is performed in the same manner as described above.

A "0" data erase method will be described lastly with reference to FIG. 26. In this "0" data erase operation, the electrons e2 stored in the nitride film 20n in FIG. 2 are removed. As this method, a method of extracting the electrons e2 toward the substrate 11 side or method of extracting the electrons toward the word line 22 side can be used.

Figure 26:
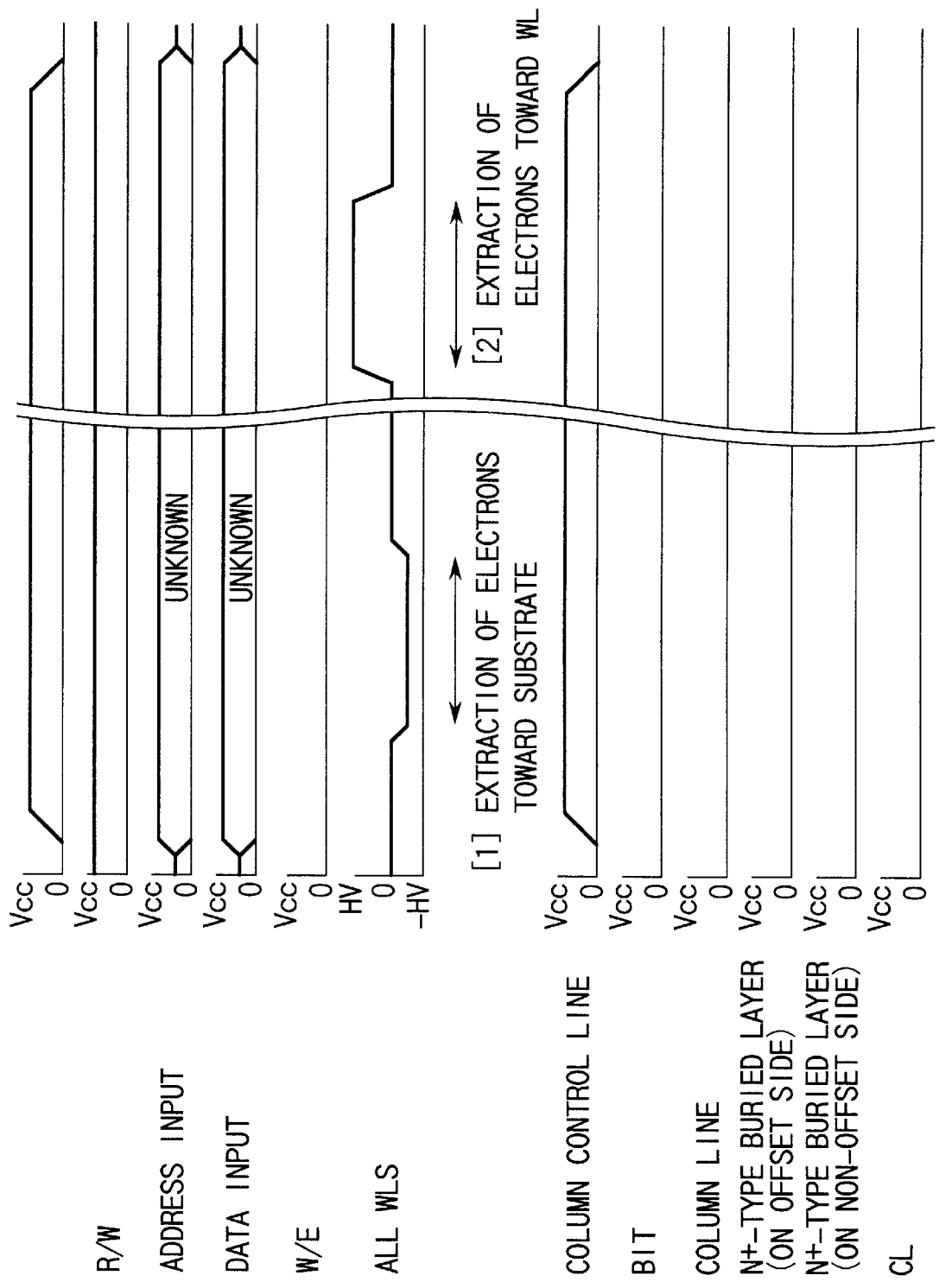
FIG. 26 is a timing chart showing a data erase sequence in the system in FIG. 3.

The method indicated by "[1]" on the left side of FIG. 26 is the method of extracting the electrons e2 toward the substrate 11 side. In this method, a high voltage is applied to all the word lines WL in the negative direction, while all the offset buried regions 12n, 12n+1, 12n+2, . . . , all the non-offset buried regions 13n−1, 13n, 13n+1, . . . and the signal CL are set at zero potential Vss, and the voltage Vcc is applied to only the column control line.

The method indicated by "[2]" in FIG. 26 is the method of extracting the electrons e2 toward the word line WL side. The conditions in this method are the same as those in the method of extracting the electrons e2 toward the substrate 11 side except that a high voltage is applied to all the word lines WL in the positive direction.

As described in detail above, according to this embodiment, buried regions with offset side walls provided thereto and buried regions with non-offset side walls provided thereon are alternately arranged on the semiconductor substrate along the word line. Of the buried regions, only a buried region with an offset side wall provided thereto and a buried region with non-offset side wall provided thereon of a selected memory cell transistor are applied with predetermined potentials, while all the remaining buried regions of the unselected memory cell transistors are set in a floating state. Accordingly, it is possible to make the data read/write circuit be simple in structure and to prevent effectively the data from being erroneously read or written from/to the unselected memory cells adjacent to the selected memory cell.

The above-mentioned embodiment is arranged to prevent the data from being read from or written into the unselected memory cells adjacent to the selected memory cell by using a write/read circuit of a simple structure. The present invention may be applied to another embodiment which can prevent the erroneous read or write operation from/to the unselected memory cells more effectively.

This embodiment will be described below with reference to FIGS. 27 to 33. According to the embodiment described below, in a cell array including a selected memory cell, a predetermined bias voltage is applied to the memory cells other than the selected memory cell to prevent a write or read error in any unselected memory cells.

Figure 27:
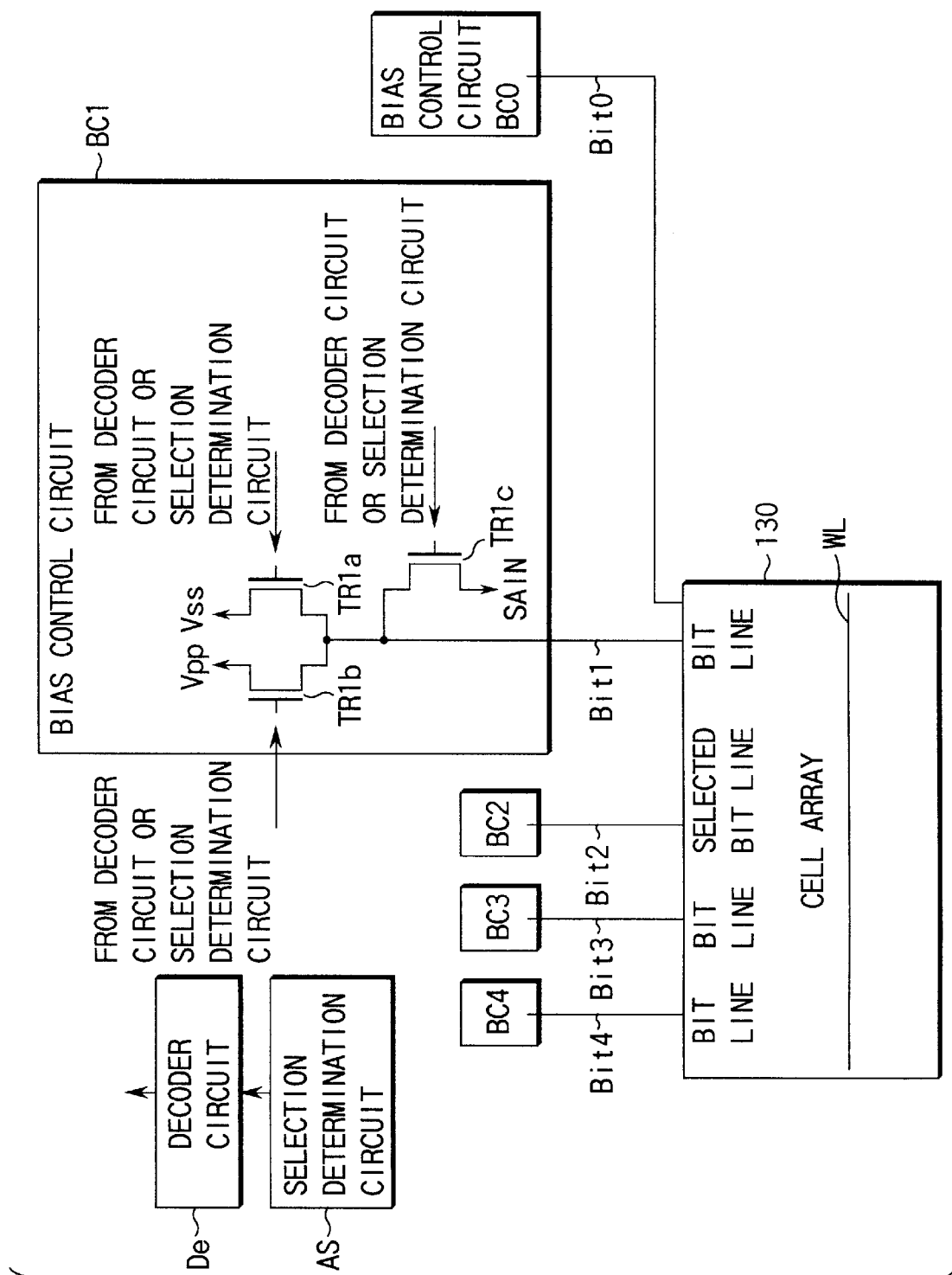
FIG. 27 is a block diagram showing another embodiment of the present invention.

The principle of an arrangement in which bias circuits are connected to the respective bit lines of a cell array made up of MONOS cells according to this embodiment will be described first with reference to FIG. 27. Referring to FIG. 27, bias control circuits BC0, BC1, BC2, BC3, and BC4 are respectively connected to all (only five in this case) bit lines Bit0, Bit1, Bit2, Bit3, and Bit4 of a cell array 130.

For example, a bit line selection circuit formed from a parallel circuit of first ands second switch transistors TR1a and TR1b is connected to the bias control circuit BC1 connected to the bit line Bit1. One terminal and the other terminal of the transistor TR1a are respectively connected to the bit line Bit1 and a low voltage source Vss. One terminal and the other terminal of the transistor TR1b are respectively connected to the bit line Bit1 and a high voltage source Vpp.

A third switch transistor TR1c is connected between the bit line Bit1 and a sense circuit terminal SAIN connected to a sense amplifier (not shown).

The output signals from a decoder circuit De for column addresses and a selection determination circuit AS for adding/subtracting addresses to determine selection/nonselection of the bit lines of the memory cells included in the cell array connected to a word line WL are selectively supplied to the gate terminals of the transistors TR1a, TR1b, and TR1c.

All the remaining bias control circuits BC0, BC2, BC3, and BC4 have the same arrangement.

Figure 28:
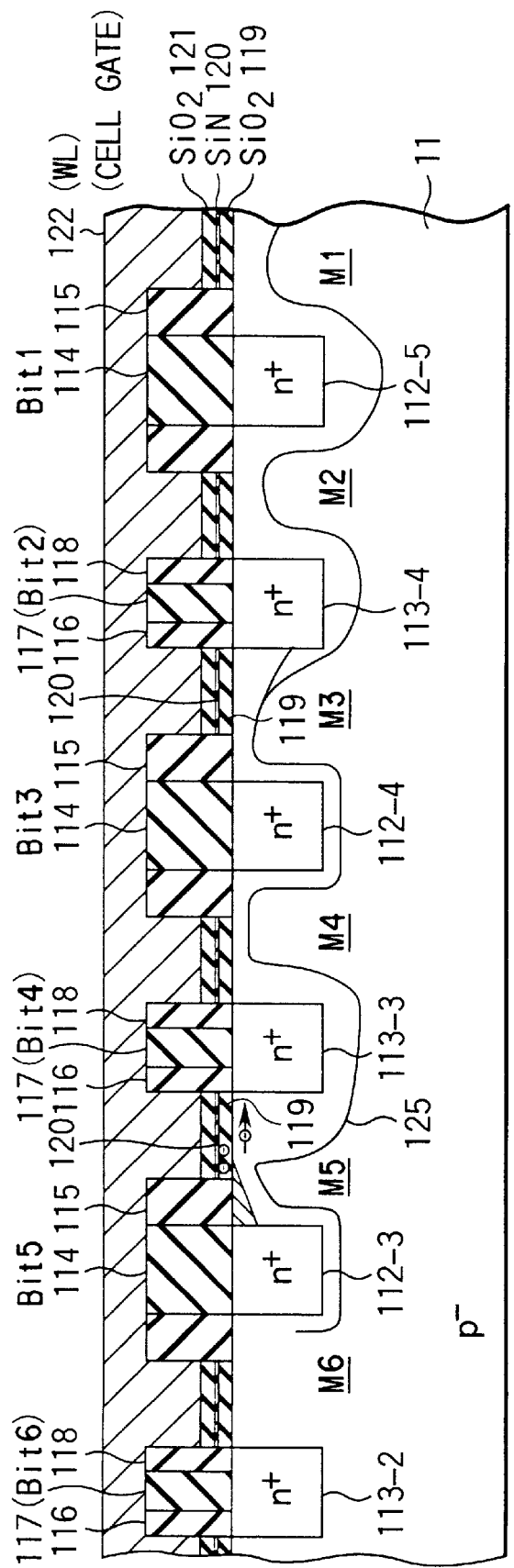
FIG. 28 is a sectional view showing the substrate arrangement of a memory cell array in FIG. 27.

FIG. 28 shows a cross-sectional structure of an array of a plurality of memory cell transistors in the row direction which are connected to the word line WL, for example, of a plurality of word lines crossing bit lines B0 to B4 in the cell array 130.

Referring to FIG. 28, a plurality of n$^+$-type first buried regions 112-3, 112-4, and 112-5 of the offset side wall type and a plurality of n$^+$-type second buried regions 113-2, 113-3, and 113-4 of the non-offset side wall type are alternately formed in the cell formation region of a p-type semiconductor substrate 111. The first buried regions 112-3, . . . are used as source regions in memory cell transistors. Each of the second buried regions 113-3, . . . formed at a predetermined distance from the first buried regions 112-3 is used as the drain regions of the adjacent two memory cell transistors, commonly with respect to each of the buried regions 112-3, . . . , respectively.

For example, an insulating film 114 is formed on the source region 112-3. The insulating film 114 is formed to have an edge flush with at least the edge portion of the source region 112-3 which faces the drain region 113-3. In this embodiment, the insulating film 114 is formed on the source region 112-3 to have the same size such that the film edge is flush with the front and rear edge portions of the source region.

A first side wall 115 made of an insulator is formed on that side surface of the insulating film 114 which faces the drain region 113-3 such that the bottom surface of the wall covers the upper surface of the semiconductor substrate 111.

A second side wall 116 is formed on the drain region 113-3 to have an edge flush with that edge portion of the drain region 113-3 which faces the source region 112-3 and a bottom surface covering the upper surface of the semiconductor substrate 111. This second side wall 116 is also made of an insulator. An insulating film 117 is further formed behind the second side wall 116 on the source region 113-3. In this embodiment, a side wall 118 is formed on the side surface of the insulating film 117 which is located on the rear side.

A first silicon oxide film 119 as an insulating film is formed on the upper surface portion of the semiconductor substrate 111 which is located between the first and second side walls 115 and 116. A nitride film 120 is formed on the first silicon oxide film 119. A second silicon oxide film 121 is further formed on the nitride film 120. Finally, a common gate electrode 122 made of polysilicon is formed on the side walls 115 and 116, insulating films 114 and 117, and second oxide film 121. This gate electrode 122 is used as the word line WL. In this manner, memory cell transistors M1, . . . M6 having the MONOS structure between the source regions 112-3, . . . and drain regions 113-3, . . . are formed.

Assume that the memory cell transistor M5 is selected in a data write or read, and that the bit line Bit4 is connected to the drain region 113-3 of the selected memory cell transistor M5. For example, in a data write, the first switch transistor TR1b in FIG. 27 is turned on by the output from the decoder circuit De. The potential Vpp obtained from the voltage generator 109 of FIG. 3 is applied to the bit line Bit4.

In the bias control circuits connected to the bit lines of the unselected bit lines Bit6, . . . of the bit lines Bit0, Bit1, Bit2, Bit3, . . . arranged to be adjacent to the left side of the source region 112-3 of the selected memory cell transistor M5, the first switch transistors corresponding to TR1a are turned on by the signals from the decoder circuit De or selection determination circuit AS, and a low potential from the low voltage source Vss (ground potential in this embodiment) is supplied to the respective bit lines.

When, for example, data "0" is to be written in the memory cell M5, the potentials of the substrate 111 and source region 112-3 are fixed to 0 V, and a "0" write voltage, e.g., 5 V, is applied to the drain region 113-3. In this state, a predetermined high write voltage, e.g., 7 V, is applied to the gate electrode (word line WL) 122.

As a consequence, as shown in FIG. 2, since the positive voltage below the drain region 113-3 is higher than that in the source region 112-3, a depletion layer 125 in the substrate 111 extends deeper at the drain region 113-3, as shown in FIG. 28.

In this state, hot electrons are generated from the distal end portion of a channel 126. Most electrons e1 of the generated hot electrons move toward the drain region 113-3 along the surface region of the substrate 111, but some electrons e2 pass through the insulating film 119 and are trapped in the nitride film 120 to be stored therein by the field effect of the gate electrode 122.

In this case, in the memory cell transistor M4 that is adjacent to the drain region 113-3 of the selected memory cell transistor M5, the source region 112-4 and drain region 113-4 are biased to Vpp that is the same write potential as that of the selected drain region 113-3 via the bit lines Bit3 and Bit2, the depletion layer 125 extends largely along the regions 112-4 and 113-4, as shown in FIG. 28. However, since these regions 112-4 and 113-4 are set at the same potentials, no current will flow between these regions. In the similar manner, on the left side of the selected memory cell transistor M5, all the regions of the unselected memory cell transistors are set at the Vss potential, and no current will flow among these regions.

This minimizes the current flowing from the selected memory cell transistor M5 to the adjacent unselected memory cell transistors M1, ..., thereby preventing a read error or a write error.

In the circuit shown in FIG. 27, when the address signal of a selected memory cell transistor is input, the input address is sequentially decremented or incremented one by one by the selection determination circuit AS. The bit line corresponding to the resultant −1 address is the bit line Bit6 connected to the drain region 113-2 of the memory cell M6 arranged on the left side of the selected memory cell transistor M5 in FIG. 28, for example. On the other hand, the bit line corresponding to the resultant +1 address is the bit line Bit3 connected to the source region 112-4 of the memory cell M4 in FIG. 28, for example.

Since the input address is incremented or decremented one by one in the selection determination circuit SA, all the bit lines connected to the drain regions arranged on the left side of the selected memory cell transistor M5 in FIG. 28 are applied with the ground potential Vss, whereas all the bit lines connected to the drain regions arranged on the right side of the selected memory cell transistor M5 are biased to the high potential Vpp by the decoder circuit De.

The arrangement and operation of a circuit for applying predetermined biases to the sources and drains of memory cell transistors before and after a selected memory cell transistor will be described in detail with reference to FIGS. 27, 29, and 30.

Figure 29:
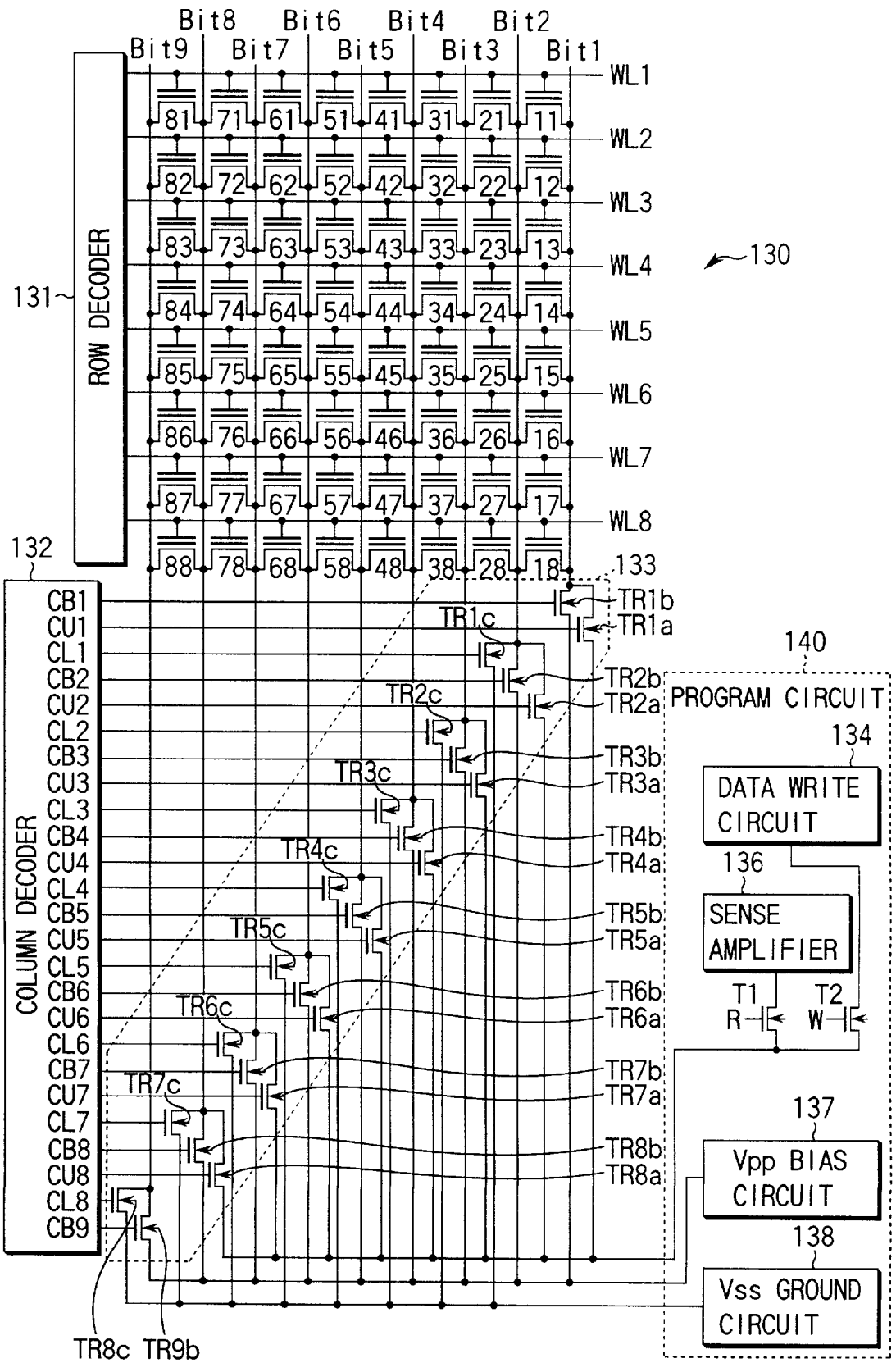
FIG. 29 is a circuit diagram showing the detailed arrangement of a bias control circuit in the embodiment shown in FIG. 27.

Referring to FIG. 29, for the sake of descriptive convenience, the cell array 130 has an 8×8 matrix of memory cells. The memory cells in the same row are respectively connected to corresponding word lines WL1 to WL8. The memory cells in the same column have drains connected to the same bit line, and sources connected to the same bit line. For example, the drains of memory cells M11 to M18 in the rightmost column are connected to the bit line Bit1, and the sources of the memory cells M11 to M18 are connected to the bit line Bit2. This bit line Bit2 is also connected to the drains of memory cells M21 to M28 in the adjacent column. The word lines WL1 to WL8 are connected to a row decoder 131. The bit lines Bit1 to Bit9 are connected to a program circuit 140 through a bit line selection circuit 133 controlled by the output signal from a column decoder 132.

The bit line selection circuit 133 is made up of a plurality of N-channel transistors. As described with reference to FIG. 27, one terminal of each of the transistors TR1a and TR1b is connected to the bit line Bit1, and one terminal of each of the transistors TR2a, TR2b, and TR1c is connected to the bit line Bit2. Likewise, one terminal of each of transistors TR3a to TR8a, TR3b to TR8b, and TR2c to TR7c is connected to a corresponding one of the bit lines Bit3 to Bit8, and one terminal of each of transistors TR9b and TR8c is connected to a bit line Bit9.

Control signals CU1 to CU8 output from the column decoder 132 are supplied to the gates of the transistors TR1a to TR8a. Control signals CB1 to CB9 output from the column decoder 132 are input to transistors TR1b to TR9b. Control signals CL1 to CL8 output from the column decoder 132 are input to transistors TR1c to TR9c. The program circuit 140 is comprised of a data write circuit 134, sense amplifier 136, bias circuit 137, and ground circuit 138. The data write circuit 134 is commonly connected to the transistors TR1a to TR8a of the bit line selection circuit 133 through an N-channel transistor T2 that is ON/OFF-controlled by an external signal W. The sense amplifier 136 is commonly connected to the same transistors through an N-channel transistor T1 that is ON/OFF-controlled by an external signal R.

The bias circuit 137 is commonly connected to the transistors TR1b and TR9b of the bit line selection circuit 133. The ground circuit 138 is commonly connected to the transistors TR1c to TR8c of the bit line selection circuit 133.

When data is to be written in a memory cell, a high voltage is applied to the bit line to which the drain region of the selected memory cell is connected, and a reference potential (e.g., a ground potential) is applied to the source region of the memory cell. When charges are to be injected into the nitride film of the selected memory cell, a high voltage is applied to the gate of the selected memory cell, i.e., the word line to which the selected memory cell is connected. As a consequence, a current flows in the channel of the memory cell, and the charges in the channel region are injected into the nitride film. When no charge is to be injected into the nitride film of the selected memory cell, i.e., the erased state is to be kept, the reference potential (e.g., the ground potential) is applied to the selected word line.

Before data is programmed (written) in the selected memory cell, the data in the memory array is erased. More specifically, before data is programmed, the memory cell array initializes all the memory cells to set a state in which one of binary data is stored. Thereafter, the other of the binary data is written to perform programming. In addition, before data are erased, charges are injected into the nitride films of all the memory cells from which the data are erased. That is, the memory cells from which the data are erased are set in the same initial state first, and then erased, thereby making the distribution of the threshold voltages of the memory cells after the erase operation almost uniform.

In injecting charges into memory cells before this erase operation, for example, a high voltage is applied to the bit line Bit1, the bit line Bit2 is set at the reference potential, and the word lines WL1 to WL8 are sequentially set at a high voltage, thereby sequentially injecting charges into the memory cells M11 to M18. Thereafter, a high voltage is applied to the bit line Bit2, and the bit line Bit3 is set at the reference potential. The word lines WL1 to WL8 are then sequentially set at a high voltage, thereby sequentially injecting charges into the memory cells M21 to M28. This operation is repeated from the bit line Bit3 to bit line Bit9 to inject charges into the nitride films of all the memory cells.

Alternatively, if all the bit lines are set at the reference potential, and all the word lines are set at the high potential, charges are injected from the channel regions into the nitride films owing to the hot electron effect. When injection of charges is complete in this manner, all the word lines are set at the reference potential, and the high voltage is applied to the bit lines. With this operation, the charges in the nitride films are attracted to the high voltage of the bit lines and discharged owing to the tunnel effect. After this discharge, a verify read is performed to check whether the discharge amount is sufficient. If the discharge amount is not sufficient, charges are further discharged, and removal of charges and a verify read are repeated until the voltage of each memory cell reaches an optimal threshold voltage. This verify read to check this erase state may be performed by applying a lower voltage to each word line, i.e., the gate of each memory cell, than in a normal read. It is then checked whether each memory cell is turned on by this low voltage. If each memory cell is turned on, since it indicates that the threshold voltage of the memory cell is lower than that applied to the word line, a desired threshold voltage to be set for the memory cell at the time of completion of an erase operation can be determined with reference to the voltage of this word line.

The bias circuit 137 outputs a high voltage that can erase data in data erase operation, and outputs a predetermined voltage in a data read. Each of the bit lines Bit1 to Bit8 is connected to one terminal of a corresponding one of the transistors TR1a to TR8a whose gates are respectively controlled by the signal CU1 to CU8. The other terminal of each of the transistors TR1a to TR8a is commonly connected to the sense amplifier 136 through the transistor T1 that is turned on in a data read, and is also commonly connected to the data write circuit 134 through the transistor T2 that is turned on in a data write. Each of the bit lines Bit2 to Bit 9 is connected one terminal of a corresponding one of the transistors TR1c to TR8c whose gates are respectively controlled by the signals CL1 to CL8. The other terminal of each of the transistors TR1c to TR8c is commonly connected to the ground circuit 138. The logic levels of the signals CU1 to CU8, CL1 to CL8, and CB1 to CB9 are determined by address inputs (not shown). For example, FIG. 30 shows the logic levels of the signals CU1 to CU8, CL1 to CL8, and CB1 to CB9 in data write, read, and erase operations.

Figure 30:
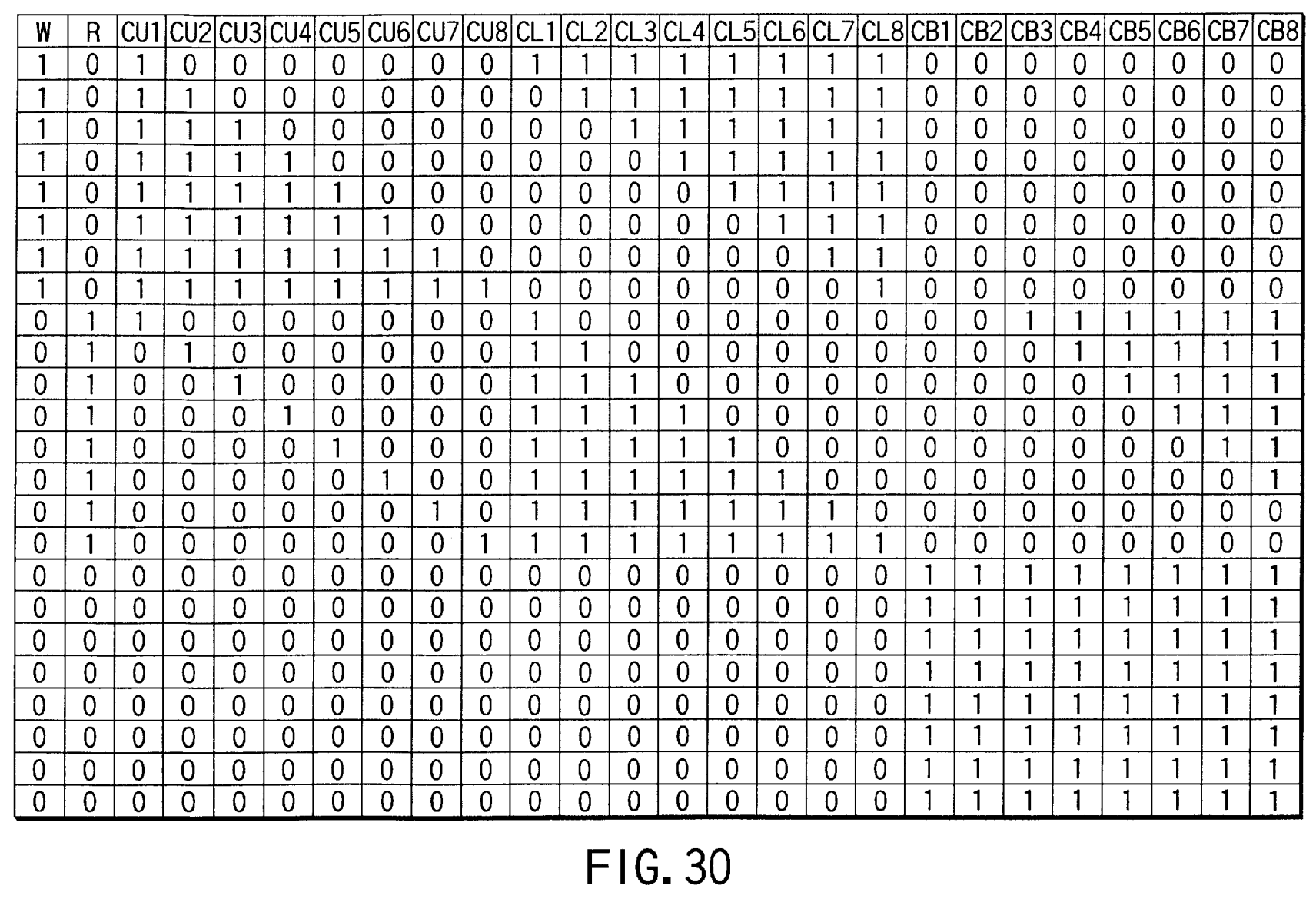

In the case shown in FIG. 30, in data erase operation in which both the signals W and R supplied to the transistors T1 and T2 are at logic "0", all the signals CU1 to CU8 and CL1 to CL8 are set at logic "0", and the transistors TR1a to TR8a and TR1c to TR8c, to which these signals are supplied, are turned off to set all the signals CB1 to CB8 to logic "1". All the transistors TR1b to TR9b, to which these signals are supplied, are turned on. As a consequence, the bit lines Bit1 to Bit9 are connected to the bias circuit 137, and a high voltage for erase operation is applied to each of these bit lines. In this erase operation, all the word lines WL1 to WL8 are set at logic "0" (e.g., ground potential).

In a verify read for checking the erase state, a power supply voltage VI applied to the row decoder 131 is set to a predetermined voltage. In the case shown in FIG. 30, once the transistors TR1a to TR9a are turned on, each transistor is kept on, and all the transistors TR1c to TR9c are set in the ON state in the initial state. In this state, the transistors are sequentially turned off.

A data write, i.e., data programming, will be described next with reference to FIG. 30. In data programming, the signal W is set at logic "1", and the signal R is set at logic "0". In this embodiment, programming is sequentially performed from the memory cell connected to the bit line Bit1 to the memory cell connected to the bit line Bit8. These memory cells are addressed by address inputs. The memory cells between the bit lines Bit1 and Bit2 are sequentially programmed in accordance with the contents of addresses. Then, the memory cells between the bit lines Bit2 and Bit3 are sequentially programmed. Subsequently, as the address signals are incremented, each array of memory cells to be programmed shifts to the next array of memory cells. Finally, the memory cells between the bit lines Bit8 and Bit9 are programmed.

When the first address is input, signal CU1="1", CU2 to CU8="0", and signals CL1 to CL8="1". For this reason, the bit lines Bit2 to Bit9 are connected to the ground circuit 138 through the transistors TR1c to TR8c whose gates receive the signals CL1 to CL8 set at "1", and the ground potential is applied to each bit line. The bit line Bit1 is connected to the data write circuit 134 through the transistor TR1a whose gate receives the "1" signal CU1 and the transistor T2 connected to the transistor TR1a and having a gate to which the signal W is supplied, as shown in FIG. 29. A high voltage is applied from the data write circuit 134 to the bit line Bit1. If the selected word line is set at a high voltage, a current flows from the bit line Bit1 to the bit line Bit2 through the memory cell connected to the word line. As a consequence, charges are injected into the nitride film of the memory cell to write data therein.

If the selected word line is kept at the same potential as that of an unselected word line, since no current flows in the selected memory cell, the erase state is maintained, and no data write is performed. When data programming for the memory cells between the bit lines Bit1 and Bit2 is complete, the address changes, and the memory cells between the bit lines Bit2 and Bit3 are programmed. As shown in FIG. 30, the corresponding signals are set as follows: CU1=CU2="1", CU3 to CU8="0", CL1="0", and CL2 to CL8="1". As a consequence, a high voltage is applied to the bit lines Bit1 and Bit2, and the bit lines Bit3 to Bit9 are set at the ground potential. If the selected word line is set at the high voltage, a current flows through the memory located between the bit lines Bit2 and Bit3 and having the gate to which the high voltage is applied, and charges are injected into the nitride film of this memory cell. Even if the high voltage is applied to the memory cells between the bit lines Bit1 and Bit2, since both the bit lines Bit1 and Bit2 are set at the high voltage, no current flows in the memory cells between these bit lines, and no threshold change occurs.

Reading of data from a memory cell programmed according to the above procedure will be described next. In a data read, the signal W is set at logic "0", and the signal R is set at "1". When a first address is input, one of the memory cells M11 to M18 between the bit lines Bit1 and Bit2 is selected. At this time, as shown in FIG. 30, since the signals CU1 and CL1 are set at logic "1", the transistors TR1a and TR1c to which the signals CU1 and CL1 are supplied are turned on, the bit line Bit1 is connected to the sense amplifier 136 through the transistor TR1a having the gate to which the signal CL1 is supplied and the transistor T2 that is turned on upon reception of the "1" signal R.

The bit line Bit2 is connected to the ground circuit 138 through the transistor TR1c having the gate to which the signal CL1 is supplied, and the ground potential is applied to the bit line Bit2. When the word line WL1 is set at logic "1", the memory cell M11 is selected. Meanwhile, the signals CB1 and CB2 are set at logic "0", and the signals CB3 to CB9 are set at logic "1". The unselected bit lines Bit3 to Bit9 are connected to the bias circuit 137 through the transistors TR3b to TR9b having the gates to which these signals CB3 to CB9 are supplied, and a predetermined voltage is applied to each unselected bit line.

The case wherein the memory cell M11 is selected will be described in further detail. As described above, the ground potential is applied to the bit line Bit2. That is, one terminal of the memory cell M11 which is connected to the bit line Bit2 is connected to the ground potential. In addition, the bit line Bit1, i.e., the other terminal of the memory cell M11, is connected to the sense amplifier 136. Logic "0" or "1" is stored in the memory cell depending on the magnitude of the threshold voltage. More specifically, in data programming, for example, the threshold voltage of the memory cell M1 having the nitride film 120 in FIG. 28 into which charges are injected rises, whereas the threshold voltage of each of the remaining memory cells into which no charge is injected in data programming and which is kept in the erase state is low. If the threshold voltage is high, the word line is set at logic "1". Even if a memory cell is selected, the selected memory cell is not turned on. If the threshold voltage is low, a selected memory cell is turned on.

The memory cells, of the memory cells between the bit lines Bit1 and Bit2, which are connected to the word lines WL2 to WL8 are off because the word lines WL2 to WL8 are set at logic "0" and in the unselected state. When the threshold voltage of the memory cell M1 is high, even if the word line WL1 is at logic "1", the memory cell M11 is turned off. The bit line Bit1 is therefore charged by the load transistor of the sense amplifier 136. This charged state is detected by the sense amplifier 136, and the stored data in the memory cell M11 is determined as, for example, logic "1". When the threshold voltage of the memory cell M11 is low, since the memory M11 is turned on, the bit line Bit1 is discharged toward the ground potential through the memory cell M11 and bit line Bit2. This discharged state is detected by the sense amplifier 136, and the stored data in the memory cell M11 is determined as, for example, logic "0".

When the memory cell M21 is to be selected, the bit line Bit2 is connected to the sense amplifier 136, and the bit line Bit3 is connected to the ground potential. When, therefore, the threshold voltage of the memory cell M21 is high, the bit line Bit2 is electrically disconnected from the bit line Bit3. As a consequence, the bit line Bit2 is charged by the load transistor of the sense amplifier 136. This charged state is detected by the sense amplifier 136. When the threshold voltage of the memory cell M21 is low, the bit line Bit2 is discharged toward the ground circuit 138 through the memory cell M21 and the bit line Bit3, and this discharged state is detected by the sense amplifier 136.

In the nonvolatile semiconductor memory having the above arrangement, when a word line is set at logic "1" and the threshold voltage is low, even memory cells from which no data is to be read out are turned on. If, for example, the memory cell M41 is selected, and the threshold voltage of the memory cell M41 is high, the memory cell M41 is turned off. If, however, the threshold voltage of the memory cell M31 adjacent to the memory cell M41 is low, the memory cell M31 is turned on. When, for example, the threshold voltages of the memory cell M31 in FIG. 29 and all the memory cells M21 and M11 connected to the word line WL1 disposed on the right side of the memory cell M31 are low, the bit line Bit4 is connected to all the bit lines on the right side of the bit line Bit4 through these memory cells.

Assume that these bit lines are set at the ground potential. In this case, when the bit line Bit4 is charged by the load transistor of the sense amplifier 136, all the bit lines on the right side of the bit line Bit4 are charged through the memory cells. No data can be read out from the memory cell M41 until these bit lines are charged. This decreases the data read speed. To prevent this, the unselected bit lines are charged to a predetermined potential by the bias circuit 137, as described above.

A circuit according to another embodiment of the present invention which is based on the principle shown in FIG. 27 will be described below with reference to FIGS. 31 to 39.

Figure 31:
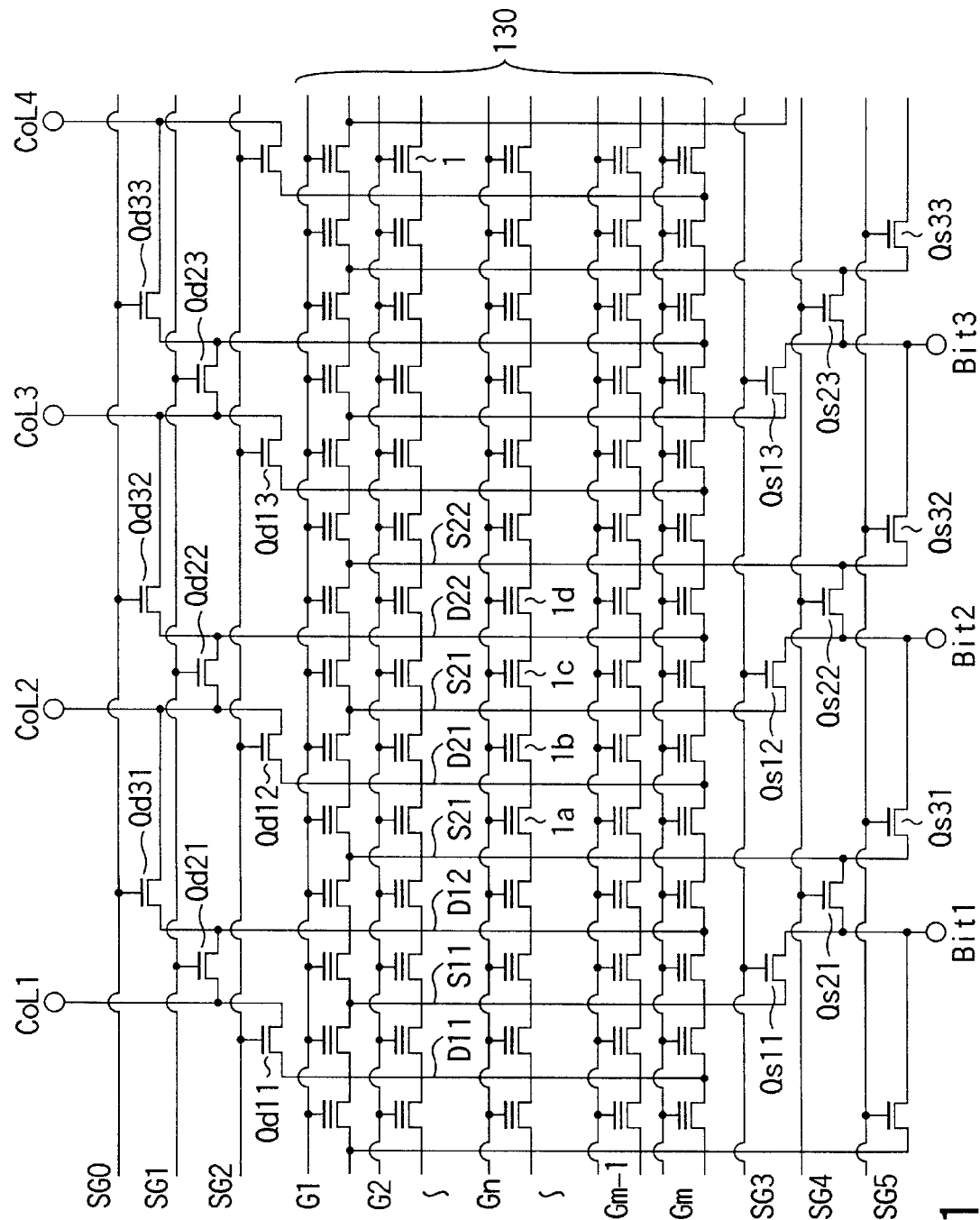
FIG. 31 is a circuit diagram showing a memory cell arrangement in this embodiment in detail.

FIG. 31 shows the detailed arrangement of a cell array 130 in FIG. 27, bit lines Bit1 to Bit3 and column line CoL1 to CoL3 connected around the cell array 130, and a selection circuit that is controlled by selection signals SG0 to SG5 to selectively connect these lines to source lines S11, S12, S21, and S22, drain lines D11, D12, D21, and D22, and the like in the cell array 130.

The selection circuit includes a transistors Qd11, Qd12, Qd13, Qd21, Qd22, Qd23, Qd31, Qd32, and Qd33 for connecting the column lines CoL1 CoL2, CoL3, and CoL4 to the drain lines D11, D12, D21, and D22 connected to the drain regions of the respective memory cells in accordance with the signals SG0, SG1, and SG2, and transistors Qs11, Qs12, Qs13, Qs21, Qs22, Qs23, Qs31, Qs32, and Qs33 for selectively connecting the bit lines Bit1, Bit2, and Bit3 to the source lines S11, S12, S21, and S22 connected to the source regions of the respective memory cells in accordance with the signals SG3, SG4, and SG5.

The gates of a plurality of memory cells connected in series in the row direction are commonly controlled by a plurality of word line selection signals G1, . . . , Gn, . . . , Gm−1, and Gm. The operation of four memory cells 1a, 1b, 1c, and 1d controlled by the word line selection signal Gn will be described below.

The control signals shown in FIG. 31 are generated by a decoder circuit De in FIG. 27 on the basis of supplied address signals.

FIG. 32 shows a row decoder circuit RDe included in the decoder circuit De and having an arrangement similar to that shown in FIG. 15. Referring to FIG. 32, the row decoder circuit RDe includes a NAND circuit RD-1 for receiving signals RAi (i=0 to 3) and RBj (j=0 to 7) generated and supplied by the decoder circuit shown in FIG. 16A on the basis of address signals A7S, A7SB, . . . , A11S, and A11SB. The output from the NAND circuit RD-1 is supplied as one input to each of seven NAND circuits RD-3 to RD-9 through an inverter RD-2. The NAND between this input and each of signals SG0S, SG1S, SG4S, SG5S, and RCk(k=0 to 31) which is supplied as the other input to each of the above NAND circuits is obtained. However, each of the NAND circuits RD5 and RD6 commonly receives the output from the inverter RD2 as the other input, and hence the output from each of the NAND circuits is always "0" regardless of the output from the inverter RD2.

The signals RCk (k=0 to 31) are obtained by decoding address signals A12S, A12SB, . . . , A16S, and A16SB using the decoder circuit shown in FIG. 16B.

Each of the logic outputs obtained from the NAND circuits RD-3 to RD-9 is supplied as one input to a corresponding one of NOR circuits RD-17 to RD-23 through a corresponding one of inverters RD-10 to RD-16. A signal RWWE from the buffer circuit shown in FIG. 22 is supplied as the other input to each of the NOR circuits RD-17 to RD-23.

The outputs from the NOR circuits RD-17 to RD-23 are inverted by inverters RD-31 to RD-37 through transfer gates RD-24 to RD-30 and output as decoded outputs SG0, SG1, SG2, SG3, SG4, SG5, and Gmk (k=0 to 31). Note that signals SGSI/SGDI and VPP/VCC are supplied to the input sides of the inverters RD-31 to RD-37 through PMOS transistors RD-38 to RD-44 only when the decoded outputs SG0 to SG5, and Gmk (k=0 to 31) are at "L", respectively.

Figures 33, 34:
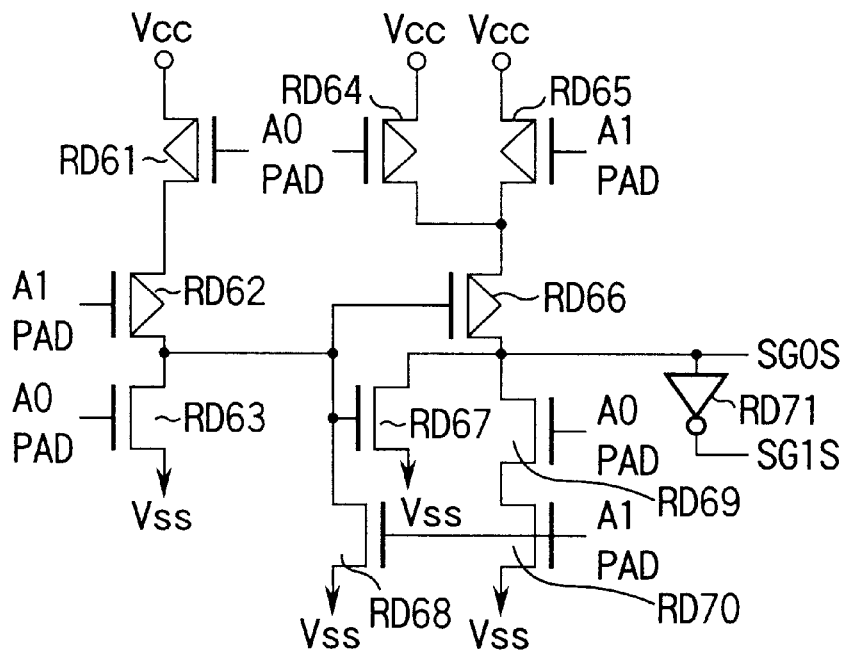
FIG. 33 is a circuit diagram showing a circuit for generating inputs to the decoder in FIG. 32.
FIG. 34 is a view showing input logic values in FIG. 33.

The signals SG0S and SG1S to be supplied to the NAND circuits RD-3 and RD-4 in FIG. 32 are formed by the decoder circuit shown in FIG. 33. Referring to FIG. 33, these signals SG1S and SG1S are formed from address signals A0 and A1. This decoder circuit has the logic matrix shown in FIG. 34. Since signals SG4S and SG5S to be supplied to the NAND circuits RD7 and RD8 of the row decoder circuit RDe in FIG. 32 are formed by an address buffer like the one shown in FIG. 21 from the address signal A1.

Referring to FIG. 33, two PMOS transistors RD-61 and RD-62 and one NMOS transistor RD-63 are connected in series between power supply voltage terminals VCC and VSS. The address signal A0 is supplied to the gates of the transistors RD-61 and RD-63, and the address signal A1 is supplied to the gate of the transistor RD-62.

Two PMOS transistors RD-64 and RD-65 are connected in parallel with the VCC power supply terminal. This parallel circuit is connected to the VSS terminal through a PMOS transistor RD-66 and NMOS transistor RD-67, and is also connected to the power supply terminal VSS through a PMOS transistor RD68 and NMOS transistors RD-69 and RD-70. The gate of the transistor RD-66 is connected to the gate of the transistor RD-67, together with the connection node between the transistors RD-62 and RD-63, and is also connected to the power supply terminal VSS through the transistor RD-68. The gates of the transistors RD-68 and RD-70 are connected to each other.

With this arrangement, the signal SG0S is output from the connection node between the transistors RD-66, RD-67, and RD-69, and the signal SG1S is also output from the connection node through an inverter RD-71.

Figure 35:
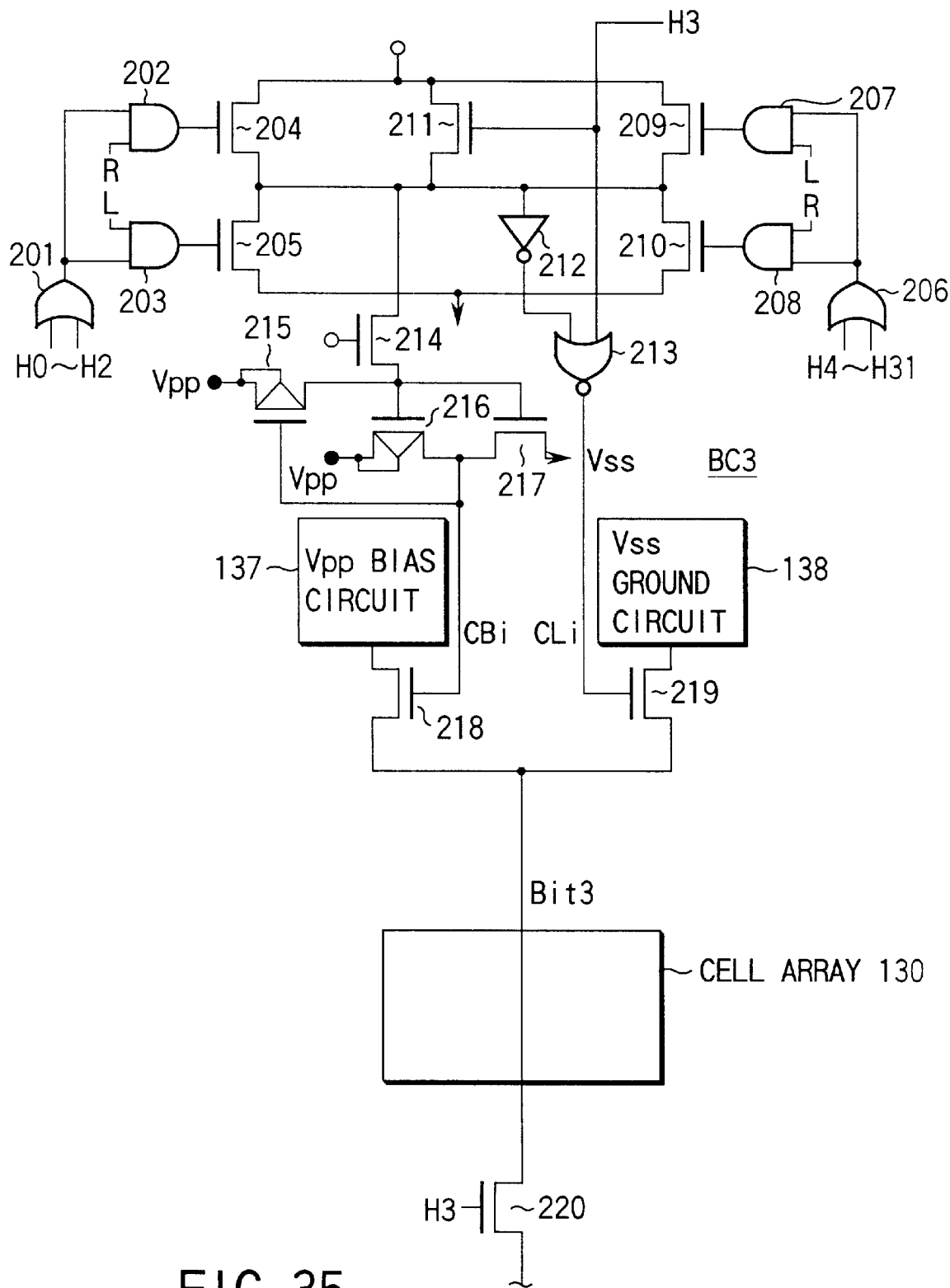
FIG. 35 is a circuit diagram showing an example of the bias control circuit in FIG. 27.
Figure 36:
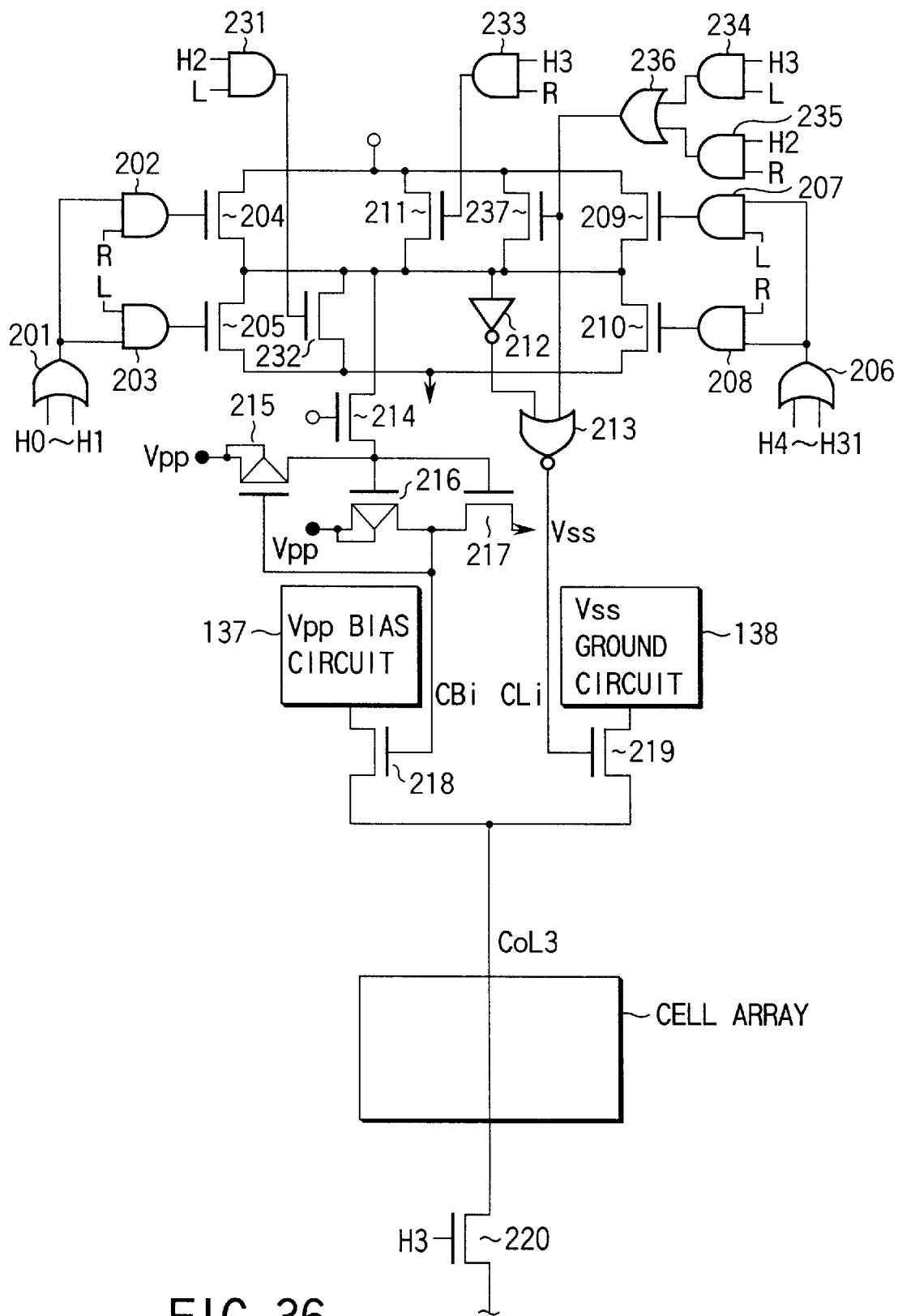
FIG. 36 is a circuit diagram showing another example of the bias control circuit in FIG. 27.

Each of FIGS. 35 and 36 shows an example of a bias control circuit for selectively connecting the Vpp bias circuit 137 and VSS ground circuit 138 in FIG. 29 to the bit line Bit3 and column line CoL3 connected to the cell array 130 in FIG. 31 on the basis of the column decoded signals H0 to H31 formed in the same manner as in FIG. 4.

FIG. 35 shows an example of the arrangement of a bias control circuit BC3 in FIG. 27 with respect to the bit line Bit3. The output from an OR circuit 201 to which the column decoded signals H0 to H2 are input is commonly supplied as one input to each of AND circuits 202 and 203, and each of right/left switching signals R and L is supplied as the other input. The outputs from the AND circuits 202 and 203 are respectively supplied to the gates of series-connected transistors 204 and 205.

In a symmetrical manner with respect to the circuit constituted by these circuit elements 201 to 205, the output from an OR circuit 206 to which the column decoded signals H4 to H31 are input is commonly supplied as one input to each of AND circuits 207 and 208, and each of the right/left switching signals R and L is supplied as the other input. The outputs from the AND circuits 207 and 208 are respectively supplied to the gates of series-connected transistors 209 and 210.

A transistor 211 is connected in parallel with each of the transistors 204 and 209. The column decoded signal H3 is supplied to the gate of the transistor 211 and is also supplied as one input to a NOR circuit 213. The other input is connected to the node between the node of the transistors 204 and 205 and the node of the transistors 209 and 210 through an inverter 212.

The above node is further connected to one terminal of a transistor 215 and the gates of transistors 216 and 217 through a transistor 214. The gate of the transistor 215 serves as a terminal for supplying a signal CBi, together with the node between the transistors 216 and 217, and is connected to the gate of a transistor 218. The output from the Vpp bias circuit 137 is supplied to the bit line Bit3 through the transistor 218. The other terminal of the bit line Bit3 is connected to a transistor 220 controlled by the column decoded signal H3.

The output from the NOR circuit 213 is supplied to the gate of a transistor 219, and the output from the Vss ground circuit 138 is selectively supplied to the bit line Bit3 through the transistor 219.

In the case of FIG. 35, the memory cell connected to the bit line Bit3 is selected at the time of data read operation, wherein the transistors 218 and 219 are turned off by the decoded signal H3. In this state, the transistor 220 is turned on and the data read from the cell array 130 is supplied to the sense amplifier (not shown) via the transistor 220 to perform the data read operation.

As to the memory cells other than the selected memory cell, the column decoded signal has a content other than H3, and the Vpp bias circuit 137 is connected to the corresponding buried region in accordance with the left and right selection signals. The left and right selection is based on the state whether the memory cell transistor formed between the left side buried region with respect to the buried region to which the selected bit line Bit3 is connected, or the memory cell transistor formed between the right side buried region with respect to the buried region to which the selected bit line Bit3 is connected. For example, when the right side transistor is selected, all the buried regions of the memory cells arranged on the left side of the selected memory cell are applied with Vss potentials from the Vss ground circuit 138 via thee transistor 219, while all the buried regions of the memory cells on the right side from the Vpp bias circuit 137 via the transistor 218. Note that the voltage supplied from the Vpp bias circuit 137 may be common to that of the voltage signal CL used in the previous embodiments.

In this manner, on the left side or right side of the bit line Bit3 connected to the buried region of the selected memory cell transistor, a voltage Vpp or Vss is selectively applied in accordance with a combination of the column decoded signals H0 to H31.

FIG. 36 shows an arrangement similar to that shown in FIG. 35. However, this arrangement differs from that in FIG. 35 in the following points. A transistor 232 is connected in parallel with each of the transistors 205 and 210, and the AND signal between the signals H2 and L is supplied from an AND circuit 231 to the gate of the transistor 232. The AND signal between the signals H3 and R is supplied from an AND circuit 233 to the gate of the transistor 211. The output obtained by ANDing the signals H3 and L and the signals H2 and R using AND circuits 234 and 235 is supplied as one input to the OR circuit 213, in place of the signal H3, through an OR circuit.

With the circuit shown in FIG. 36 as well, the voltage Vpp or Vss is selectively applied to the column line CoL3 in accordance with a combination of the column decoded signals H0 to H31.

As to the memory cells other than the selected memory cell, the column decoded signal has a content other than H3, and the Vpp bias circuit 137 is connected to the corresponding buried region in accordance with the left and right selection signals. The left and right selection is based on the state whether the memory cell transistor formed between the left side buried region with respect to the buried region to which the selected bit line Bit3 is connected, or the memory cell transistor formed between the right side buried region with respect to the buried region to which the selected bit line Bit3 is connected. For example, when the right side transistor is selected, all the buried regions of the memory cells arranged on the left side of the selected memory cell are applied with Vss potentials from the Vss ground circuit 138 via thee transistor 219, while all the buried regions of the memory cells on the right side from the Vpp bias circuit 137 via the transistor 218. Note that the voltage supplied from the Vpp bias circuit 137 may be common to that of the voltage signal CL used in the previous embodiments.

Similar circuits are arranged for the remaining bit and column lines, when these lines are selected.

FIGS. 37 and 38 show voltages being supplied to the respective selection gate lines, bit lines and column lines, when the data is read from or written into the particular memory cell transistors 1a, 1b, 1c and 1d in the memory cell array shown in FIG. 31.

As described in detail above, according to this embodiment, there is provided a semiconductor memory which can effectively prevent write and read errors in memory cell transistors other than memory cell transistors selected in a write and read by applying a predetermined bias to unselected memory cell transistors connected to the front and rear sides of a selected memory cell transistor without setting the sources and drains of the unselected memory cell transistors in a floating state.

The above embodiment has exemplified the case wherein binary data are written/read in/from the MONOS elements shown in FIGS. 1 and 2. However, each MONOS element has the property of being able to store/read multi-value data.

This embodiment will be described in detail below with reference to FIGS. 39A to 49.

In the memory cell Mn formed from the MONOS element in FIG. 2, as the voltage applied to the gate electrode 22 gradually increases, the channel 26 in the form of a wedge is formed in the surface region of the substrate 11 beneath the side wall 15. The distal end of this channel 26 extends downward from the side wall 15 and reaches the lower portion of the insulating film 19.

In this state, hot electrons are generated from the distal end portion of the channel 26. Most electrons e1 of the generated hot electrons move toward the drain region 13 along the surface region of the substrate 11, but some electrons e2 pass through the insulating film 19 and are trapped in the nitride film 20 to be stored therein by the field effect of the gate electrode 22. The amount of electrons e2 stored in the nitride film 20 increases as the strength of electric field of the gate electrode 22, i.e., the applied voltage, increases.

The relationship between the voltage applied to a gate electrode 22 and the amount of electrons stored in a nitride film 20 will be described below with reference to FIGS. 39A, 39B, 40A, and 40B.

Figure 39A:
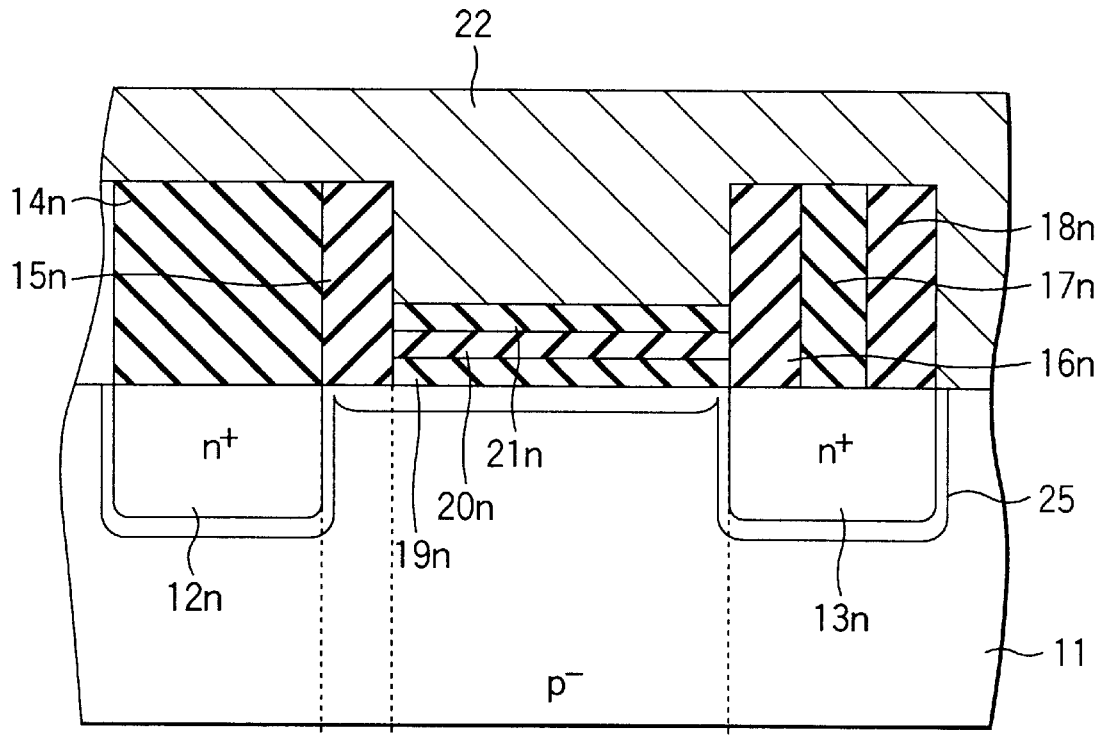
FIGS. 39A and 39B are views for explaining a "1" write in the cell structure in FIG. 2.

FIG. 39A shows the state of a depletion layer 25 in a substrate 11 when a voltage of 0 V is applied to the substrate 11, source region 12, and drain region 13, while a high voltage is applied to only the gate electrode 22. The depletion layer 25 is formed thin around the source region 12 and drain region 13 and is also formed thin in the surface region portion of the substrate 11 which is located between these regions. In this state, no channel is formed under a side wall 15, and hence no electron is stored in the nitride film 20. This indicates that a "1" write is performed.

Figure 39B:
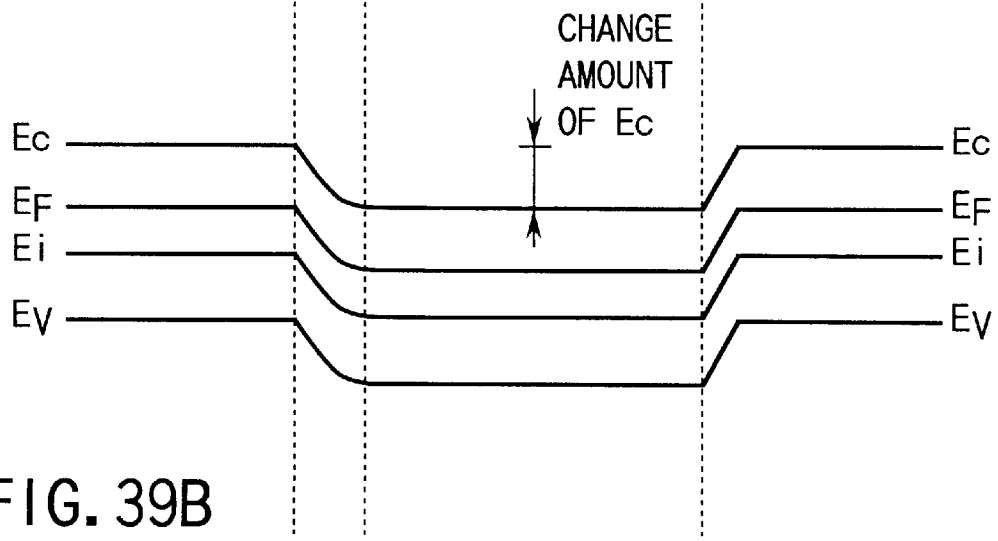

FIG. 39B shows the band gap structure of the substrate 11, source region 12, and drain region 13 in the structure shown in FIG. 39A. As is obvious from FIG. 39B, the energy band lowers by the voltage applied to the gate electrode 22. In this case, the change amount of energy level Ec corresponds to the gate voltage.

Figure 40A:
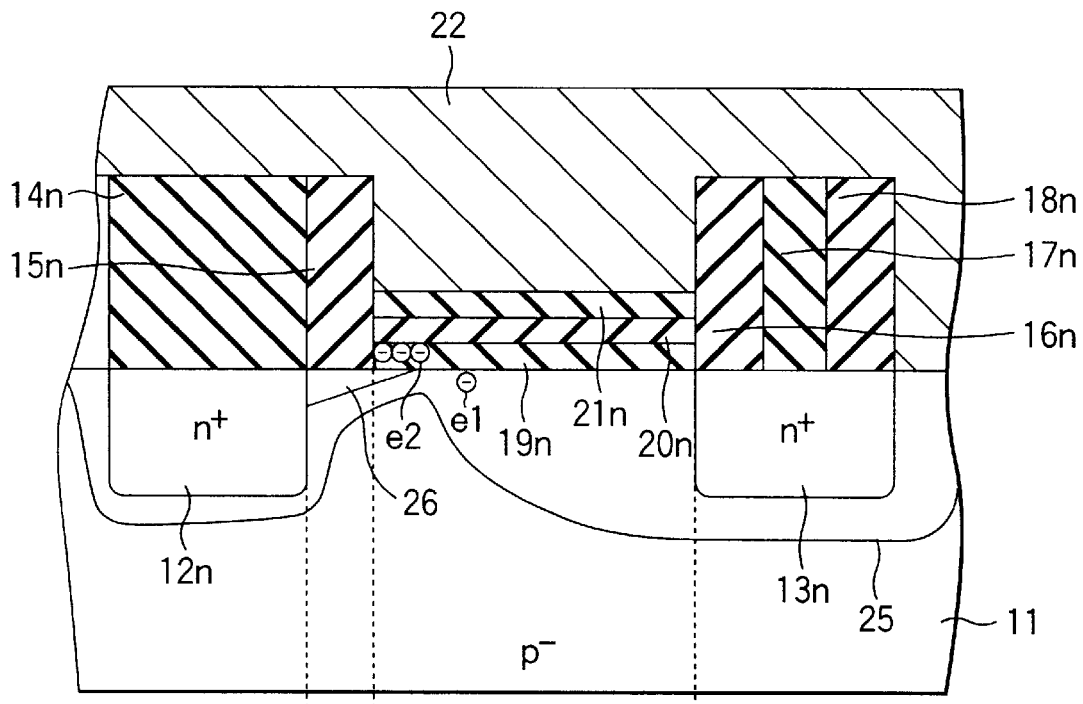
FIGS. 40A and 40B are views for explaining a "0" write in the cell structure in FIG. 2.
Figure 40B:
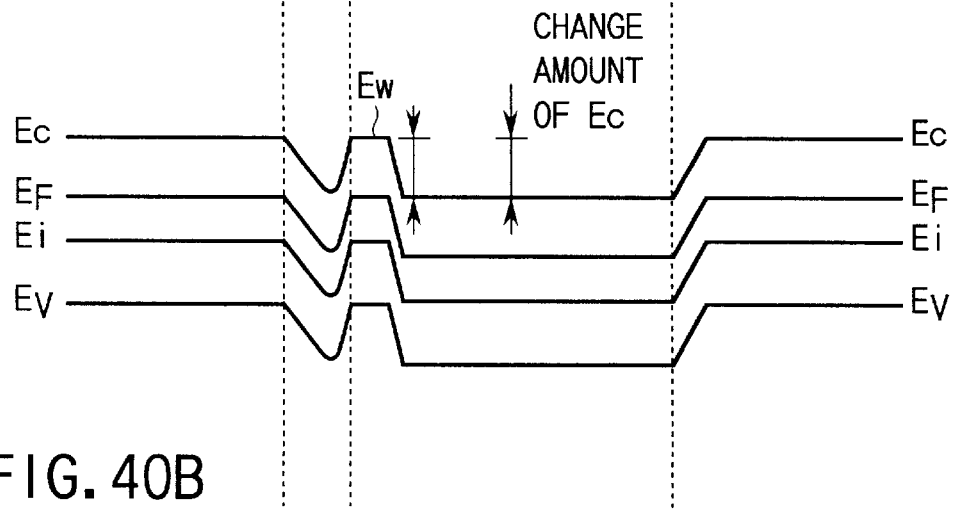

FIG. 40B shows a change in band gap upon application of a "0" write voltage to the drain region 13 while the band gap changes as shown in FIG. 39B. FIG. 40A shows the states of the depletion layer 25 and channel 26 when a write voltage is applied to the drain region 13 as in the case shown in FIG. 2. When electrons e2 from the channel 26 are stored in the nitride film 20, the electric field from the gate electrode 22 is canceled out by the electrons e2, and the band gap corresponding to the stored portion of the electrons e2 rises by Ew, as shown in FIG. 40B. At this time, the rise corresponds to the change amount of Ec.

Figure 41A:
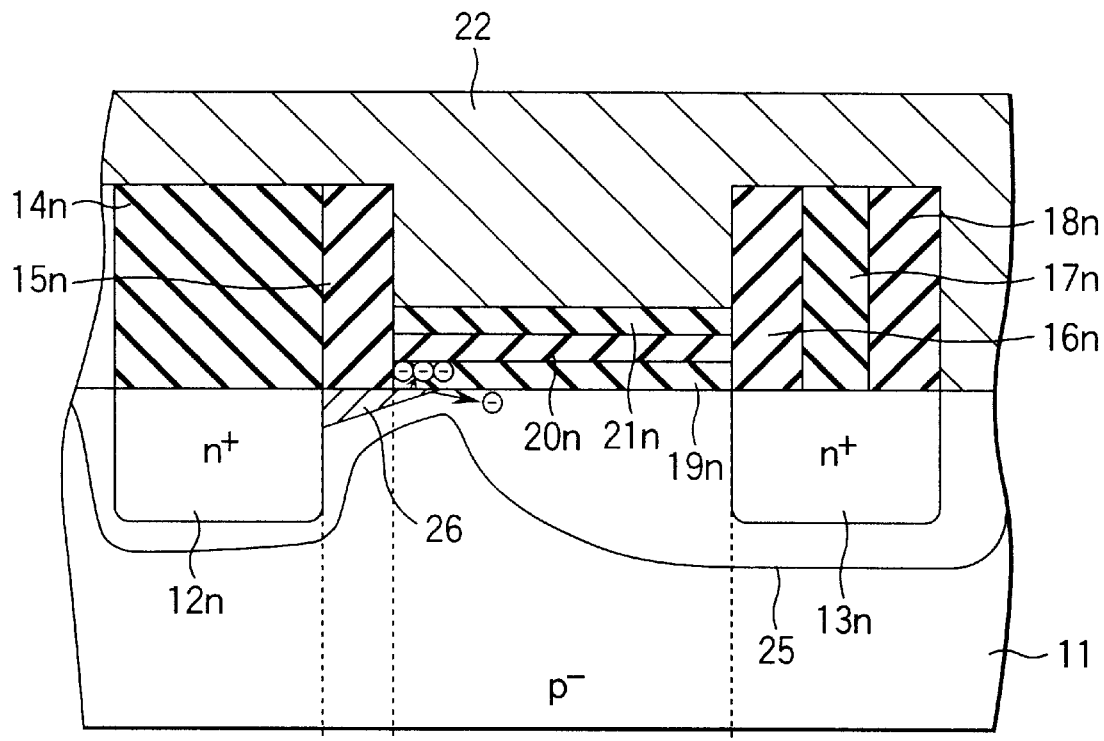
FIGS. 41A and 41B are views for explaining a first multi-value data write in the cell structure in FIG. 2.
Figure 41B:
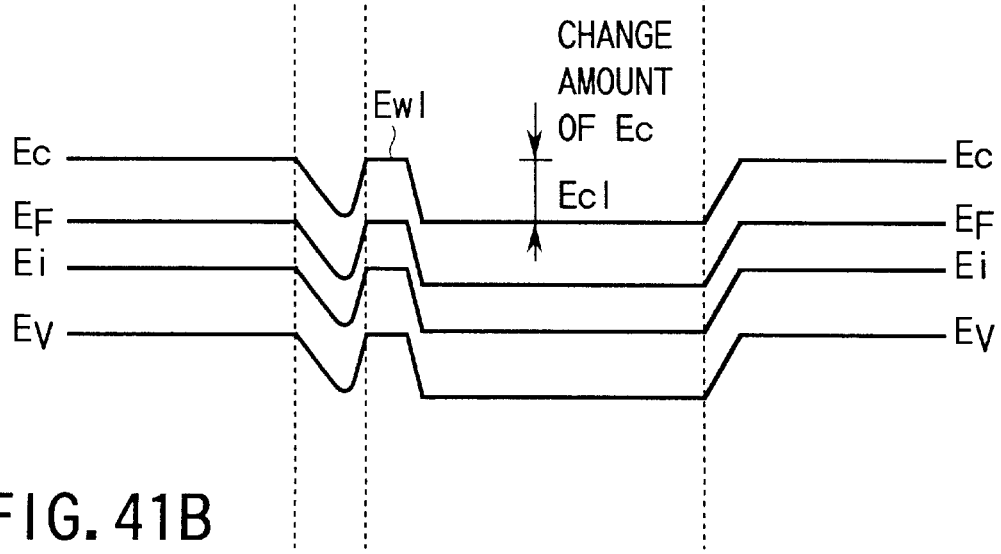
Figure 42A:
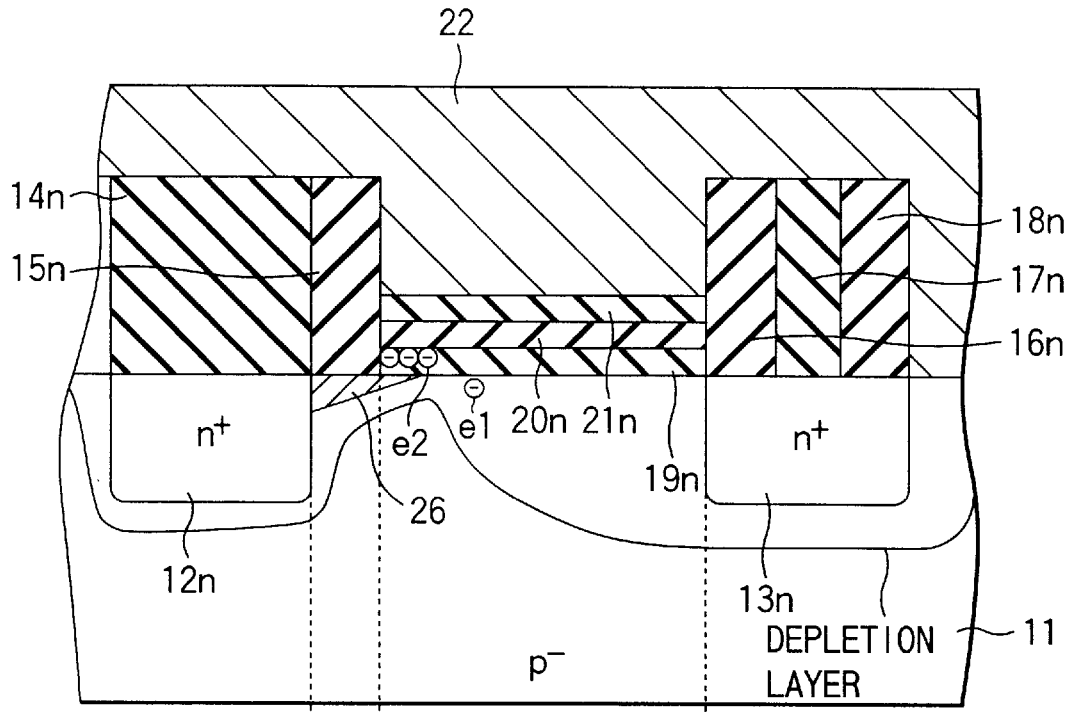
FIGS. 42A and 42B are views for explaining a second multi-value data write in the cell structure in FIG. 2.
Figure 42B:
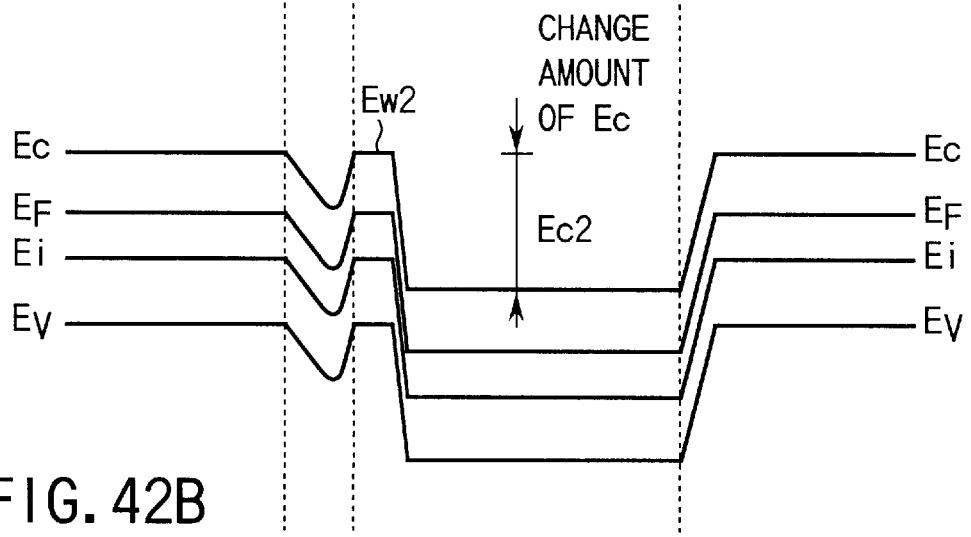

The change amount of Ec is determined in accordance with the value of the gate voltage applied to the gate electrode 22. If, for example, the change amount of Ec is Ec1 upon application of a voltage VG1 to the gate electrode 22 as shown in FIG. 41B, a change amount Ec2 of Ec with a change in gate voltage to VG2 becomes large, as shown in FIG. 42B.

If no write voltage is applied to the drain region 13, the band gap Ew does not increase. Owing to the storage of the electrons e2 in the nitride film 20, however, when the gate voltage VG1 is set, the change amount Ec1 of Ec is small, whereas when the gate voltage VG2 is set, the change amount Ec2 of Ec is large. As shown in FIG. 41B, therefore, when the change amount of Ec is Ec1, the amount of electrons e2 stored in the nitride film 20 corresponds to a rise in band gap Ew1. As shown in FIG. 42B, when the change amount of Ec is Ec2, the amount of electrons e2 stored in the nitride film 20 corresponds to a rise in band gap Ew2.

The overall arrangement and operation of a system including the semiconductor memory, which has the basic arrangement described above and in which the memory cell array is made up of a plurality of MONOS memory cells arranged in the form of matrix, and a data write and read are performed by using the memory cell array, will be described below with reference to FIGS. 43 to 49.

Figure 43:
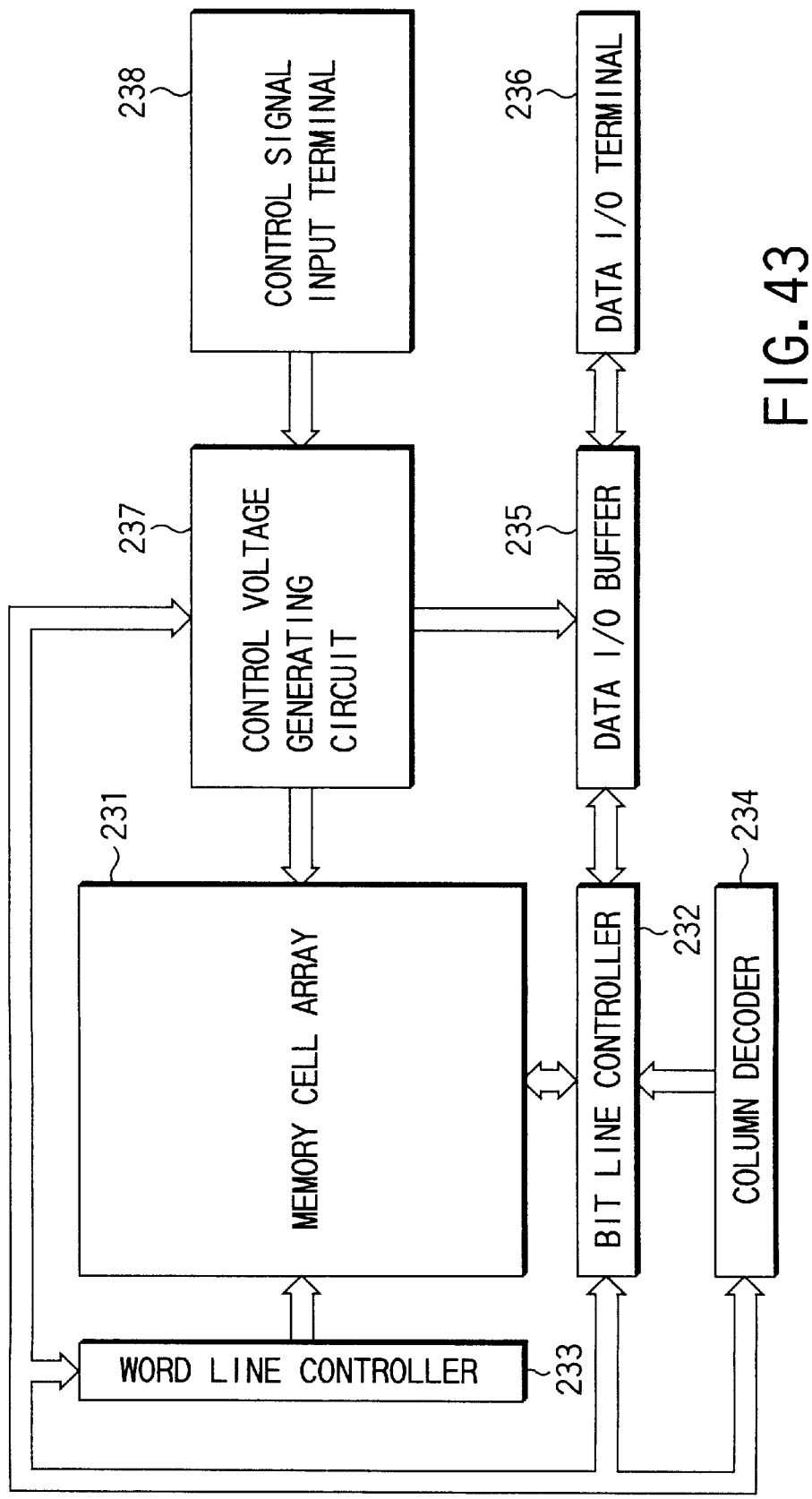
FIG. 43 is a block diagram showing an overall system including a semiconductor memory device according to still another embodiment of the present invention.
Figure 44:
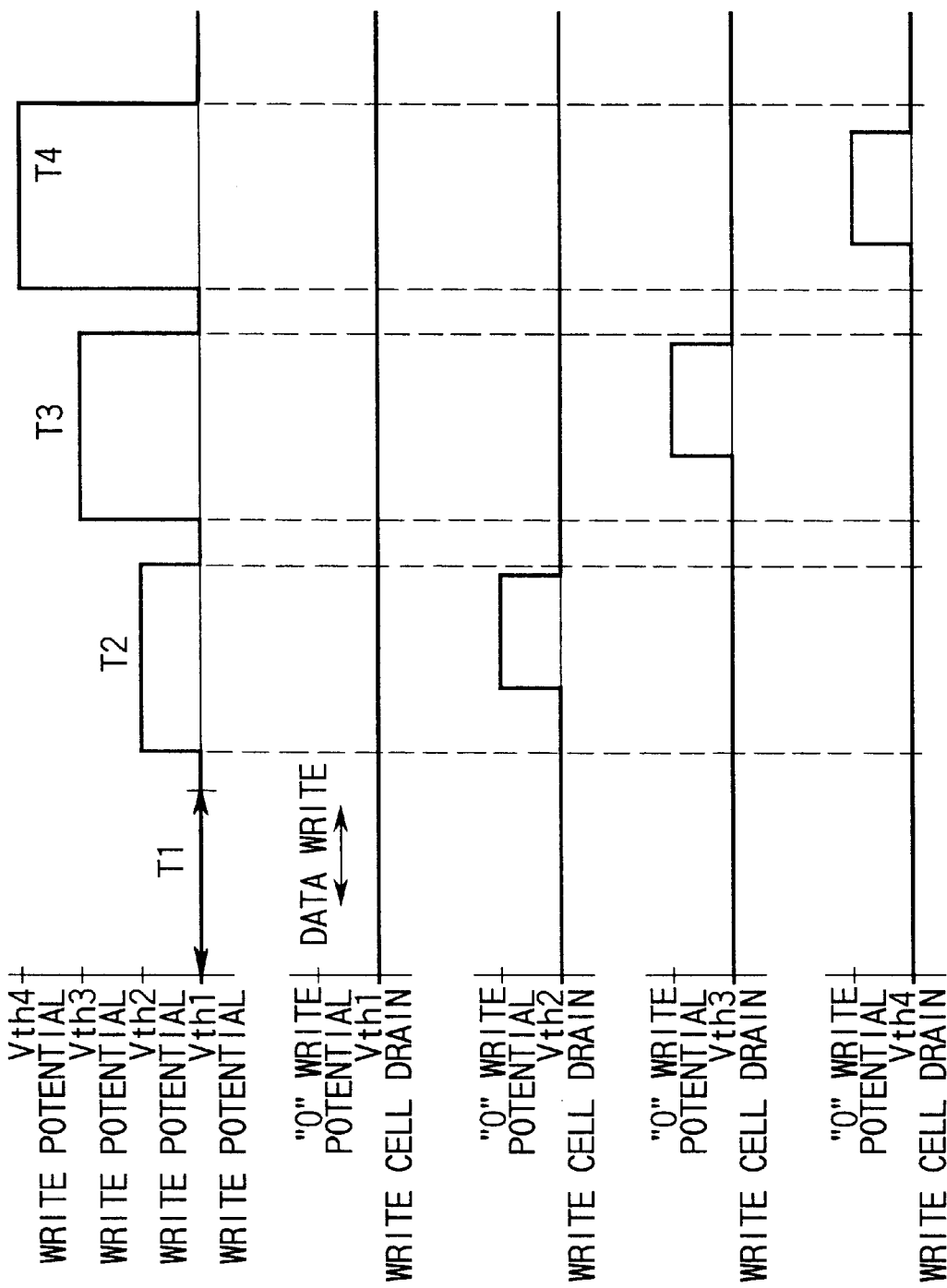
FIGS. 44A to 44E are timing charts showing a multi-value cell data write sequence.
Figure 45:
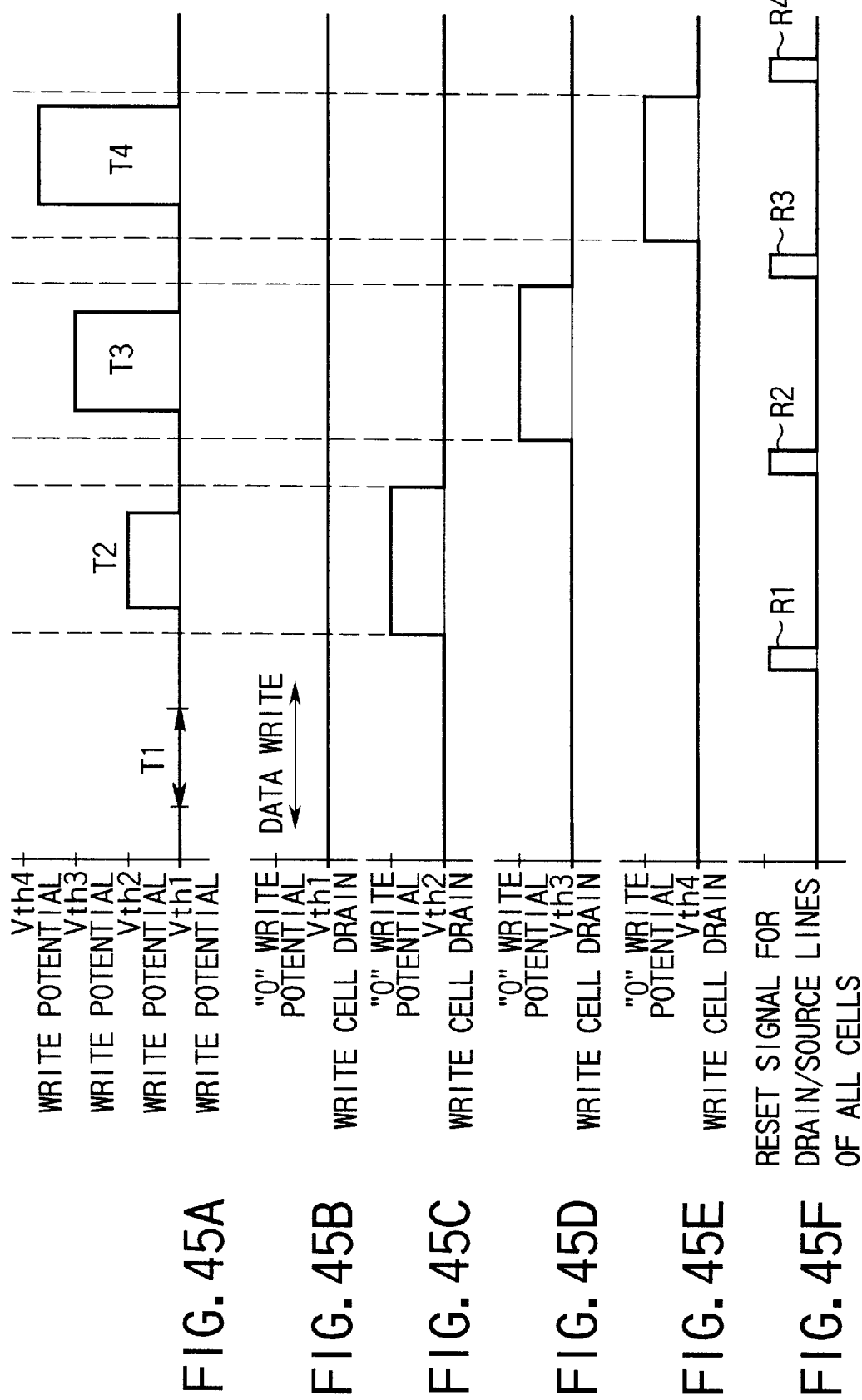
FIGS. 45A to 45F are timing charts showing another multi-value cell data write sequence.

Referring to FIG. 43, the potentials of the drain regions, i.e., the bit lines, of MONOS memory cells constituting a memory cell array 231 are controlled by a bit line controller 232, and the potentials of the gate electrodes, i.e., the word lines, of the memory cell array are controlled by a word line controller 233. The bit line controller 232 is controlled by output signals from a column decoder 234. The word line controller 233 and column decoder 234 operate upon reception of address signals (not shown).

The bit line controller 232 is connected to a data I/O terminal 236 through a data I/O buffer 235. Voltage signals are supplied from a control voltage generating circuit 237 to the gate electrodes of MONOS memory cells. The control voltage generating circuit 237 is connected to a control signal input terminal 238. A control voltage used to apply a voltage signal corresponding to a multi-value signal to be written to the gate electrode of each MONOS memory cell is obtained from the control voltage generating circuit 237, which will be described in detail later.

FIGS. 44A to 44E are timing charts showing an example of a multi-value data write sequence. FIG. 44A shows cell gate potentials used to write thresholds Vth1 to Vth4 in cells. In this case, the threshold Vth1 is written in an interval T1; the threshold Vth2, in an interval T2; the threshold Vth3, in an interval T3; and the threshold Vth4, in an interval T4.

FIGS. 44B to 44E respectively show the potentials to be applied to a drain region 13n in the intervals T1 to T4.

FIG. 44A shows a case wherein a zero potential is applied to the drain region 13n of the cell. In this case, as described with reference to FIGS. 39A and 39B, a "1" write is performed, and no electron is stored in the nitride film 20.

In the interval T2, as shown in FIG. 44A, the gate potential rises up to the potential at which the threshold Vth2 is written. At the same time, as shown in FIG. 44C, the pulsed drain potential is applied. This state has already been described with reference to FIGS. 41A and 41B.

In the interval T3, as shown in FIG. 44A, the gate potential further rises up to the potential at which the threshold Vth3 is written. At the same time, as shown in FIG. 44D, the pulsed drain potential is applied. This state has already been described with reference to FIGS. 42A and 42B.

In the interval T4, as shown in FIG. 44A, the gate potential further rises up to the potential at which the threshold Vth4 is written. At the same time, as shown in FIG. 44E, the pulsed drain potential is applied.

The gate potential that changes in this manner is generated by the control voltage generating circuit 237 in FIG. 43. In synchronism with this generation of the gate potentials, the output from the control voltage generating circuit 237 is supplied from the data I/O buffer 235 to the bit line controller 232 to supply the output from the bit line controller 232 as a write signal to the drain region.

FIG. 49 shows an example of a circuit diagram of the control voltage generating circuit 237. In FIG. 49, three voltage generators 109A, 109B and 109C are prepared. These generators 109A–109C may be composed of the circuit arrangement similar to that shown in FIGS. 10 to 14, respectively. For example, the first generator 109A is prepared to generate a voltage having a value corresponding to that used during the interval T2 shown in FIG. 44A, generator 109B to the interval T3 and generator 109C to T4.

As shown in FIG. 49, the voltages generated from the generators 109A–109C are respectively supplied to one input of voltage switching circuits 261, 262 and 263 included in a switching circuit 260, while the other inputs thereof are connected to the signals input 238. Pulsed drain potentials shown in FIGS. 44C to 44E are supplied to the signals input 238 during the intervals T2, T3 and T4, respectively. Accordingly, when the pulsed drain potential as shown in FIG. 44C is supplied to the signals input 238, the output voltage generated from the voltage generator 109A is obtained at the output terminal 264 as the write voltage of the control voltage generating circuit 237 shown in FIG. 43 during the interval corresponding to the pulsed drain potential of FIG. 44C.

In the similar manner, output voltages from the voltage generators 109B and 109C are sequentially obtained at the output terminal 264 in synchronism with the pulsed drain potentials of FIGS. 44D and 44E, respectively.

Assume that the voltage switching circuits 261–263 have output voltage holding functions, respectively, the write gate potentials obtained during the intervals T2–T4 may continue like a continuous stepped potential.

FIGS. 45A to 45F show another example of the multi value data write sequence. In FIG. 45A, the gate potential is supplied as a short pulse-like potential signal that rises for a predetermined short time period in each of the intervals T2 to T4. In this case, as shown in FIGS. 45B to 45E, the drain signals supplied to the drain region 13n are the same as those in FIGS. 44A to 44E.

FIG. 45F shows reset signals R1 to R4 to discharge the potentials at the source and drain regions of each cell after the intervals T1 to T4 as write intervals. These reset signals R1–R4 are also generated by the control voltage generating circuit 237 in FIG. 43 and supplied to the source and drain regions of each cell through the bit line controller 232. Since the source and drain regions of all the cells are grounded by a ground circuit (not shown) using these reset signals R1 to R4, these regions are reset and set at the ground potential.

Operation to be performed to read out multi-value signals written in the above manner will be described next with reference to FIGS. 46 to 48. As described above, the contents of multi-value data correspond to the amount of electrons e2 stored in the nitride film 20, as shown in FIGS. 41A, 41B, 42A, and 42B. When the data is read out from such a cell, a sense amplifier is used to detect the amount of current flowing between the source region 12 and drain region 13 under a specific condition upon adjustment of the gate voltage.

FIG. 46 shows the current characteristics of cell transistors in which the amounts of electrons e2 stored in the nitride films 20 differ from each other in a case wherein specific source and drain voltages are applied, while the gate voltage is changed, for example, from 0 V to 4 V or higher. FIG. 46 schematically shows a case wherein the threshold voltage rises 1 V at a time. When data are to be read out from cells in which a plurality of data are written, the output voltage obtained by changing the gate voltage is compared with a plurality of reference voltages to detect a specific gate voltage position where the output is generated, thereby reading out the multi-value data.

This multi-value data read will be further described below with reference to FIGS. 47 and 48. The outputs from cells in which multi-value data are recorded are extracted to the data I/O terminal 236 through the bit line controller 232 and data I/O buffer 235 in FIG. 43.

As described above, this bit line output has a current value proportional to the amount of electrons e2 stored in the nitride film 20, and a bit line voltage corresponding to this current value is obtained as a readout signal. This bit line voltage is applied to one input terminal of each of a plurality of (only three in this case) sense amplifiers 241, 242, and 243 in FIG. 47. Each of different reference voltages Rf1, Rf2, and Rf3 is applied to the other input terminal of a corresponding one of the sense amplifiers.

These reference voltages Rf1, Rf2, and Rf3 respectively have values for determining the thresholds Vth1 to Vth4 of the respective cells. When the bit line voltage is lower than Rf1, the voltage is "0", hence Vth1 is determined. When the bit line voltage is between Rf1 and Rf2, Vth2 is determined. When the voltage is between Rf2 and Rf3, Vth3 is determined. When the voltage is higher than Rf3, Vth4 is determined. In the above cases, each of outputs 51, 52, and 53 becomes "1".

FIG. 48 is a table showing this relationship, in which when each of the outputs 51, 52, and 53 is "0", a multi-value output "D1, D2" becomes "0, 0"; when the outputs are "100", "D1, D2" becomes "0, 1"; when the outputs are "110", "D1, D2" becomes "1, 0"; and when the outputs are "111", "D1, D2" becomes "1, 1".

In the above description, the quaternary cell data has been exemplified. However, since the storage amount of electrons e2 depends on the value of the gate voltage, the number of data can be increased, as needed. For example, octonary data can be handled by preparing eight different thresholds Vth like those shown in FIG. 48, and detecting changes in Vth as changes in bit line voltage.

As described in detail above, according to this embodiment, a semiconductor memory capable of recording multi-value data can be provided.

As has been described above, according to the present invention, the surface portion of a semiconductor substrate which is adjacent to a buried source region formed in the substrate is covered with an offset side wall to suppress expansion of a channel beneath the offset side wall, thereby providing a semiconductor memory which can prevent any write and read errors in unselected memory cell transistors adjacent to both sides of a selected memory cell transistor in either a write or read.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory having a nonvolatile memory cell array, comprising:
    a semiconductor substrate of a first conductivity type;
    a plurality of source regions of a second conductivity type which are formed in said semiconductor substrate at predetermined intervals;
    a plurality of drain regions of the second conductivity type which are connected to a bit line formed between two adjacent source regions;
    a first insulation side wall formed in an offset pattern on an edge of each of said source regions which faces said drain region such that a bottom surface of said first side wall covers a surface of said semiconductor substrate;
    a second insulation side wall formed to have a front edge flush with an edge of said drain region which faces said source region, with a bottom surface of said second side wall covering a surface of said source region;
    channel regions formed on surface regions of said semiconductor substrate which are located between said source regions and said drain regions;
    a first insulating film formed on a surface of each of said channel regions;
    a nitride film formed on said first insulating film;
    a second insulating film formed on said nitride film; and
    a gate electrode used as a word line which is commonly formed on said source region, said drain region, and said second insulating film.

2. A device according to claim 1, wherein said source and drain regions are formed as buried layers in the surface region of said semiconductor substrate.

3. A device according to claim 1, further comprising:
    write means for making said nitride film store an amount of charge corresponding to a gate voltage value applied to said gate electrode in a data write; and read means for reading out an output as data which corresponds to the amount of charge stored in said nitride film a data read.

4. A device according to claim 1, further comprising:

designation means for designating one of two drain regions formed before and after said source region in a data write/read; and means for executing data write/read operation between said source region and said drain region designated by said designation means.

5. A device according to claim 2, further comprising means for performing reset operation by forcibly setting potentials of all word lines, bit lines, and buried regions of said memory cell array to a Vss potential at the end of data write operation.

6. A device according to claim 1, further comprising means for extracting electrons stored in said nitride film in a data write toward one of said gate electrode and said semiconductor substrate.

7. A semiconductor memory comprising:

a memory cell array made up of a plurality of memory cell transistors arranged in the form of a matrix in row and column directions;

a plurality of word lines to which gates of a plurality of memory cell transistors arrayed in the row direction are commonly connected;

a plurality of bit lines to which sources and drains of a plurality of memory cell transistors arrayed on a column direction are commonly connected;

first and second switching elements respectively connected in parallel with said bit lines;

a first voltage source connected to said first switching element;

a second voltage source connected to said second switching element; and control means for turning on said first switching element connected to all unselected bit lines arrayed on a drain side of a memory cell transistor connected to a selected bit line, and turning on said second switching element connected to all unselected bit lines arrayed on a source side of the memory cell transistor connected to the selected bit line when data is to be written/read in/from said memory cell transistor.

8. A device according to claim 7, wherein said control means comprises a column decoder for selecting a bit line in accordance with an address signal in write/read operation.

9. A device according to claim 7, wherein said memory cell array comprises a semiconductor substrate of a first conductivity type and a plurality of nonvolatile memory cell transistors arranged in the form of a matrix in row and column directions, each nonvolatile memory cell transistor including a source region of a second conductivity type which is formed in said semiconductor substrate, a drain region of the second conductivity type which is formed at a predetermined distance from said source region, an offset side wall formed outside an edge of said source region which faces said drain region such that a bottom surface of said side wall covers a surface of said semiconductor substrate, a non-offset side wall formed to have an edge flush with an edge of said drain region which faces said source region, with a bottom surface of said side wall covering a surface of said drain region, a channel region formed between said source and drain regions, a first insulating film formed on said channel region, a nitride film formed on said first insulating film, a second insulating film formed on said nitride film, and a gate electrode commonly formed on said source region, said drain region, and said second insulating film, and said semiconductor memory further comprises write means for making said nitride film store an amount of charge corresponding to a gate voltage value applied to said gate electrode in a data write, and read means for reading out an output as data which corresponds to the amount of charge stored in said nitride film in a data read.

10. A device according to claim 9, wherein a plurality of source regions, each having said offset side wall, and a plurality of drain regions, each having said non-offset side wall, are alternately arrayed in the row direction, and first and second nonvolatile memory cell transistors commonly having said source region are formed between said source region and said drain regions on both sides of said source region.

11. A semiconductor memory comprising:

a semiconductor substrate of a first conductivity type;

a nonvolatile memory cell transistor including a source region of a second conductivity type which is formed in said semiconductor substrate, a drain region of the second conductivity type which is formed at a predetermined distance from said source region, a first side wall formed in an offset pattern outside an edge of said source region which faces said drain region such that a bottom surface of said side wall covers a surface of said semiconductor substrate, a second side wall formed to have an edge flush with an edge of said drain region which faces said source region, with a bottom surface of said second side wall covering a surface of said drain region, a channel region formed in a surface region of said semiconductor substrate which is located between said source and drain regions, a first insulating film formed on said channel region, a nitride film formed on said first insulating film, a second insulating film formed on said nitride film, and a gate electrode commonly formed on said source region, said drain region, and said second insulating film;

write means for making said nitride film store an amount of charge corresponding to a gate voltage value applied to said gate electrode in a data write; and read means for reading out an output as multi-value data which corresponds to the amount of charge stored in said nitride film in a data read.

12. A device according to claim 11, wherein said read means comprises:

means for generating a voltage signal corresponding to an amount of current flowing between said source and drain regions in a read;

comparing means for comparing the voltage signal with a plurality of reference voltages; and output means for obtaining a multi-value output by using a combination of outputs from said comparing means.

13. A device according to claim 11, wherein said write means comprises:

means for continuously changing the gate voltage in accordance with contents of multi-value data to be written; and means for applying a write voltage to said drain region at the same timing as that of a change in the gate voltage in accordance with the contents of the multi-value data to be written.

14. A device according to claim 11, wherein said write means comprises:

means for sequentially applying a pulse signal having a height corresponding to the contents of the multi-value data to be written to said gate electrode; and means for applying a write voltage to said drain region at the same timing as that of the pulse signal having the height corresponding to the contents of the multi-value data to be written.

15. A semiconductor memory device comprising:

a memory cell array having a plurality of memory cell transistors made up of a semiconductor substrate of a first conductivity type;

a plurality of source regions of a second conductivity type which are formed in the semiconductor substrate at predetermined intervals;

a plurality of drain regions of the second conductivity type each formed between two adjacent source regions;

a first insulation side wall formed in an offset pattern outside an edge of each of the source regions which faces the adjacent drain region such that a bottom surface of the first side wall covers a corresponding surface of the semiconductor substrate;

a second insulation side wall formed to have a front edge flush with an edge of the drain region which faces the adjacent source region, with a bottom surface of the second side wall covering a corresponding surface of the source region;

channel regions formed between the source regions and the drain regions;

a first insulating film formed on a surface of each of the channel regions;

a nitride film formed on the first insulating film;

a second insulating film formed on the nitride film;

a gate electrode used as a word line which is commonly formed on the source region, drain region, and second insulating film; and means for applying predetermined potentials to only a source, drain, and gate constituting one memory cell transistor addressed in at least data write/read operations, and holding all unselected memory cell transistors in a floating state.

* * * * *

UNITED STATES PATENT AND TRADEMARK OFFICE
CERTIFICATE OF CORRECTION

PATENT NO.     : 6,118,699                                              Page 1 of 1
DATED          : September 12, 2000
INVENTOR(S)    : Yuuichi Tatsumi et al.

It is certified that error appears in the above-identified patent and that said Letters Patent is hereby corrected as shown below:

Column 31,
Line 3, after "nitride film", insert -- in --.

Signed and Sealed this

Twenty-first Day of August, 2001

Attest:

*Nicholas P. Godici*

NICHOLAS P. GODICI
*Attesting Officer*        *Acting Director of the United States Patent and Trademark Office*